United States Patent
Kim et al.

(10) Patent No.: US 9,496,226 B2
(45) Date of Patent: *Nov. 15, 2016

(54) SEMICONDUCTOR DEVICE, SEMICONDUCTOR PACKAGE, AND ELECTRONIC DEVICE

(71) Applicant: SAMSUNG Electronics Co., Ltd., Suwon-si, Gyeonggi-do (KR)

(72) Inventors: Yong-Hoon Kim, Suwon-si (KR); In-Ho Choi, Seoul (KR); Keung-Beum Kim, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/254,969

(22) Filed: Apr. 17, 2014

(65) Prior Publication Data

US 2014/0225236 A1    Aug. 14, 2014

Related U.S. Application Data

(62) Division of application No. 13/437,285, filed on Apr. 2, 2012, now Pat. No. 8,736,032.

(30) Foreign Application Priority Data

May 30, 2011    (KR) .................. 10-2011-0051631

(51) Int. Cl.
*H01L 23/552* (2006.01)
*H01L 23/00* (2006.01)
(Continued)

(52) U.S. Cl.
CPC ......... *H01L 23/552* (2013.01); *H01L 21/4814* (2013.01); *H01L 21/78* (2013.01);
(Continued)

(58) Field of Classification Search
CPC .................. H01L 21/4814; H01L 23/552
(Continued)

(56) References Cited

U.S. PATENT DOCUMENTS 6,448,491 B1 * 9/2002 Sato ................ H01L 23/552
174/389
6,900,383 B2    5/2005 Babb et al.
(Continued)

FOREIGN PATENT DOCUMENTS

JP    59-132150    7/1984
JP    2002-334954    11/2002
(Continued)

OTHER PUBLICATIONS

Chinese Office Action dated Nov. 30, 2015 issued in CN Patent Application No. 201210171275.2.
(Continued)

*Primary Examiner* — Kenneth Parker
*Assistant Examiner* — Warren H Kilpatrick
(74) *Attorney, Agent, or Firm* — Muir Patent Law, PLLC

(57) ABSTRACT

A semiconductor device, a semiconductor package, and an electronic device are provided. The electronic device includes a first semiconductor package disposed on a circuit substrate. A second semiconductor package is provided on the circuit substrate and spaced apart from the first semiconductor package. An insulating electromagnetic shielding structure is provided on the top and the lateral surfaces of the first semiconductor package. A conductive electromagnetic shielding structure is provided on the circuit substrate to cover the first and second semiconductor packages and the insulating electromagnetic shielding structure.

30 Claims, 43 Drawing Sheets

(51) Int. Cl.
- *H01L 23/31* (2006.01)
- *H01L 23/498* (2006.01)
- *H01L 23/522* (2006.01)
- *H01L 25/065* (2006.01)
- *H01L 25/10* (2006.01)
- *H01L 21/78* (2006.01)
- *H01L 21/48* (2006.01)

(52) U.S. Cl.
CPC ....... *H01L 23/3121* (2013.01); *H01L 23/3135* (2013.01); *H01L 23/49816* (2013.01); *H01L 23/5225* (2013.01); *H01L 24/32* (2013.01); *H01L 24/92* (2013.01); *H01L 24/97* (2013.01); *H01L 25/0657* (2013.01); *H01L 25/105* (2013.01); *H01L 23/3192* (2013.01); *H01L 24/05* (2013.01); *H01L 24/13* (2013.01); *H01L 24/16* (2013.01); *H01L 24/48* (2013.01); *H01L 24/73* (2013.01); *H01L 2224/0401* (2013.01); *H01L 2224/04042* (2013.01); *H01L 2224/05548* (2013.01); *H01L 2224/05567* (2013.01); *H01L 2224/05571* (2013.01); *H01L 2224/05572* (2013.01); *H01L 2224/131* (2013.01); *H01L 2224/13021* (2013.01); *H01L 2224/13022* (2013.01); *H01L 2224/16145* (2013.01); *H01L 2224/16146* (2013.01); *H01L 2224/16225* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/9202* (2013.01); *H01L 2224/97* (2013.01); *H01L 2225/0651* (2013.01); *H01L 2225/06513* (2013.01); *H01L 2225/06517* (2013.01); *H01L 2225/06541* (2013.01); *H01L 2225/06562* (2013.01); *H01L 2225/06565* (2013.01); *H01L 2225/1023* (2013.01); *H01L 2225/1058* (2013.01); *H01L 2924/00014* (2013.01); *H01L 2924/0102* (2013.01); *H01L 2924/014* (2013.01); *H01L 2924/0104* (2013.01); *H01L 2924/01005* (2013.01); *H01L 2924/01006* (2013.01); *H01L 2924/01012* (2013.01); *H01L 2924/01013* (2013.01); *H01L 2924/01024* (2013.01); *H01L 2924/01029* (2013.01); *H01L 2924/01033* (2013.01); *H01L 2924/01038* (2013.01); *H01L 2924/01041* (2013.01); *H01L 2924/01042* (2013.01); *H01L 2924/01047* (2013.01); *H01L 2924/01056* (2013.01); *H01L 2924/01066* (2013.01); *H01L 2924/01074* (2013.01); *H01L 2924/01077* (2013.01); *H01L 2924/01078* (2013.01); *H01L 2924/01079* (2013.01); *H01L 2924/09701* (2013.01); *H01L 2924/15311* (2013.01); *H01L 2924/15331* (2013.01); *H01L 2924/181* (2013.01); *H01L 2924/3025* (2013.01)

(58) Field of Classification Search
USPC .......................... 257/659; 438/112; 174/394
See application file for complete search history.

(56) References Cited

U.S. PATENT DOCUMENTS

| | | | |
|---|---|---|---|
| 7,118,693 B2* | 10/2006 | Glatkowski | B82Y 10/00 174/546 |
| 2004/0071949 A1 | 4/2004 | Glatkowski et al. | |
| 2008/0277773 A1* | 11/2008 | Kim | H01L 23/552 257/693 |
| 2009/0152688 A1 | 6/2009 | Do et al. | |
| 2009/0294930 A1 | 12/2009 | Yoon et al. | |
| 2009/0302437 A1* | 12/2009 | Kim | H01L 21/561 257/659 |
| 2010/0033655 A1 | 2/2010 | Nakamoto | |
| 2010/0109132 A1* | 5/2010 | Ko | H01L 21/561 257/660 |
| 2010/0157566 A1 | 6/2010 | Bogursky et al. | |

FOREIGN PATENT DOCUMENTS

| | | |
|---|---|---|
| JP | 2002-335094 | 11/2002 |
| JP | 2003-174280 | 6/2003 |
| JP | 2003-273571 | 9/2003 |
| JP | 2006-216770 | 8/2006 |
| JP | 2009-290217 | 12/2009 |
| KR | 10-0877551 | 12/2008 |
| KR | 10-2009-0063084 | 6/2009 |
| KR | 10-2010-0070487 | 6/2010 |

OTHER PUBLICATIONS

Taiwan Office Action dated Dec. 4, 2015 issued in TW Patent Application No. 101119044.
First Office Action from Japanese Patent Office for application JP 2012-120828 dated May 10, 2016.

* cited by examiner

SEMICONDUCTOR DEVICE, SEMICONDUCTOR PACKAGE, AND ELECTRONIC DEVICE

CROSS-REFERENCE TO RELATED APPLICATIONS

This application is a Divisional application of prior application Ser. No. 13/437,285, filed on Apr. 2, 2012 in the United States Patent and Trademark Office, which claims priority under 35 U.S.C. §119 from Korean Patent Application No. 10-2011-0051631 filed on May 30, 2011 in the Korean Intellectual Property Office, the disclosure of which is hereby incorporated by reference in its entirety.

BACKGROUND

1. Field of the General Inventive Concept

Embodiments of the present general inventive concept relate to a semiconductor device, a semiconductor package, an electronic device, and an electronic system.

2. Description of the Related Art

In electronic systems and devices, the demand for electronic components free from electromagnetic waves has increased. For example, electromagnetic waves generated by portable devices, such as hand-held phones or mobile phones, may detrimentally affect the human body and/or generate electromagnetic interference (EMI) that causes malfunctions in internal semiconductor chips and/or degrades the receiving sensitivity of antennas.

Conventional techniques for reducing EMI include covering a plurality of electrical components with a single shielding, usually consisting of a single layer shielding layer. However, conventional shielding techniques do not sufficiently inhibit near-field EMI existing between by a plurality of devices.

SUMMARY

Exemplary embodiments of the present general inventive concept provide a semiconductor device and semiconductor package capable of cutting off electromagnetic waves.

Additional features and utilities of the present general inventive concept will be set forth in part in the following description and, in part, will be obvious from the description, or may be learned by practice of the general inventive concept.

Other embodiments of the present general inventive concept provide an electronic component capable of cutting off electromagnetic waves.

Still other exemplary embodiments of the present general inventive concept provide an electronic device and electronic system capable of cutting off electromagnetic waves.

Features of the present general inventive concept should not be limited by the above description, and other unmentioned features will be clearly understood by one of ordinary skill in the art from exemplary embodiments described herein.

In accordance with an feature of the present general inventive concept, an electronic device includes a circuit substrate and a first semiconductor package disposed on the circuit substrate. A second semiconductor package is provided on the circuit substrate and spaced apart from the first semiconductor package. An insulating electromagnetic shielding structure is provided on top and lateral surfaces of the first semiconductor package. A conductive electromagnetic shielding structure is provided on the circuit substrate to cover the first and second semiconductor packages and the insulating electromagnetic shielding structure.

The insulating electromagnetic shielding structure may include a first polarizer having a first transmission axis, and a second polarizer having a second transmission axis orthogonal to the first transmission axis of the first polarizer.

In accordance with another feature of the present general inventive concept, a semiconductor package includes a package substrate and a first semiconductor chip disposed on the package substrate. A first electromagnetic shielding structure is disposed on the first semiconductor chip. The first electromagnetic shielding structure includes a first polarizer having a first transmission axis, and a second polarizer having a second transmission axis different from the first transmission axis.

The first electromagnetic shielding structure may be provided on a top surface of the first semiconductor chip.

The first electromagnetic shielding structure may be provided on top and lateral surfaces of the first semiconductor chip.

The first electromagnetic shielding structure may have an insulation characteristic.

The semiconductor package may further include an under-fill member interposed between the package substrate and the first semiconductor chip. The under-fill member may cover sidewalls of the first semiconductor chip, and the first electromagnetic shielding structure may include a portion covering a top surface of the first semiconductor chip and a portion covering lateral surfaces of the under-fill member.

The first electromagnetic shielding structure may further include a portion covering a top surface of the package substrate.

The semiconductor package may further include a molding layer disposed on the first electromagnetic shielding structure.

The semiconductor package may further include a molding layer covering the package substrate and the first semiconductor chip. The first electromagnetic shielding structure may include a portion covering a top surface of the molding layer disposed on the first semiconductor chip and a portion covering lateral surfaces of the molding layer.

The first electromagnetic shielding structure may further include a portion covering lateral surfaces of the package substrate.

The first electromagnetic shielding structure may extend from the portion covering the top surface of the first semiconductor chip to cover the package substrate disposed adjacent to the first semiconductor chip. Also, the semiconductor package may further include a vacant space interposed between lateral surfaces of the first semiconductor chip and the first electromagnetic shielding structure.

The semiconductor package may further include a second semiconductor chip disposed on the package substrate.

The second semiconductor chip may be provided between the package substrate and the first semiconductor chip. In another case, the second semiconductor chip may be horizontally spaced apart from the first semiconductor chip. The first electromagnetic shielding structure may extend to cover the first and second semiconductor chips. The semiconductor package may further include a second electromagnetic shielding structure disposed on the second semiconductor chip. The second electromagnetic shielding structure may include a third polarizer having a third transmission axis, and a fourth polarizer having a fourth transmission axis orthogonal to the third transmission axis of the third polarizer. The first and second transmission axes may be orthogonal to each other on a plane surface.

The semiconductor package may further include a second electromagnetic shielding structure provided on any one surface of the package substrate.

In accordance with another feature of the present general inventive concept, a semiconductor device includes a semiconductor substrate having a first surface and a second surface disposed opposite each other. An interconnection structure is disposed on the first surface of the semiconductor substrate. An insulating layer is disposed on the interconnection structure. An opening is formed through the insulating layer to expose a portion of the interconnection structure. A conductive pattern is disposed on the portion of the interconnection structure exposed by the opening. An electromagnetic shielding structure is provided on the insulating layer. The electromagnetic shielding structure includes first and second polarizers stacked sequentially.

The first polarizer may have a first polarized surface, and the second polarizer may have a second polarized surface different from the first polarized surface.

In accordance with another feature of the present general inventive concept, an electronic device includes a first semiconductor chip, a second semiconductor chip, and an insulating electromagnetic shielding structure interposed between the first and second semiconductor chips. The insulating electromagnetic shielding structure includes a first polarizer having a first transmission axis, and a second polarizer having a second transmission axis different from the first transmission axis.

The electronic device may further include a package substrate, and the first and second semiconductor chips may be provided on the package substrate.

The first and second semiconductor chips may be vertically stacked on the package substrate.

The first and second semiconductor chips may be spaced apart from each other on the package substrate in a horizontal direction.

In accordance with another feature of the present general inventive concept, an electronic device includes a housing having an inner space. A first insulating electromagnetic shielding structure is provided on an inner surface of the housing. A processing device is provided in the inner space of the housing. A second insulating electromagnetic shielding structure is provided within the processing device. Any one of the first and second insulating electromagnetic shielding structures includes first and second polarizers stacked sequentially. The first polarizer has a first transmission axis, and the second polarizer has a second transmission axis orthogonal to the first transmission axis of the first polarizer on a plane surface. The electronic device may further include an input/output (I/O) device combined with the housing, and the I/O device includes a display surface exposed outside the housing.

BRIEF DESCRIPTION OF THE DRAWINGS

These and/or other features and utilities of the present general inventive concept will become apparent and more readily appreciated from the following description of the exemplary embodiments, taken in conjunction with the accompanying drawings of which.

DETAILED DESCRIPTION OF THE PREFERRED EMBODIMENTS

Figure 1:
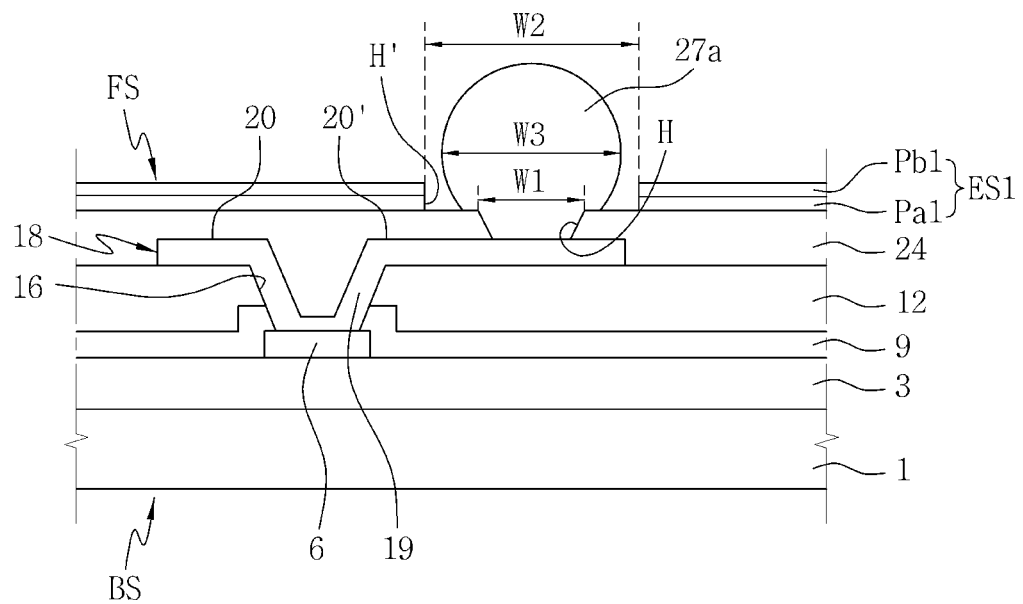
FIGS. 1 through 11 are cross-sectional views illustrating a semiconductor device according to exemplary embodiments of the present general inventive concept.

Reference will now be made in detail to the exemplary embodiments of the present general inventive concept, examples of which are illustrated in the accompanying drawings, wherein like reference numerals refer to the like elements throughout. The exemplary embodiments are described below in order to explain the present general inventive concept while referring to the figures.

Exemplary embodiments of the present general inventive concept are described herein with reference to cross-section illustrations that are schematic illustrations of exemplary embodiments of the present general inventive concept. As such, variations from the shapes of the illustrations as a result, for example, of manufacturing techniques and/or tolerances, are to be expected. Thus, exemplary embodiments of the present general inventive concept should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concept.

FIG. 1 is a diagram of a semiconductor device according to at least one exemplary embodiment of the present general inventive concept.

Referring to FIG. 1, a semiconductor substrate 1 may be provided. The semiconductor substrate 1 may be a silicon substrate including a semiconductor integrated circuit (IC). The semiconductor substrate 1 may have a first surface FS and a second surface BS disposed opposite each other. An interlayer insulating layer 3 may be provided on the first surface FS of the semiconductor substrate 1 on which the IC is formed. A conductive pad 6 may be provided on the interlayer insulating layer 3, and an insulating layer 9 may be provided on the semiconductor substrate 1 having the pad 6. The insulating layer may be a passivation layer. The insulating layer 9 may have an opening exposing the pad 6. A lower insulating layer 12 may be provided on the insulating layer 9.

A metal interconnection 18 may be redistributed on the lower insulating layer 12. The redistributed metal interconnection 18 may be electrically connected to the pad 6 through a via hole 16 formed through the lower insulating layer 12. In at least one exemplary embodiment, the metal interconnection 18 includes a contact portion 19, a first arm portion 20, and a second arm portion 20'. The contact portion 19 extends through the via 16 hole to contact the pad 6. The first arm portion 20 extends from a first end of the contact portion 19, and may contact the insulating layer 9 and/or the lower insulating layer 12. The second arm portion 20' extends from a second end of the contact portion 19 opposite the first end, and may contact the insulating layer 9 and/or the lower insulating layer 12. The second arm portion 20' may have a conductive pattern formed thereon, as described in greater detail below.

The pad 6 may be any one of an input/output (I/O) pad, a ground pad, and a power pad. The metal interconnection 18 may be any one of a signal line, a power line, and a ground line.

An upper insulating layer 24 may be provided on the semiconductor substrate 1 having the metal interconnection 18. The upper insulating layer 24 may have an opening H exposing a portion of the metal interconnection 18. A region of the metal interconnection 18 exposed by the opening may be described as, for example, a redistribution pad region. The redistribution pad region may include the second arm portion 20', which extends along the upper insulating layer 24 and beneath the opening, thereby being exposed by via the opening.

An electromagnetic shielding structure ES1 may be provided on the upper insulating layer 24. The electromagnetic shielding structure ES1 may include a first polarizer Pa1 and a second polarizer Pb1 stacked sequentially. The first polarizer Pa1 may selectively transmit a first polarized wave of electromagnetic waves, while the second polarizer Pb1 may selectively transmit a second polarized wave of the electromagnetic waves. Accordingly, the first polarizer Pa1 may not transmit the second polarized wave, while the second polarizer Pb1 may not transmit the first polarized wave. That is, electromagnetic waves may be transmitted through any one of the first and second polarizers Pa1 and Pb1, while the electromagnetic waves may be cut off by the remaining one thereof.

In some exemplary embodiments, the electromagnetic shielding structure ES1 may be an insulating electromagnetic shielding structure. For example, the electromagnetic shielding structure ES1 may include the first polarizer Pa1 formed of an insulating material, and a second polarizer Pb1 formed of an insulating material. The insulating material may be formed of an insulative resin comprising insulative particles including, but is not limited to, silica, mica, quartz, glass, calcium silicate, aluminum silicate, zirconium silicate, alumina, titanium dioxide, barium titanate, calcium carbonate, calcium sulfate, ferric oxide, lithium aluminum sulfate, magnesium silicate, and zirconium oxide. The insulating material may also include an insulative film and/or resin formed of polyvinylalcohol (PVA).

For example, the electromagnetic shielding structure ES1 may include the first and second polarizers Pa1 and Pb1 formed using a polyvinylalcohol (PVA)-based film, such as PVA, polyvinyl formal (PVF), or polyvinyl acetal (PVA). For instance, each of the first and second polarizers Pa1 and Pb1 may be an iodic polarizer in which iodic molecules are oriented in one direction between polyvinyl alcohol (PVA) polymers. More specifically, the first polarizer Pa1 may be a first material layer in which iodic molecules are oriented between PVA polymers in a first direction, while the second polarizer Pb1 may be a second material layer in which iodic molecules are oriented between PVA polymers in a second direction orthogonal to the first direction. Accordingly, the first and second polarizers Pa1 and Pb1 may have transmission axes (or polarized axes) orthogonal to each other.

Polarizers according to exemplary embodiments of the present general inventive concept are not limited to iodic polarizers. For example, although the above-described iodic polarizers may be used for a semiconductor chip, a semiconductor device, a semiconductor package, an electronic device, and an electronic system according to the present general inventive concept, polarizers formed of materials other than iodic materials may also be used for a semiconductor chip, a semiconductor device, a semiconductor package, an electronic device, and an electronic system according to the present general inventive concept.

In other exemplary embodiments, the electromagnetic shielding structure ES1 may be a conductive electromagnetic shielding structure. That is, the electromagnetic shielding structure ES1 may include first and second polarizers Pa1 and Pb2 including a conductive material. The conductive material may include, but is not limited to, iron, iron alloys, copper, aluminum, molybdenum, gold, silver tungsten, carbon nanotubes, nickel, a conductive polymer. The conductive material may further include electromagnetic oxides of iron, chromium, etc., for example.

The first polarizer Pa1 may include a first base and one or more first conductive patterns provided on the first base, while the second polarizer Pb1 may include a second base and one or more second conductive patterns provided on the second base. Each of the first and second conductive patterns may include a conductive material, such as aluminum (Al), molybdenum (Mo), gold (Au), copper (Cu), silver (Ag), tungsten (W), carbon nanotubes, nickel (Ni), or a conductive polymer. Here, the first conductive patterns may be lines arranged in a first lengthwise direction, while the second conductive patterns may be lines arranged in a second lengthwise direction orthogonal to the first lengthwise direction. Accordingly, since the first and second conductive patterns are orthogonal to each other, the first and second polarizers Pa1 and Pb1 may have different transmission axes. The electromagnetic shielding structure ES1 may have an opening H'. The opening H' of the electromagnetic shielding structure ES1 may be formed about the opening H of the upper insulating layer 24, thereby exposing the opening of the upper insulating layer 24.

In some exemplary embodiments, a width W2 of the opening H' of the electromagnetic shielding structure ES1 may be greater than a width W1 of the opening H of the upper insulating layer 24.

A conductive structure 27 may be provided on the metal interconnection 18 exposed by the upper insulating layer 24. For example, the conductive structure 27 may include a solder ball. In at least one exemplary embodiment illustrated in FIG. 1, the conductive structure 27a is formed on the upper insulating layer 24 and extends into the opening H to contact the second arm portion structure 20' of the metal interconnection 18.

In some exemplary embodiments, the electromagnetic shielding structure ES1 may be spaced apart from the conductive structure 27a. A width W3 of the conductive structure 27a may be less than the width W2 of the opening H' of the electromagnetic shielding structure ES1. Accordingly, since the electromagnetic shielding structure ES1 and the conductive structure 27a are spaced apart from each other, the electromagnetic shielding structure ES1 may be an insulating electromagnetic shielding structure or a conductive electromagnetic shielding structure.

A semiconductor device according to other exemplary embodiments of the present general inventive concept will now be described with reference to FIG. 2.

Figure 2:
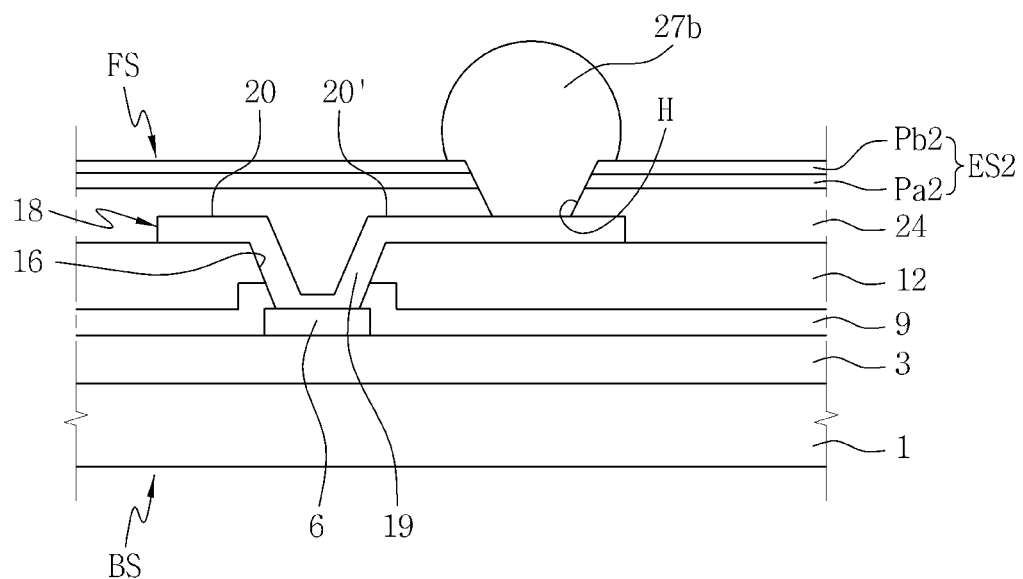

Referring to FIG. 2, as illustrated in FIG. 1, the interlayer insulating layer 3, the pad 6, the insulating layer 9, the lower insulating layer 12, the redistributed metal interconnection 18, and the upper insulating layer 24 having the opening may be provided on the semiconductor substrate 1 having the IC.

An electromagnetic shielding structure ES2 may be provided on the upper insulating layer 24. The electromagnetic shielding structure ES2 may have an opening self-aligned with the opening of the upper insulating layer 24.

A conductive structure 27b may be provided on the upper insulating layer 24 and the electromagnetic shielding structure ES2. The conductive structure 27b may penetrate the self-aligned openings of the upper insulating layer 24 and the electromagnetic shielding structure ES2, and cover a portion of the electromagnetic shielding structure ES2. As in FIG. 1, the electromagnetic shielding structure ES2 may include a first polarizer Pa2 and a second polarizer Pb2.

Since a portion of the electromagnetic shielding structure ES2 is covered with the conductive structure 27b, the electromagnetic shielding structure ES2 may be an insulating electromagnetic shielding structure.

A semiconductor device according to other exemplary embodiments of the present general inventive concept will now be described with reference to FIG. 3.

Figure 3:
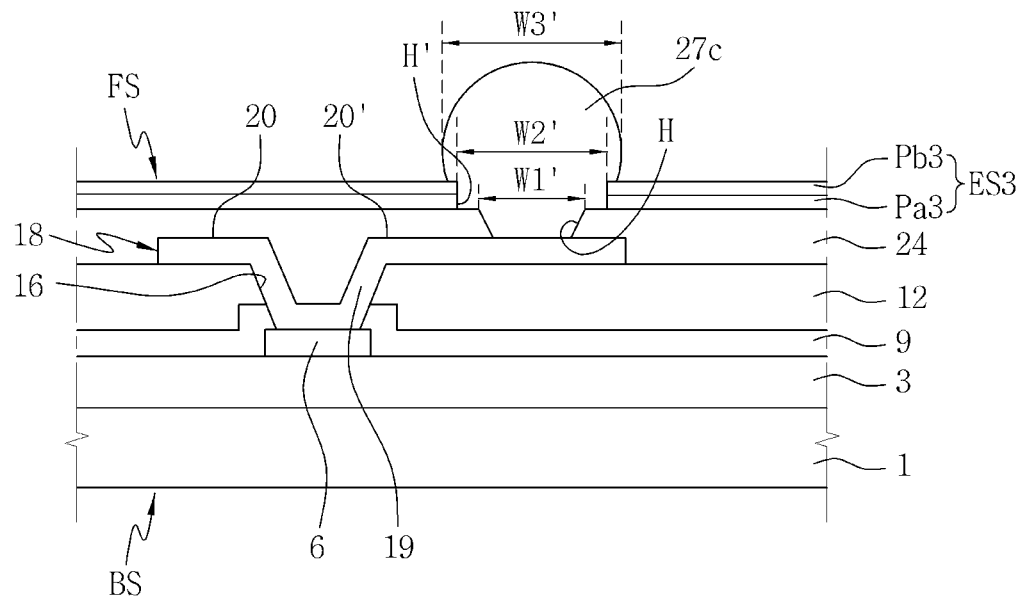

Referring to FIG. 3, as in FIG. 1, the interlayer insulating layer 3, the pad 6, the insulating layer 9, the lower insulating layer 12, the redistributed metal interconnection 18, and the upper insulating layer 24 may be provided on the semiconductor substrate 1 having the IC. As in FIG. 1, the upper insulating layer 24 may include an opening H exposing a portion of the metal interconnection 18. For example, the second arm portion 20' of the metal interconnection 18 may be exposed via the opening H formed in the upper insulating layer 24.

An electromagnetic shielding structure ES3 may be provided on the upper insulating layer 24. As in FIG. 1, the electromagnetic shielding structure ES3 may include a first polarizer Pa3 and a second polarizer Pb3.

As in FIG. 1, the electromagnetic shielding structure ES3 may include an opening H' having a width W2' greater than a width W1' of the opening of the upper insulating layer 24. A conductive structure 27c may be provided on the upper insulating layer 24. The conductive structure 27c may have a width W3' greater than the width W2' of the opening H' of the electromagnetic shielding structure ES3, and cover a portion of the electromagnetic shielding structure ES3. Accordingly, the electromagnetic shielding structure ES3 may be an insulating electromagnetic shielding structure.

Figure 4:
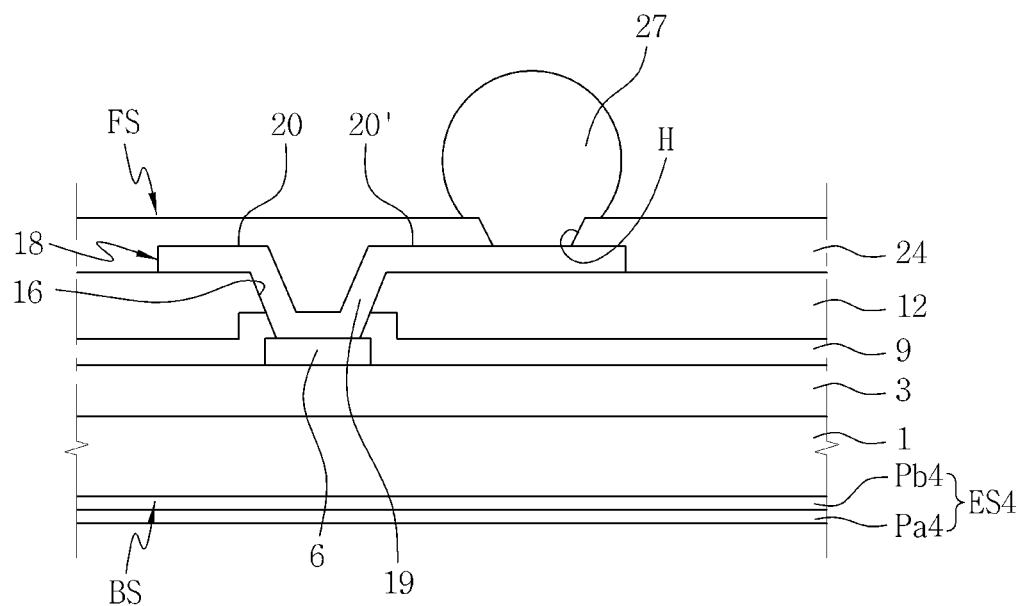

Although the exemplary embodiments illustrated in FIGS. 1 through 3 provide the electromagnetic shielding structure ES1 disposed on a front surface (i.e., the first surface FS) of the semiconductor substrate 1, the present general inventive concept is not limited thereto. For example, as illustrated in FIG. 4, the present general inventive concept may provide an electromagnetic shielding structure ES4 disposed on a back surface (i.e., the second surface BS) of the semiconductor substrate 1. The electromagnetic shielding structure ES4 of FIG. 4 may include a first polarizer Pa4 and a second polarizer Pb4 as in FIG. 1.

A semiconductor device according to other exemplary embodiments of the present general inventive concept will now be described with reference to FIG. 5.

Figure 5:
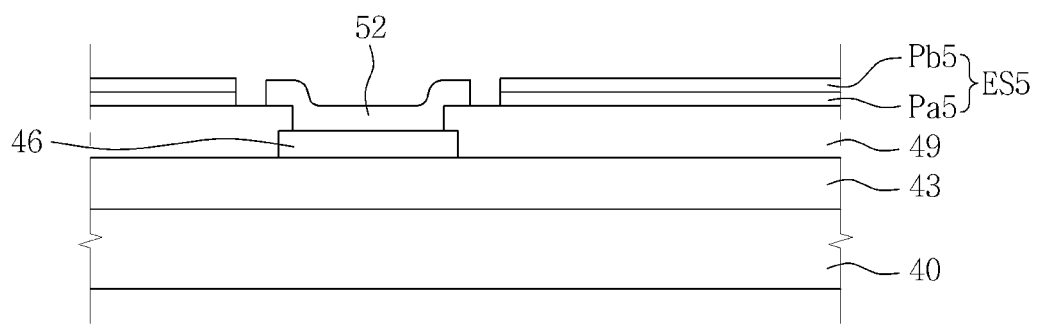

Referring to FIG. 5, as in FIG. 1, an interlayer insulating layer 43 and a pad 46 may be provided on a semiconductor substrate 40. An insulating layer 49 may be provided on the semiconductor substrate 40 having the pad 46. The insulating layer 49 may have an opening partially or wholly exposing a top surface of the pad 46. The insulating layer 49 may be a passivation layer.

An electromagnetic shielding structure ES5 may be provided on the insulating layer 49. As in FIG. 1, the electromagnetic shielding structure ES5 may include a first polarizer Pa5 and a second polarizer Pb5.

A conductive structure 52 may be provided on the pad 46 exposed by the opening of the insulating layer 49. The conductive structure 52 may be an I/O pad configured to electrically connect the semiconductor device with another device or chip. As in FIG. 1, the conductive structure 52 may be spaced apart from the electromagnetic shielding structure ES5.

A semiconductor device according to other exemplary embodiments of the present general inventive concept will now be described with reference to FIG. 6.

Figure 6:
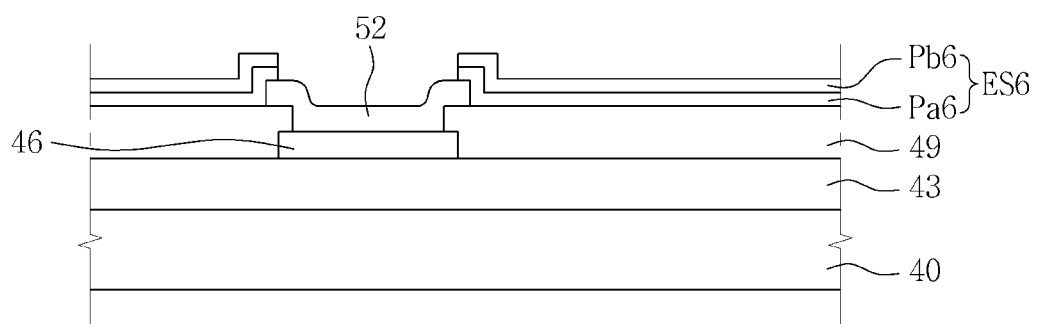

Referring to FIG. 6, as in FIG. 5, an interlayer insulating layer 43, a pad 46, an insulating layer 49 having an opening, and a conductive structure 52 may be provided on a semiconductor substrate 40. Unlike in FIG. 5, an electromagnetic shielding structure ES6 may be provided on the insulating layer 49 to cover a portion of a top surface of the conductive structure 52. As in FIG. 2, the electromagnetic shielding structure ES6 may include a first polarizer Pa6 formed of an insulating material, and a second polarizer Pb6 formed of an insulating material.

Figure 7:
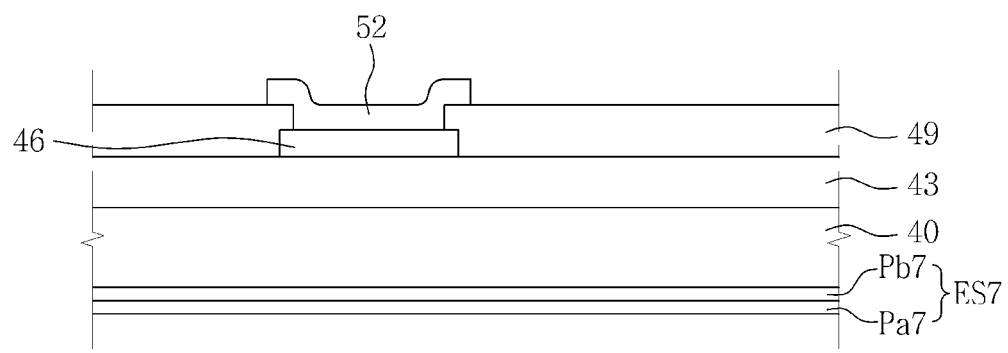

Although the exemplary embodiments illustrated in FIGS. 5 and 6 provide the electromagnetic shielding structure ES1 disposed on a front surface (i.e., a first surface FS) of the semiconductor substrate 40, the present general inventive concept is not limited thereto. For example, as illustrated in FIG. 7, the present general inventive concept may provide an electromagnetic shielding structure ES7 disposed on a back surface (i.e., a second surface BS) of the semiconductor substrate 40. The electromagnetic shielding structure ES7 of FIG. 7 may include a first polarizer Pa7 and a second polarizer Pb7, as in FIG. 1.

The present general inventive concept may include not only exemplary embodiments in which an electromagnetic shielding structure is provided on only one of the front and back surfaces FS and BS of the semiconductor substrate 40, but also exemplary embodiments in which an electromagnetic shielding structure is provided on each of the front and back surfaces FS and BS of the semiconductor substrate 40.

A semiconductor device according to other exemplary embodiments of the present general inventive concept will now be described with reference to FIG. 8.

Figure 8:
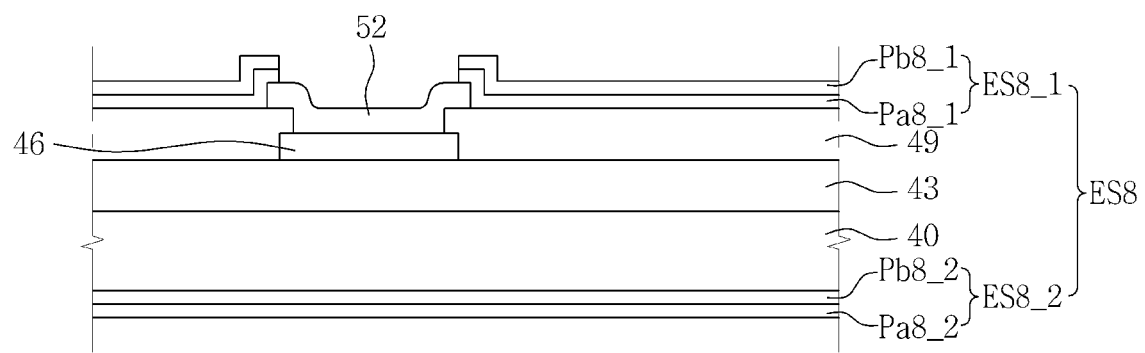

Referring to FIG. 8, a first electromagnetic shielding structure ES8_1 may be provided on a front surface FS of a semiconductor substrate 40, while a second electromagnetic shielding structure ES8_2 may be provided on a back surface BS thereof. That is, an electromagnetic shielding structure ES8 may include the first electromagnetic shielding structure ES8_1 and the second electromagnetic shielding structure ES8_2. Accordingly, an IC of the semiconductor substrate 40 may be protected from external electromagnetic interference (EMI) by the electromagnetic shielding structure ES8.

The first electromagnetic shielding structure ES8_1 may include a first polarizer Pa8_1 and a second polarizer Pb8_1, while the second electromagnetic shielding structure ES8_2 may include a third polarizer Pa8_2 and a fourth polarizer Pb8_2.

Figure 9:
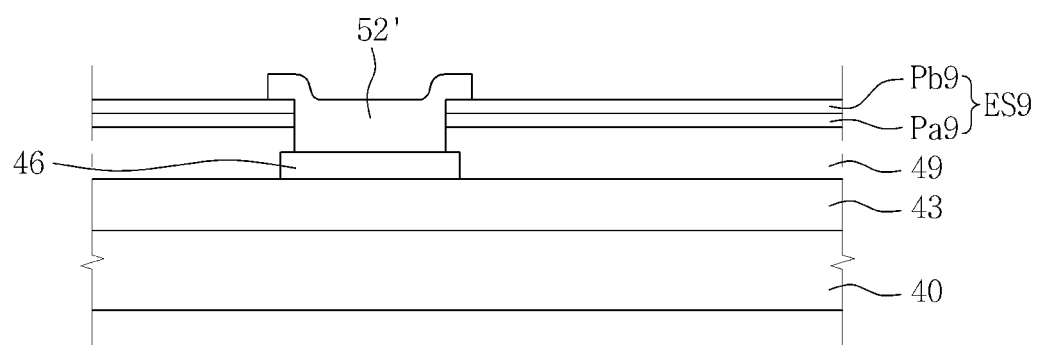

Although FIG. 8 illustrates that the first electromagnetic shielding structure ES8_1 covers a portion of the conductive structure 52 as in FIG. 6, exemplary embodiments of the present general inventive concept are not limited thereto. For example, the first electromagnetic shielding structure ES8_1 may be spaced apart from the conductive structure 52, as in FIG. 5. Meanwhile, as in FIG. 9, an electromagnetic shielding structure ES9 having a top surface partially covered with a conductive structure 52' may be provided. Here, the electromagnetic shielding structure ES9 may include first and second polarizers Pa9 and Pb9.

A semiconductor device according to other exemplary embodiments of the present general inventive concept will now be described with reference to FIG. 10.

Figure 10:
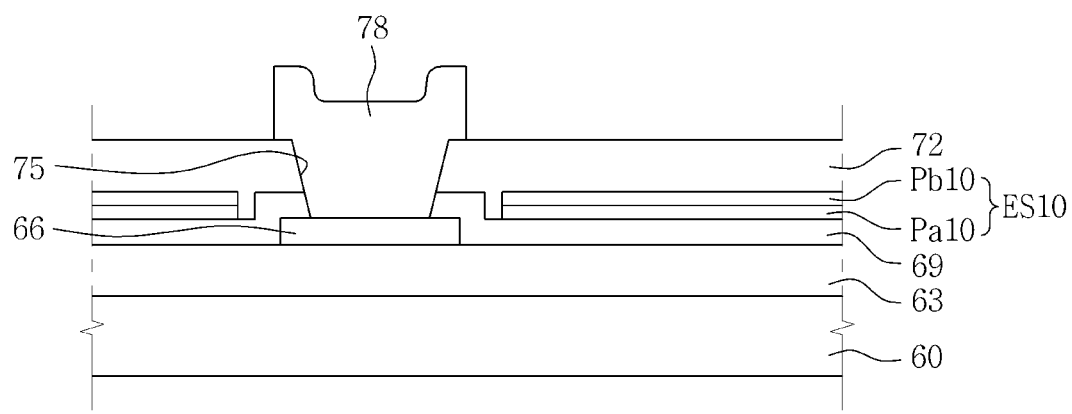

Referring to FIG. 10, an interlayer insulating layer 63 may be provided on a semiconductor substrate 60. A pad 66 may be provided on the interlayer insulating layer 63, and a first insulating layer 69 may be provided on the semiconductor substrate 60 to cover the pad 66. An electromagnetic shielding structure ES10 having an opening may be provided on the first insulating layer 69. The electromagnetic shielding structure ES10 may include a first polarizer Pa10 and a second polarizer Pb10.

A second insulating layer 72 may be provided on the electromagnetic shielding structure ES10. An opening 75 may sequentially penetrate the second insulating layer 72 and the first insulating layer 69, and expose the pad 66. A conductive structure 78 may be provided on the pad 66 exposed by the opening 75.

The opening 75 formed through the first and second insulating layers 69 and 72 may pass through the opening of the electromagnetic shielding structure ES10. That is, an inner wall of the opening 75 formed through the first and second insulating layers 69 and 72 may be spaced apart from the electromagnetic shielding structure ES10.

The electromagnetic shielding structure ES10 may be surrounded and insulated by the first and second insulating layers 69 and 72, and spaced apart from the conductive structure 78. Thus, the electromagnetic shielding structure ES10 may be an insulating or conductive electromagnetic shielding structure.

A semiconductor device according to other exemplary embodiments of the present general inventive concept will now be described with reference to FIG. 11.

Figure 11:
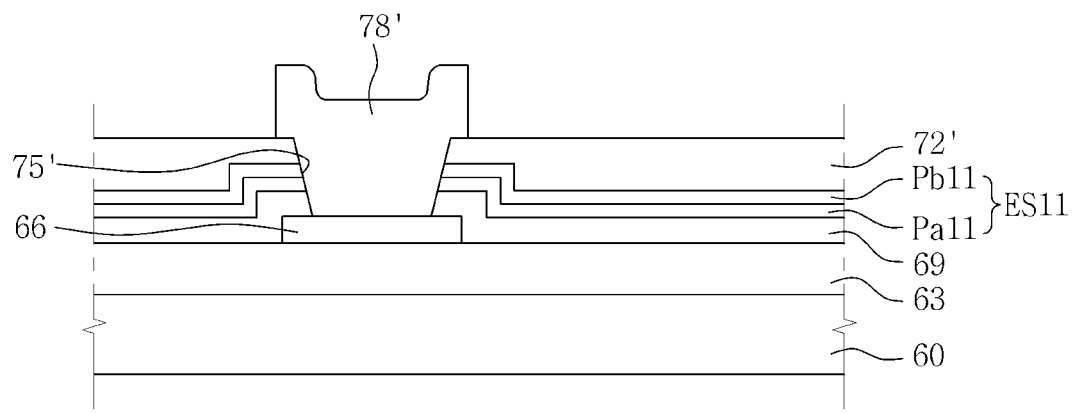

Referring to FIG. 11, as in FIG. 10, an interlayer insulating layer 63 and a pad 66 may be provided on a semiconductor substrate 60. A first insulating layer 69 may be provided on the interlayer insulating layer 63 to cover the pad 66. An electromagnetic shielding structure ES11 may be provided on the first insulating layer 69. The electromagnetic shielding structure ES11 may include a first polarizer Pa11 and a second polarizer Pb11.

A second insulating layer 72' may be provided on the electromagnetic shielding structure ES11. An opening 75' may sequentially penetrate the second insulating layer 72', the electromagnetic shielding structure ES11 and the first insulating layer 69, and expose the pad 66. A conductive structure 78' may be formed on the pad 66 exposed by the opening 75'.

A portion of the electromagnetic shielding structure ES11 may be exposed by the opening 75' and brought into contact with the conductive structure 78'. In at least one exemplary embodiment illustrated in FIG. 11, each of the first and second polarizers pa11 pb11 contact the conductive structure 78'. The electromagnetic shielding structure ES11 may be an insulating electromagnetic shielding structure.

As in the exemplary embodiments of the present general inventive concept described with reference to FIGS. 1 through 11, an electromagnetic shielding structure may be provided in various shapes on a front surface and/or back surface of a semiconductor substrate. The electromagnetic shielding structure may prevent external emission of electromagnetic waves generated by an IC formed on a semiconductor substrate, and protect the IC and an interconnection structure formed on the semiconductor substrate from electromagnetic waves generated by an external semiconductor chip or electronic device.

Electromagnetic shielding structures according to exemplary embodiments of the present general inventive concept will now be described with reference to FIGS. 12A through 12H.

According to the exemplary embodiments of the present general inventive concept, unpolarized electromagnetic waves may reach a first polarizer of an electromagnetic shielding structure before a second polarizer thereof, or reach the second polarizer of the electromagnetic shielding structure before the first polarizer thereof.

Exemplary embodiments in which an electromagnetic shielding structure cuts off electromagnetic waves when unpolarized electromagnetic waves reach a first polarizer of the electromagnetic shielding structure before a second polarizer thereof will now be described with reference to FIG. 12A.

Figure 12A:
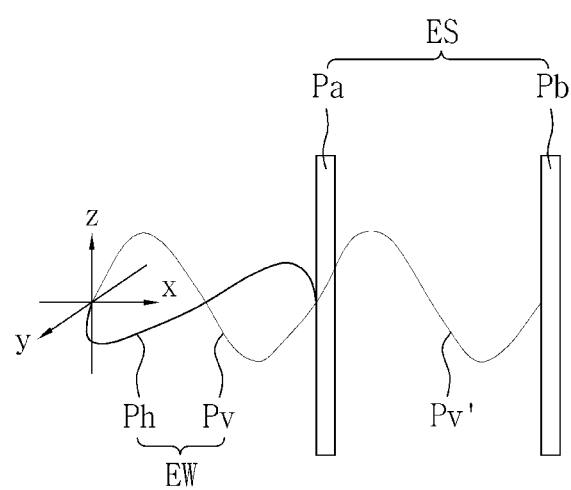
FIGS. 12A through 12H are diagrams illustrating electromagnetic shielding structures according to exemplary embodiments of the present general inventive concept.

Referring to FIG. 12A, an electromagnetic shielding structure ES including a first polarizer Pa and a second polarizer Pb may be provided. Electromagnetic waves EW may travel from the outside of the electromagnetic shielding structure ES toward the electromagnetic shielding structure ES and reach the first polarizer Pa earlier than the second polarizer Pb.

The electromagnetic waves EW may include a first polarized wave Pv, and a second polarized wave Pb different from the first polarized wave Pv. For example, the first polarized wave Pv may be a vertical wave, while the second polarized wave Ph may be a horizontal wave. Here, it is assumed for clarity that the electromagnetic waves EW include the first polarized wave Pv and the second polarized wave Ph. However, it should be understood that the electromagnetic waves EW are actually in an unpolarized state.

The first polarizer Pa may selectively transmit the first polarized wave Pv of the electromagnetic waves EW, while the second polarizer Pb may selectively transmit the second polarized wave Ph thereof. Accordingly, unpolarized waves EW may be polarized through the first polarizer Pa. That is, an electromagnetic wave passing through the first polarizer Pa may be a first polarized wave Pv'.

The first polarized wave Pv' passing through the first polarizer Pa cannot substantially pass through the second polarizer Pb. Specifically, since the second polarizer Pb selectively transmits the second polarized wave Ph different from the first polarized wave Pv, the first polarized wave Pv' passing through the first polarizer Pa cannot pass through the second polarizer Pb.

Even if part of the first polarized wave Pv' passes through the second polarizer Pb, the first polarized wave Pv' passing through the second polarizer Pb may have reduced intensity and cannot meaningfully affect the human body or an electronic device. Accordingly, it is assumed in the exemplary embodiments that the part of the first polarized wave Pv' passing through the second polarizer Pb is disregarded.

The electromagnetic waves EW may be polarized and pass through only one of the first and second polarizers Pa and Pb, but they cannot pass through the electromagnetic shielding structure ES including two different polarizers Pa and Pb. Accordingly, the electromagnetic shielding structure ES including the first and second polarizers Pa and Pb may cut off the electromagnetic waves EW.

Exemplary embodiments in which an electromagnetic shielding structure ES cuts off electromagnetic waves EW when unpolarized electromagnetic waves reach the second polarizer Pb of the electromagnetic shielding structure ES before the first polarizer Pa thereof will now be described with reference to FIG. 12B.

Figure 12B:
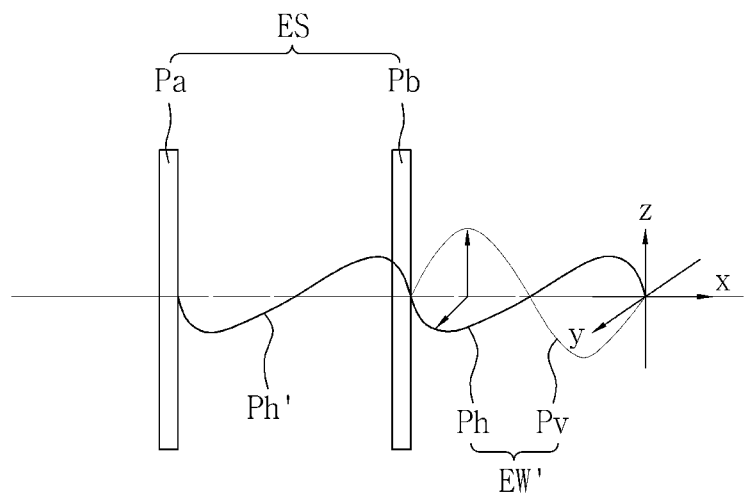

Referring to FIG. 12B, an electromagnetic shielding structure ES including a first polarizer Pa and a second polarizer Pb may be provided, as in FIG. 12A.

Unlike in FIG. 12A, electromagnetic waves EW' may travel from the outside of the electromagnetic shielding structure ES toward the second polarizer Pb of the electromagnetic shielding structure ES and reach the second polarizer Pb before the first polarizer Pb.

As described with reference to FIG. 12A, the electromagnetic waves EW' may include a first polarized wave Pv and a second polarized wave Ph different from the first polarized wave Pv. Thus, an unpolarized electromagnetic wave EW' may be polarized through the second polarizer Pb. That is, an electromagnetic wave passing through the second polarizer Pb may be a second polarized wave Ph'. The second polarized wave Ph' passing through the second polarizer Pb cannot substantially pass through the first polarizer Pa. Specifically, since the first polarizer Pa selectively transmits the first polarized wave Pv different from the second polarized wave Ph, the second polarized wave Ph' passing through the second polarizer Pb cannot pass through the first polarizer Pa.

Therefore, the electromagnetic waves EW may be cut off by the electromagnetic shielding structure ES.

An electromagnetic shielding structure according to exemplary embodiments of the present general inventive concept will now be described with reference to FIG. 12C.

Figure 12C:
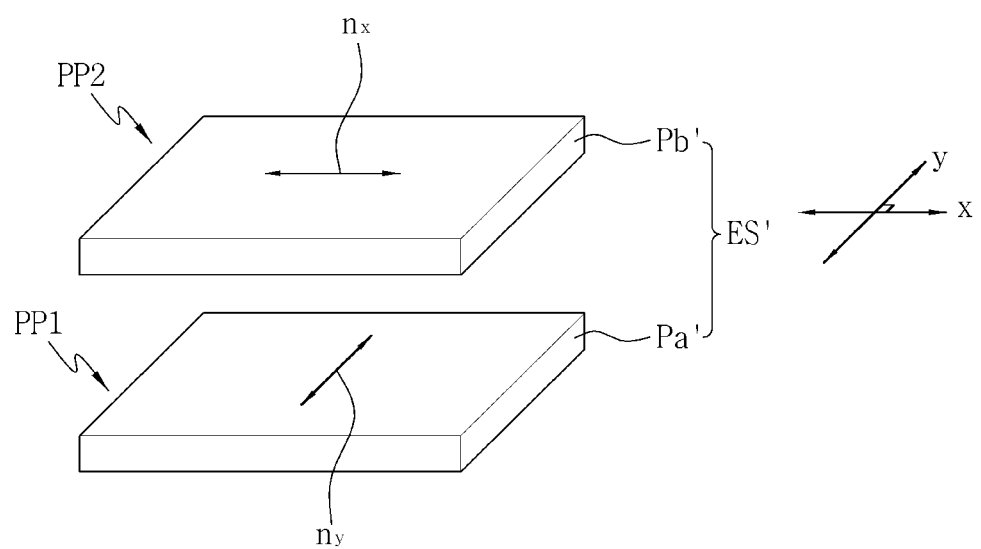

Referring to FIG. 12C, an electromagnetic shielding structure ES' may include a first polarizer Pa' and a second polarizer Pb'. The first polarizer Pa' may have a first polarized plane PP1, while the second polarizer Pb' may have a second polarized plane PP2 different from the first polarized plane PP1.

The first polarizer Pa' may have a first transmission axis ny, while the second polarizer Pb' may have a second transmission axis nx having different directionality from the first transmission axis ny. Also, the second transmission axis nx may be in a direction crossing to the first transmission axis ny. For example, the second transmission axis nx may be orthogonal to the first transmission axis ny. Here, the term "transmission axis" may be interpreted as a polarized shielding axis. The direction of the axis may influence the effectiveness of the polarizer's Pa/Pb ability to block the electromagnetic waves. For instance, the first axis of the first polarizer may inhibit a first wave component of the electromagnetic wave, while the second axis being in a different direction from the first axis may inhibit a second wave component of the electromagnetic wave different from the first wave component.

As described above with reference to FIG. 1, when each of the first and second polarizers Pa' and Pb' is an iodic polarizer in which iodic molecules are oriented between PVA polymers in one direction, the direction of the transmission axis may depend on a direction in which iodic molecules are arranged. Accordingly, the first and second polarizers Pa1 and Pb1 may be insulating polarizers having transmission axes orthogonal to each other.

An electromagnetic shielding structure according to other exemplary embodiments of the present general inventive concept will now be described with reference to FIG. 12D.

Figure 12D:
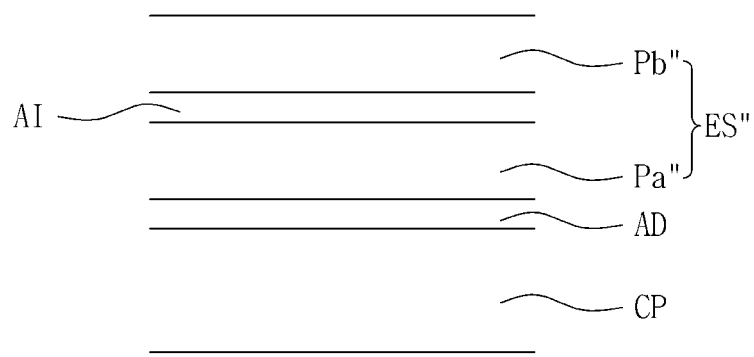

Referring to FIG. 12D, an electromagnetic shielding structure ES" may include a first polarizer Pa" and a second polarizer Pb".

In some exemplary embodiments, each of the first and second polarizers Pa" and Pb" may be a film type. In this case, the first and second polarizers Pa" and Pb" may be adhered to each other by an intermediate layer AI, and constitute the electromagnetic shielding structure ES". The intermediate layer AI may adhere the first and second polarizers Pa" and Pb" to each other. For example, the intermediate layer AI may include an adhesive layer configured to adhere the first and second polarizers Pa" and Pb".

The electromagnetic shielding structure ES" may be provided on a protection structure CP configured to protect the electromagnetic shielding structure ES" from electromagnetic waves. A buffer layer AD may be provided between the protection structure CP and the electromagnetic shielding structure ES". For example, the electromagnetic shielding structure CP may be adhered to the protection structure CP by the buffer layer AD.

An electromagnetic shielding structure according to other exemplary embodiments of the present general inventive concept will now be described with reference to FIG. 12E.

Figure 12E:
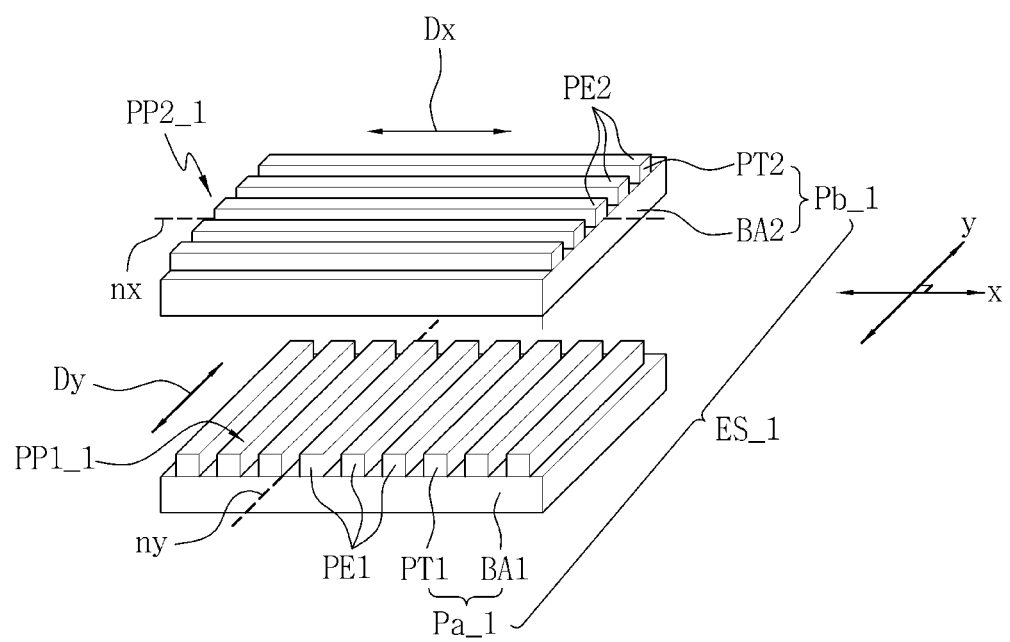

Referring to FIG. 12E, an electromagnetic shielding structure ES_1 may include first and second pads PP1_1 and PP2_1, respectively. The first pad PP1_1 may include a first polarizer Pa_1, and the second pad PP2_1 may include a second polarizer Pb_1.

More specifically, the first polarizer Pa_1 may include a plurality of first polarizing elements PE1 provided on a first base BA1 of the first pad PP1_1. The plurality of polarizing elements PE1 may be arranged according to a first pattern PT1. The first pattern PT1 may include a line pattern that arranges each polarizing element PE1 to be spaced apart from one another. Further, each first polarizing element PE1 may extend along the first base BA_1 of the first pad PP1_1 in a first direction that may provide a first transmission axis of the first polarizer Pa1.

The first polarizing elements PE1 may be conductive elements. For example, the first polarizing elements PE1 may include a conductive material, such as Al, Mo, Au, Cu, Ag, W, carbon nanotubes, Ni, or a conductive polymer.

The second polarizer Pb_1 may include second polarizing elements PE2 provided on a second base BA2 of the second pad PP2_1. The second polarizing elements PE2 may be arranged according to a second pattern PT2. The second pattern PT2 spaces each second element PE2 apart from one another. Further, each second polarizing element PE2 may extend along the second base BA_2 of the second pad PP2_1 in a second direction different from the first direction of the first polarizing elements PE1. Thus, the second direction of the second polarizing elements PE2 may provide a second transmission axis of the second polarizing Pb_1 that is different from the first transmission axis of the first polarizer Pa_1. In at least one exemplary embodiment, the second direction of the second polarizing elements PE2 is orthogonal to the first direction of the first polarizing elements PE1. Accordingly, the second transmission axis of the second polarizing Pb_1 may be orthogonal to the first transmission axis of the first polarizer Pa_1.

The second polarizing elements PE2 may be conductive elements. For example, the second polarizing elements PE2 may include a conductive material, such as Al, Mo, Au, platinum (Pt), Cu, Ag, W, carbon nanotubes, Ni, or a conductive polymer.

Each of the first and second bases BA1 and BA2 may be a film formed of resin or a portion of an electromagnetic protection target to be protected from electromagnetic waves, for example, a material layer, such as a silicon oxide layer, a silicon nitride layer, or a polyimide layer. A lengthwise direction of the first patterns PT1 may be a first direction Dy, while a lengthwise direction of the second patterns PT2 may be a second direction Dx orthogonal to the first direction Dy. Thus, from the plan view, the first patterns PT1 may be orthogonal to the second patterns PT2.

In other exemplary embodiments, each of the first and second patterns PT1 and PT2 may be an insulating pattern including metal particles. That is, in at least one exemplary embodiment, the plurality of polarizing elements PE1/PE2 may include metal particles, while still providing an insulating effect.

In at least one exemplary embodiment of the present general inventive concept of the electromagnetic shielding structure illustrated in FIG. 12E will now be described with reference to FIG. 12F. The applied exemplary embodiment should be interpreted as an example of embodiments of the present general inventive concept, and thus the present general inventive concept is not limited thereto.

Figure 12F:
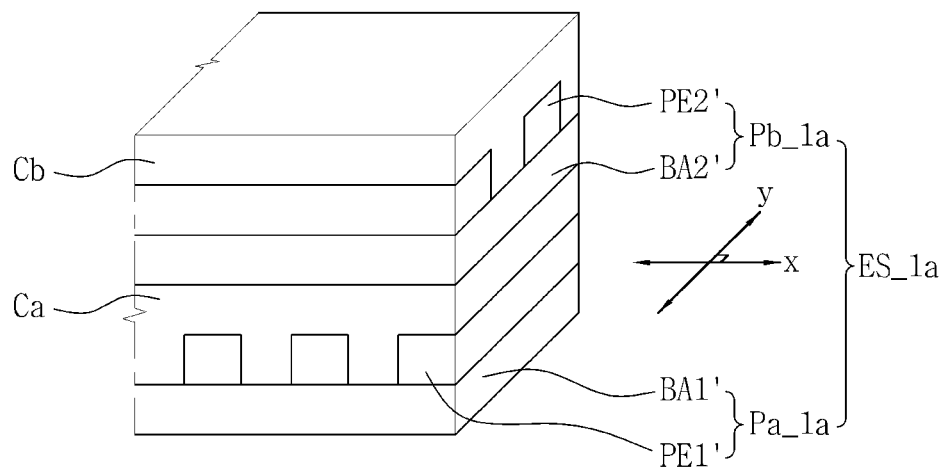

Referring to FIG. 12F, as described with reference to FIG. 12E, an electromagnetic shielding structure ES_1a may include a first polarizer Pa_1a and a second polarizer Pb_1b stacked sequentially. Also, the first polarizer Pa_1a may include first patterns PT1' provided on a first base BA1', while the second polarizer Pb_1a may include second patterns PT2' provided on a second base BA2'. The first patterns PT1' may be spaced apart from the second patterns PT2'.

A first capping layer Ca may be provided on the first base BA1' to cover the first patterns PT1'. The capping layer Ca may be formed of an insulating material. A second capping layer Cb may be provided on the second base BA2' to cover the second patterns PT2'.

Since the first and second polarizers Pa_1a and Pb_1a may be sequentially stacked, the second base BA2' may be provided on the first capping layer Ca.

In some exemplary embodiments, the first base BA1' may be a partial region of a protection structure to be protected from electromagnetic waves. For example, the first base BA1' may be a portion of a top or bottom region of a semiconductor wafer. For instance, an insulating layer may be formed on the semiconductor wafer including an IC and interconnection lines, and used as the first base BA1' described in the exemplary embodiments. A plurality of patterns PT1' may be formed on the insulating layer (i.e., the first base BA1') using a semiconductor process, and spaced apart from one another.

In another case, a plurality of conductive wires may be arranged apart from one another on the film-type first base BA1' having an insulation characteristic, and used as polarizers. Thus, the electromagnetic shielding structure ES_1a according to the present general inventive concept may be formed using various methods.

Another exemplary embodiment of the present general inventive concept of the electromagnetic shielding structure of FIG. 12E, will now be described with reference to FIG. 12G.

Figure 12G:
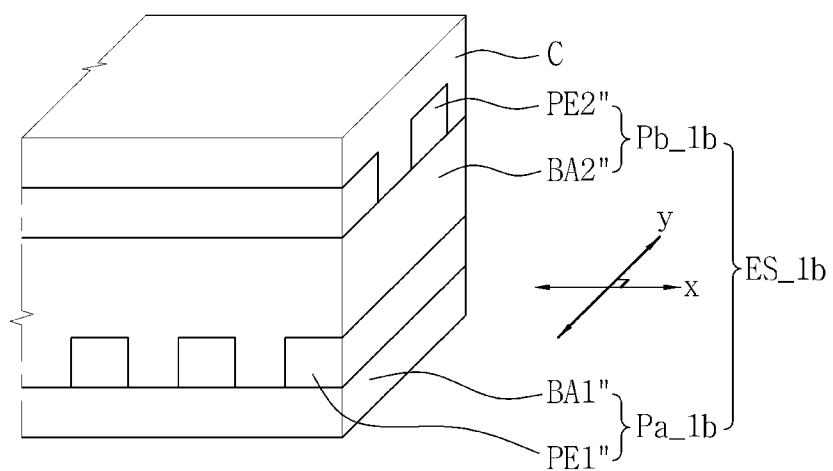

Referring to FIG. 12G, as in FIG. 12F, an electromagnetic shielding structure ES_1b including a first polarizer Pa_1b and a second polarizer Pb_1b stacked sequentially may be provided. The first polarizer Pa_1b may include a first base BA1" and first patterns PT1" provided on the first base BA1". The second polarizer Pb_1b may include a second base BA2", which may cover the first patterns PT1", and second patterns PT2". A capping layer C may be provided on the second base BA2" to cover the second patterns PT2".

The second base BA2" may be provided to cover the first patterns PT1" of the first polarizer Pa_1b and reduce the entire thickness of the first and second polarizers Pa_1b and Pb_1b. Thus, the electromagnetic shielding structure ES_1b having a reduced thickness may be easily applied to portable electronic devices requiring small thicknesses.

Figure 12H:
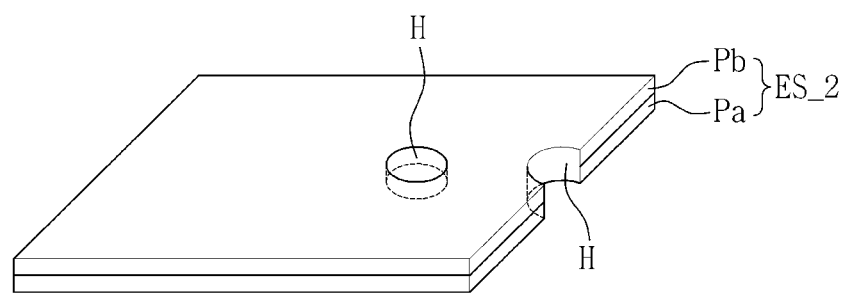

Meanwhile, as illustrated in FIG. 12H, an electromagnetic shielding structure ES_2 according to some exemplary embodiments of the present general inventive concept may have one or more openings H formed through a portion thereof. Here, the electromagnetic shielding structure ES_2 may include first and second polarizers Pa and Pb as described above. The one or more openings H may function as a connection path of an electrical connection structure configured to transmit electric signals to a protection structure to be shielded from electromagnetic waves.

As described with reference to FIGS. 1 through 11, some semiconductor devices according to the exemplary embodiments of the present general inventive concept may be provided. Here, each of the semiconductor devices may include one of the electronic shielding structures described with reference to FIGS. 12A through 12H.

Hereinafter, methods of fabricating semiconductor devices having electromagnetic shielding structures will be briefly described.

Some exemplary embodiments in which an electromagnetic shielding structure is provided on a front surface and/or back surface of a semiconductor substrate have been described above with reference to FIGS. 1 through 9.

Hereinafter, methods of fabricating semiconductor devices according to exemplary embodiments of the present general inventive concept will be described with reference to FIGS. 13 through 17. Here, proposed fabrication methods are only examples and not intended to specifically limit a method of fabricating a semiconductor device adopting an electromagnetic shielding structure.

Figure 13:
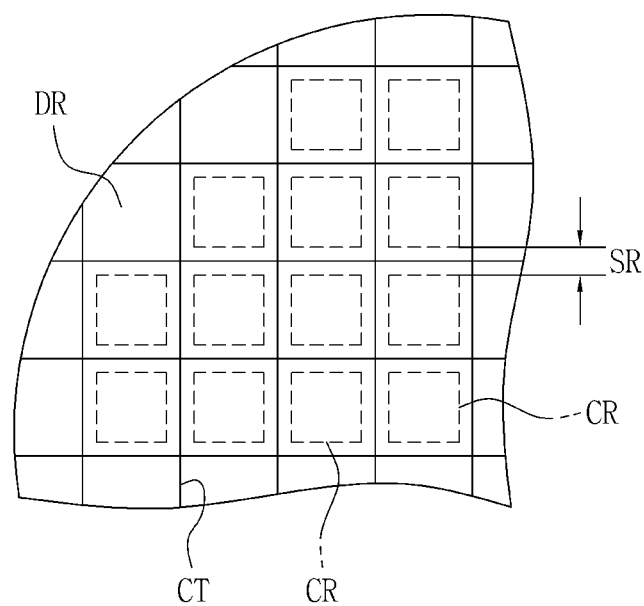
FIGS. 13 through 19B are diagrams illustrating methods of fabricating semiconductor devices according to some exemplary embodiments of the present general inventive concept.

To begin with, as illustrated in FIG. 13, a wafer WF may be prepared. The wafer WF may be a semiconductor wafer. The wafer WF may include a plurality of chip regions CR spaced apart from one another by a scribe lane region SR. Also, a portion of an edge of the wafer WF may be a dummy region DR. The scribe lane region SR may be a cut region configured to separate the chip regions CR from one another.

A method of fabricating a semiconductor device according to exemplary embodiments of the present general inventive concept will now be described with reference to FIGS. 13 and 14.

Figure 14:
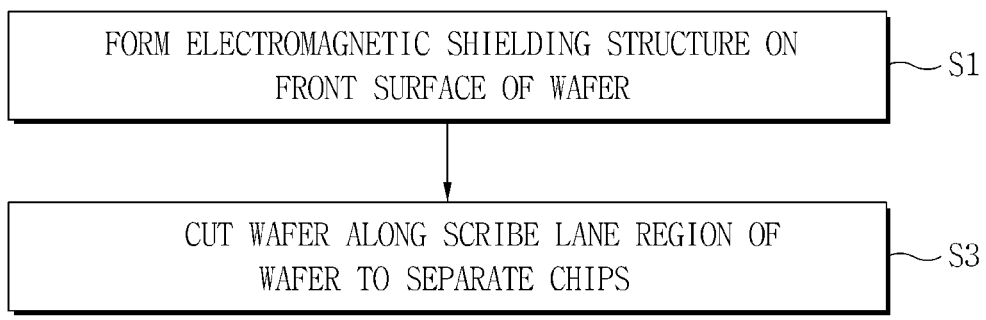

Referring to FIGS. 13 and 14, an electromagnetic shielding structure may be formed on a front surface of the wafer WF (operation S1). Here, as described with reference to FIG. 1, the term "the front surface of the wafer" may refer to a surface of a semiconductor wafer on which an IC including discrete elements, such as transistors, and a metal interconnection structure configured to electrically connect the discrete devices is formed. That is, the term "the front surface of the wafer" may be the front surface FS of the semiconductor substrate 1 of FIG. 1.

Thereafter, a plurality of chips may be separated from one another by cutting the wafer WF along the scribe lane region SR of the wafer WF (operation S3). Thus, each of the separated chips may be used to form the semiconductor chip or semiconductor device illustrated in FIG. 1.

A method of fabricating a semiconductor device according to other exemplary embodiments of the present general inventive concept will now be described with reference to FIGS. 13 and 15.

Figure 15:
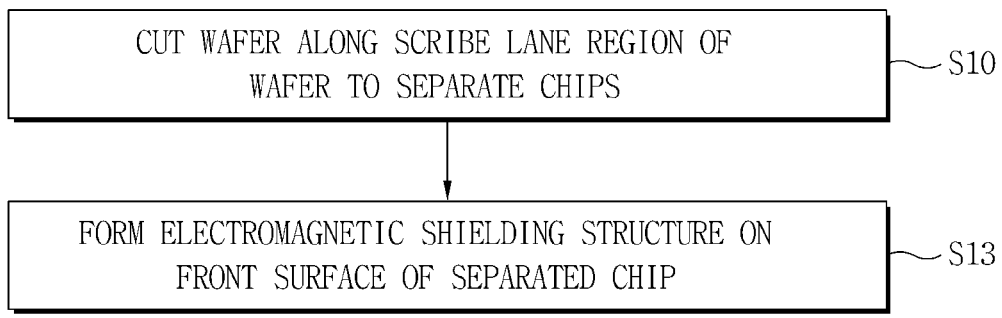

Referring to FIGS. 13 and 15, a plurality of chips CH may be separated from one another by cutting the wafer WF along the scribe lane region SR of the wafer WF (operation S10). Thereafter, an electromagnetic shielding structure may be formed on a front surface of each of the separated chips (operation S13).

A method of fabricating a semiconductor device according to other exemplary embodiments of the present general inventive concept will now be described with reference to FIGS. 13 and 16.

Figure 16:
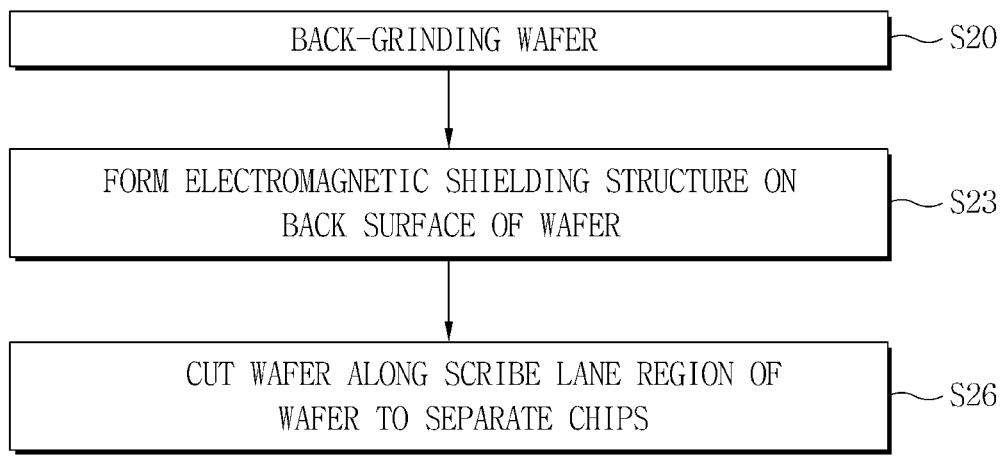

Referring to FIGS. 13 and 16, a back grinding process may be performed on a wafer WF (operation S20). A grinding process may be performed on a back surface of the wafer WF, thereby reducing the entire thickness of the wafer WF. Here, the term "the back surface of the wafer" may refer to a surface of the wafer disposed opposite the front surface of the wafer described above.

Thereafter, an electromagnetic shielding structure may be formed on the back surface of the wafer WF having the reduced thickness (operation S23). The wafer WF may be cut along a scribe lane region SR of the wafer WF to separate a plurality of chips from one another (operation S26). Thus, the separated chips may form semiconductor chips or semiconductor devices illustrated in FIG. 4.

A method of fabricating a semiconductor device according to other exemplary embodiments of the present general inventive concept will now be described with reference to FIGS. 13 and 17.

Figure 17:
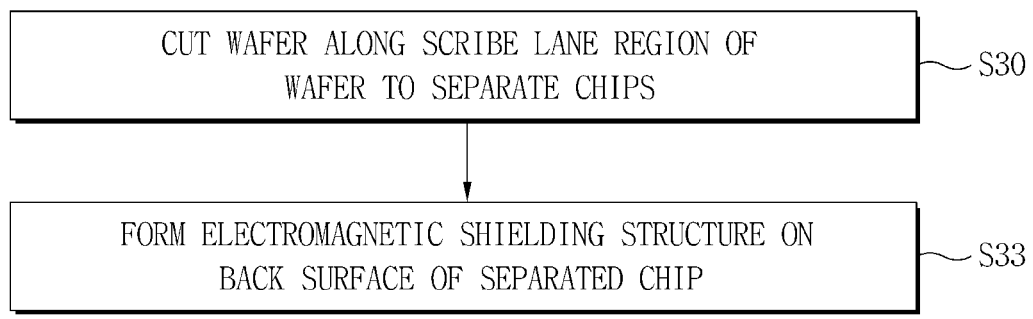

Referring to FIGS. 13 and 17, a plurality of chips may be separated from one another by cutting the wafer WF along a scribe lane region SR of the wafer WF (operation S30), and an electromagnetic shielding structure may be formed on a back surface of each of the separated chips (operation S33).

In other exemplary embodiments, an electromagnetic shielding structure may be formed on each of front and back surfaces of separated chips.

Some exemplary embodiments in which an electromagnetic shielding structure is provided within a semiconductor device or semiconductor chip are described above with reference to FIGS. 10 and 11. Examples of methods of fabricating the semiconductor devices illustrated in FIGS. 10 and 11 will now be described with reference to FIGS. 18A through 19B.

To begin with, a method of fabricating a semiconductor device according to other exemplary embodiments of the present general inventive concept will now be described with reference to FIGS. 18A through 18D.

Figure 18A:
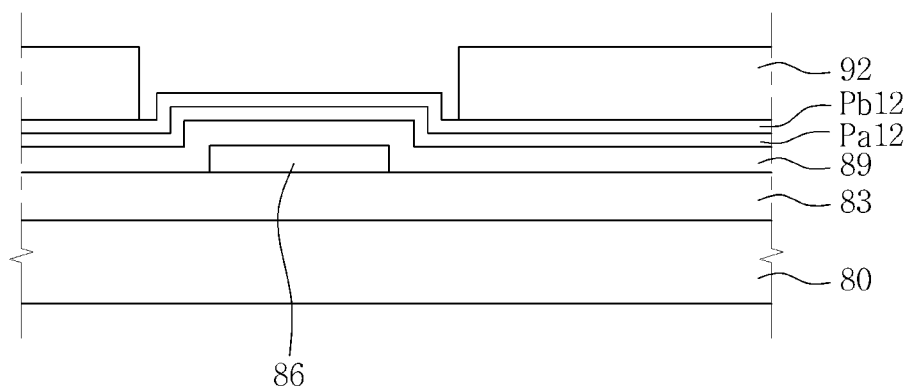

Referring to FIG. 18A, an interlayer insulating layer 83 may be formed on a semiconductor substrate 80. A conductive pattern 86 may be formed on the interlayer insulating layer 83. The conductive pattern 86 may be an interconnection or pad of the semiconductor device. A first insulating layer 89 may be formed on the semiconductor substrate 80 having the conductive pattern 86. The first insulating layer 89 may be formed of an insulating material, such as silicon oxide or silicon nitride.

A first polarizer Pa12 and a second polarizer Pb12 may be sequentially stacked on the first insulating layer 89.

A mask 92 having an opening may be formed on the second polarizer Pb12. The mask 92 may be a photoresist pattern.

Figure 18B:
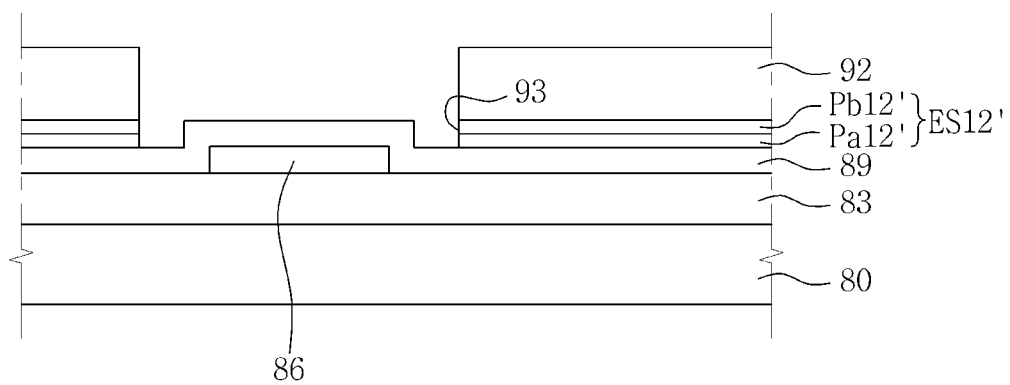

Referring to FIG. 18B, the first polarizer Pa12 and the second polarizer Pb12 may be etched using the mask 92 as an etch mask, thereby forming a first opening 93. Thus, an electromagnetic shielding structure ES12' having the first and second polarizers Pa12' and Pb12' may have a first opening 93.

Thereafter, the mask 92 may be removed.

Figure 18C:
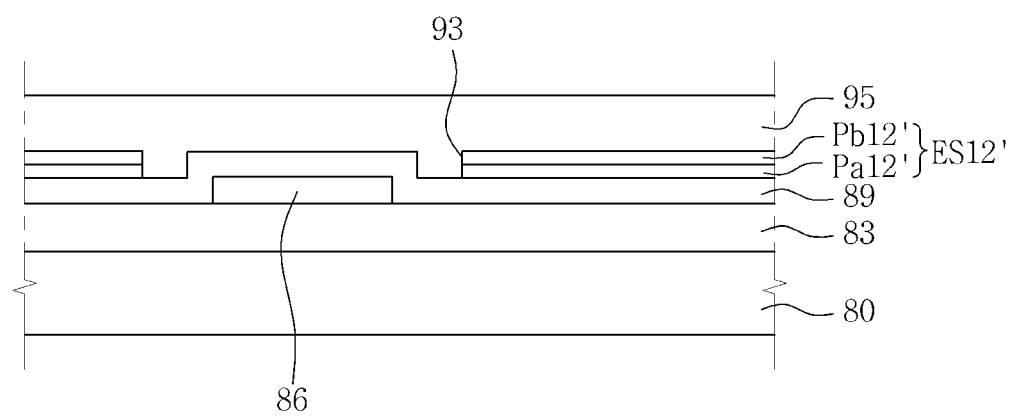

Referring to FIG. 18C, a second insulating layer 95 may be formed on the substrate 80 having the electromagnetic shielding structure ES12'. The second insulating layer 95 may be formed of an insulating material, such as polyimide, silicon nitride, or silicon oxide.

Figure 18D:
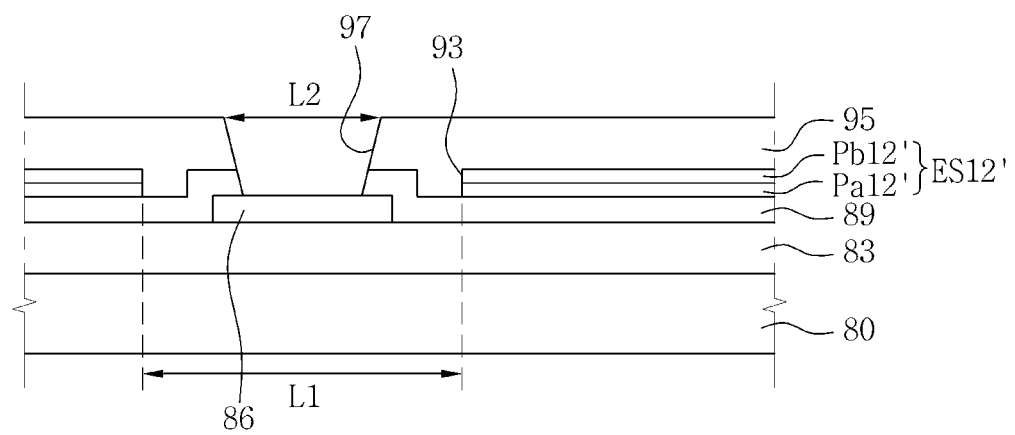

Referring to FIG. 18D, a second opening 97 may be formed to sequentially penetrate the second insulating layer 95 and the first insulating layer 89, and expose the conductive pattern 86. A width L1 of the first opening 93 of the electromagnetic shielding structure ES12' may be greater than a width L2 of the second opening 97. Thus, the electromagnetic shielding structure ES12' may be surrounded and insulated by the first and second insulating layers 89 and 95.

Thereafter, as illustrated in FIG. 10, a solder ball or pad may be formed on the conductive pattern 86 exposed by the opening 97.

Next, a method of fabricating a semiconductor device according to other exemplary embodiments of the present general inventive concept will now be described with reference to FIGS. 19A and 19B.

Figure 19A:
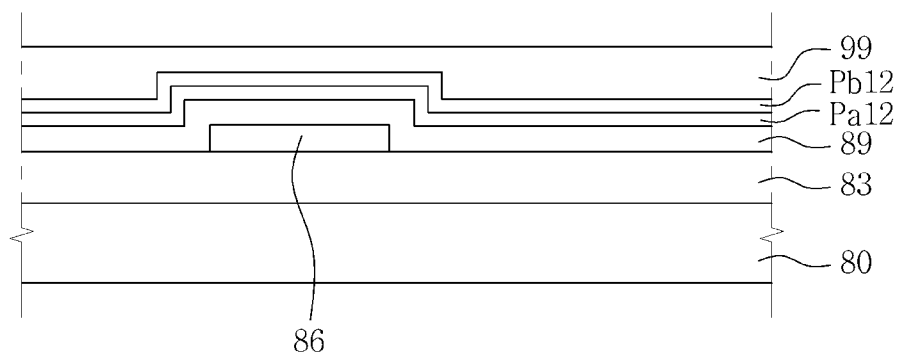

Referring to FIG. 19A, an interlayer insulating layer 83 and a conductive pattern 86 may be formed on a semiconductor substrate 80 as illustrated in FIG. 18A. A first polarizer Pa12 may be formed on the interlayer insulating layer 83 to cover the conductive pattern 86, and a second polarizer Pb12 may be formed on the first polarizer Pa12. A second insulating layer 99 may be formed on the second polarizer Pb12.

Figure 19B:
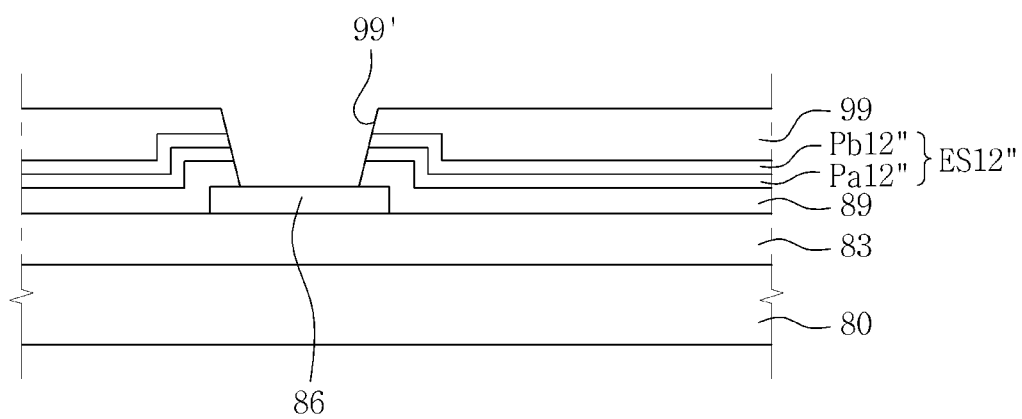

Referring to FIG. 19B, an opening 99' may be formed to sequentially penetrate the second insulating layer 99, the first and second polarizers Pa12" and Pb12", and the first insulating layer 89. Afterwards, a conductive structure illustrated in FIG. 11 may be formed on the conductive pattern 86 exposed by the opening 99'. The electromagnetic shielding structure ES12" including the first and second polarizers Pa12" and Pb12" may be an insulating electromagnetic shielding structure.

In the previous exemplary embodiments, it is described that an electromagnetic shielding structure is applied on a semiconductor wafer level or a semiconductor chip level. However, the present general inventive concept is not limited thereto, and the electromagnetic shielding structure may be applied in various fields. For example, the present general inventive concept may be applied in various fields, such as semiconductor packages, electronic components, electronic devices, and electronic systems.

To begin with, a semiconductor package structure according to exemplary embodiments of the present general inventive concept will now be described with reference to FIG. 20.

Figure 20:
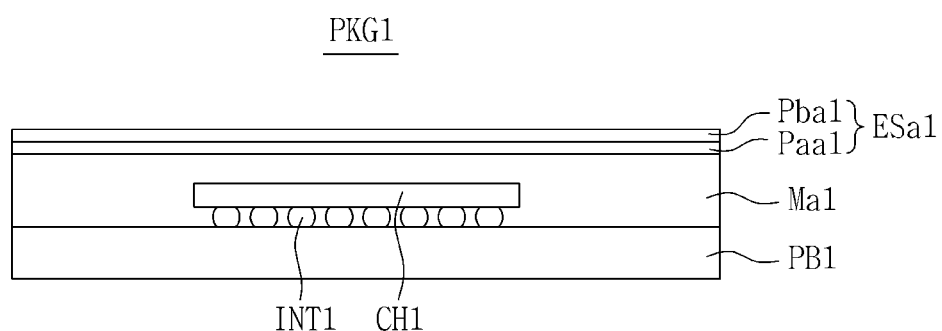
FIGS. 20 through 65 are diagrams illustrating semiconductor packages according to exemplary embodiments of the present general inventive concept.

Referring to FIG. 20, a semiconductor package PKG1 including a package substrate PB1, a semiconductor chip CH1, a molding layer Ma1, and an electromagnetic shielding structure ESa1 may be provided. The semiconductor chip CH1 may be provided on the package substrate PB1. Although a single semiconductor chip CH1 is illustrated in FIG. 20, the semiconductor package PKG1 may include a plurality of semiconductor chips, as described in greater detail below. The package substrate PB1 may be a printed circuit board (PCB).

The semiconductor chip CH1 may be electrically connected to the package substrate PB1 using a connecting member. The connecting member may include, but is not limited to, an electrically conductive via, a solder ball, a bonding wire, and an interconnection structure having a plurality of interconnects. In at least one exemplary embodiment illustrated in FIG. 20, the semiconductor package 20 may be electrically connected to the package substrate PB1 by an exemplary flip-chip connector INT1.

The molding layer Ma1 may be provided on the package substrate PB1 to cover the semiconductor chip CH1. The molding layer Ma1 may cover top and lateral surfaces of the semiconductor chip CH1. The molding layer Ma1 may include a thermosetting resin including epoxy. For example, the molding layer Ma1 may include an epoxy molding compound (EMC).

The electromagnetic shielding structure ESa1 may be provided on the molding layer Ma1. The electromagnetic shielding structure Esa1 may include a first polarizer Paa1 and a second polarizer Pba1. The first and second polarizers Paa1 and Pba1 may be sequentially stacked on the molding layer Ma1. The electromagnetic shielding structure ESa1 may cover the entire top surface of the molding layer Ma1. At least one exemplary embodiment may include the first and second polarizers Paa1 and Pba1, the molding layer Ma1 and the package substrate PB1 having substantially the same lengths such that the first and second polarizers Paa1 and Pba1, the molding layer Ma1, and the package substrate PB1 are flush with one another.

In some exemplary embodiments, each of the first and second polarizers Paa1 and Pba1 may be formed of an insulating material.

In other exemplary embodiments, each of the first and second polarizers Paa1 and Pba1 may be formed of a conductive material.

Since the electromagnetic shielding structure ESa1 is described above in detail with reference to FIGS. 12A through 12H, a detailed description of the electromagnetic shielding structure ESa1 will be omitted here.

A semiconductor package structure according to other exemplary embodiments of the present general inventive concept will now be described with reference to FIG. 21.

Figure 21:
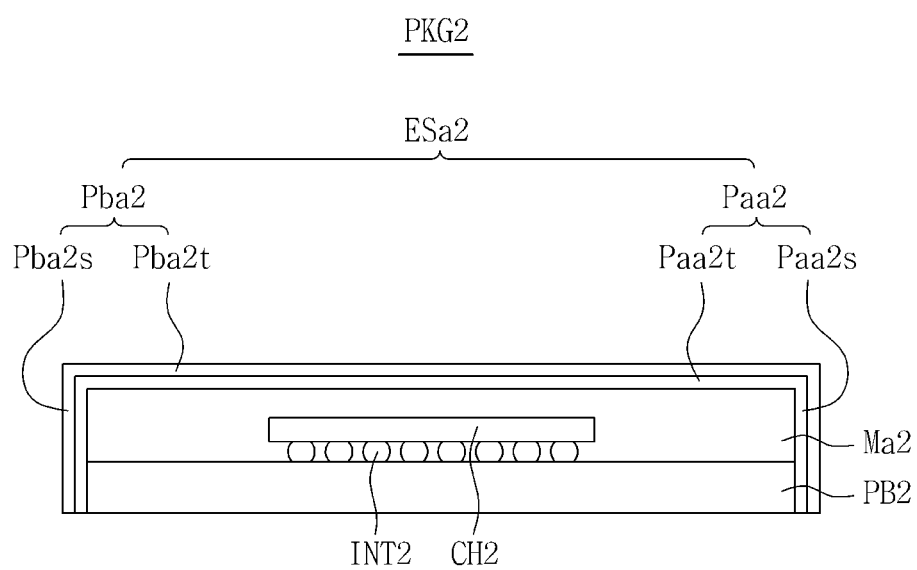

Referring to FIG. 21, a semiconductor package PKG2 including a package substrate PB2, a semiconductor chip CH2, a molding layer Ma2, and an electromagnetic shielding structure ESa2 may be provided. The semiconductor chip CH2 may be electrically connected to the package substrate PB2 by a flip-chip connector INT2. The molding layer Ma2 may be provided on the package substrate PB2 to cover top and lateral surfaces of the semiconductor chip CH2.

The electromagnetic shielding structure ESa2 may extend to cover not only a top surface of the molding layer Ma2 but also lateral surfaces of the molding layer Ma2 and the package substrate PB2. The electromagnetic shielding structure ESa2 may include first and second polarizers Paa2 and Pba2 stacked sequentially.

The first polarizer Paa2 may include a portion Paa2$t$ covering the top surface of the molding layer Ma2, and a portion Paa2$s$ covering the lateral surfaces of the molding layer Ma2 and the package substrate PB2. The second polarizer Pba2 may include a portion Pba2$t$ covering the top surface of the molding layer Ma2, and a portion Pba2$s$ covering the lateral surfaces of the molding layer Ma2 and the package substrate PB2.

The electromagnetic shielding structure ESa2 may be provided to cover not only the top surface of the molding layer Ma2 but also the lateral surfaces of the molding layer Ma2 and the package substrate PB2 so that top and lateral surfaces of the semiconductor chip CH2 may be surrounded by the electromagnetic shielding structure ESa2. Accordingly, the electromagnetic shielding structure ESa2 may surround the top and lateral surfaces of the semiconductor chip CH2 so that the semiconductor chip CH2 may be protected from electromagnetic waves from above and in lateral directions.

A semiconductor package structure according to other exemplary embodiments of the present general inventive concept will now be described with reference to FIG. 22.

Figure 22:
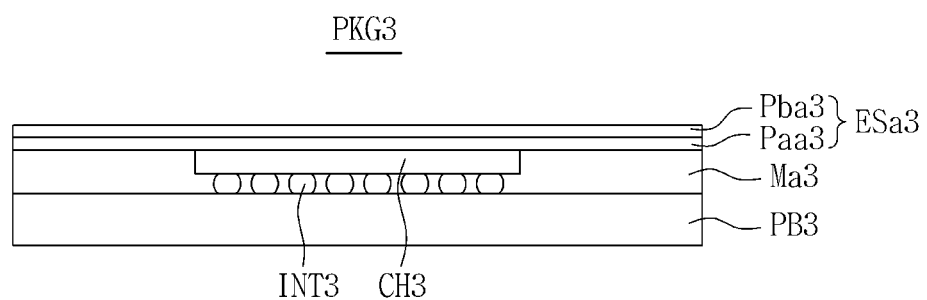

Referring to FIG. 22, a semiconductor package PKG3 including a package substrate PB3, a semiconductor chip CH3, a molding layer Ma3, and an electromagnetic shielding structure ESa3 may be provided. The semiconductor chip CH3 may be electrically connected to the package substrate PB3 by a flip-chip connector INT3. The molding layer Ma3 may be provided on the package substrate PB3 to expose a top surface of the semiconductor chip CH3, and cover lateral surfaces of the semiconductor chip CH3.

The electromagnetic shielding structure ESa3 may be provided to cover a top surface of the molding layer Ma3 and the top surface of the semiconductor chip CH3. The electromagnetic shielding structure ESa3 may include first and second polarizers Paa3 and Pba3 stacked sequentially, as described above with reference to FIG. 20.

A semiconductor package structure according to other exemplary embodiments of the present general inventive concept will now be described with reference to FIG. 23.

Figure 23:
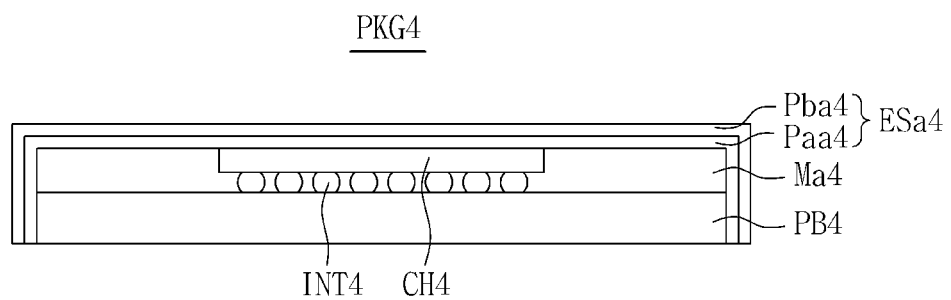

Referring to FIG. 23, a semiconductor package PKG4 including a package substrate PB4, a semiconductor chip CH4, a molding layer Ma4, and an electromagnetic shielding structure ESa4 may be provided. The semiconductor chip CH4 may be electrically connected to the package substrate PB4 using a connecting member. The connecting member may include, but is not limited to, an electrically conductive via, a solder ball, a bonding wire, an interconnection structure having a plurality of interconnects, and a combination thereof. In at least one exemplary embodiment illustrated in FIG. 20, the semiconductor package 20 may be electrically connected to the package substrate PB1 by a flip-chip connector INT4. The flip-chip connector INT4 includes a combination of a conductive via and a solder ball. The package substrate PB4, the semiconductor chip CH4, and the molding layer Ma4 may be provided, as described with reference to FIG. 22.

The electromagnetic shielding structure ESa4 may cover not only a top surface of the molding layer Ma4 and a top surface of the semiconductor chip CH4, but also lateral surfaces of the molding layer Ma4 and the package substrate PB4. That is, the electromagnetic shielding structure ESa4 may extend to cover not only the top surface of the molding layer Ma4 and the top surface of the semiconductor chip CH4 but also the lateral surfaces of the molding layer Ma4 and the package substrate PB4 (repetitive of above sentence, except the use of the word "extend"). The electromagnetic shielding structure ESa4 may include first and second polarizers Paa5 and Pba4 stacked sequentially.

A semiconductor package structure according to other exemplary embodiments of the present general inventive concept will now be described with reference to FIG. 24.

Figure 24:
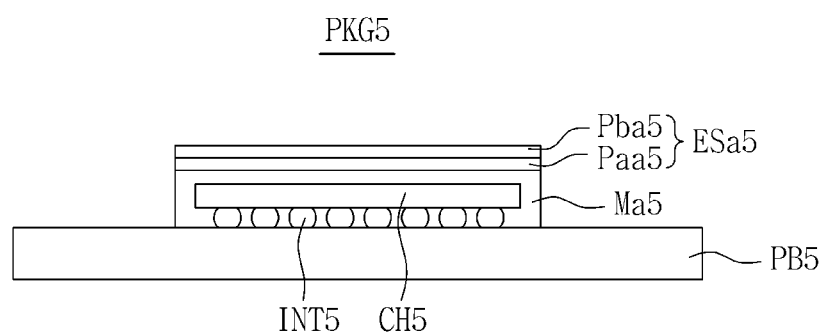

Referring to FIG. 24, a semiconductor package PKG5 including a package substrate PB5, a semiconductor chip CH5, a molding layer Ma5, and an electromagnetic shielding structure ESa5 may be provided. The semiconductor chip CH5 may be electrically connected to the package substrate PB5 by a flip-chip connector INT5.

The molding layer Ma5 may be provided on the package substrate PB5 to cover top and lateral surfaces of the semiconductor chip CH5. The molding layer Ma5 may be provided to cover a portion of the package substrate PB5.

For instance, the molding layer Ma5 may be provided on a portion of the package substrate PB5 to cover the top and lateral surfaces of the semiconductor chip CH5. The molding layer Ma5 may have a smaller width than the package substrate PB5. The electromagnetic shielding structure ESa5 may include first and second polarizers Paa5 and Pba5 stacked sequentially on the molding layer Ma5.

A semiconductor package structure according to other exemplary embodiments of the present general inventive concept will now be described with reference to FIG. 25.

Figure 25:
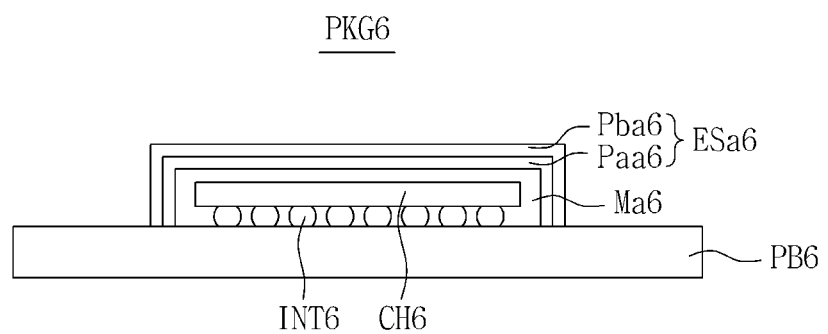

Referring to FIG. 25, a semiconductor package PKG6 including a package substrate PB6, a semiconductor chip CH6, a molding layer Ma6, and an electromagnetic shielding structure ESa6 may be provided. The semiconductor chip CH6 may be electrically connected to the package substrate PB6 by a flip-chip connector INT6.

The molding layer Ma6 may be provided on the package substrate PB6 to cover top and lateral surfaces of the semiconductor chip CH6. The molding layer Ma6 may cover a portion of the package substrate PB6.

The electromagnetic shielding structure ESa6 may extend to cover not only a top surface of the molding layer Ma6 but also lateral surfaces of the molding layer Ma6. That is, the electromagnetic shielding structure ESa6 may be provided on a portion of the package substrate PB6 to surround the top and lateral surfaces of the semiconductor chip CH6. The electromagnetic shielding structure ESa6 may include first and second polarizers Paa6 and Pba6 stacked sequentially.

A semiconductor package structure according to other exemplary embodiments of the present general inventive concept will now be described with reference to FIG. 26.

Figure 26:
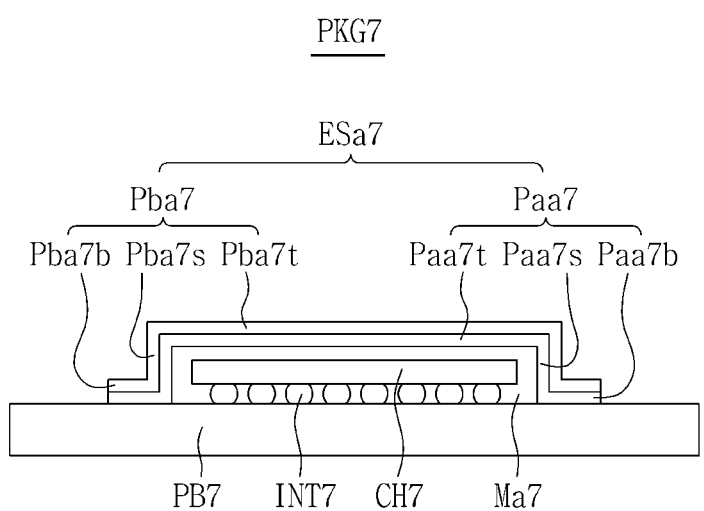

Referring to FIG. 26, a semiconductor package PKG7 including a package substrate PB7, a semiconductor chip CH7, a molding layer Ma7, and an electromagnetic shielding structure ESa7 may be provided. The semiconductor chip CH7 may be electrically connected to the package substrate PB7 by a flip-chip connector INT7. The molding layer Ma7 may be provided on the package substrate PB7 to cover top and lateral surfaces of the semiconductor chip CH7. The molding layer Ma7 may cover a portion of the package substrate PB7.

The electromagnetic shielding structure ESa7 may extend to cover a top surface of the molding layer Ma7, lateral surfaces of the molding layer Ma7, and a portion of a top surface of the package substrate PB7. The electromagnetic shielding structure ESa7 may include first and second polarizers Paa7 and Pba7 stacked sequentially.

The first polarizer Paa7 may include a portion Paa7t covering the top surface of the molding layer Ma7, a portion Paa7s covering the lateral surface of the molding layer Ma, and a portion Paa7b covering the top surface of the package substrate PB7. Also, the second polarizer Pba7 may include a portion Pba7t covering the top surface of the molding layer Ma7, a portion Pba7s covering the lateral surface of the molding layer Ma, and a portion Pba7b covering the top surface of the package substrate PB7.

A semiconductor package structure according to other exemplary embodiments of the present general inventive concept will now be described with reference to FIG. 27.

Figure 27:
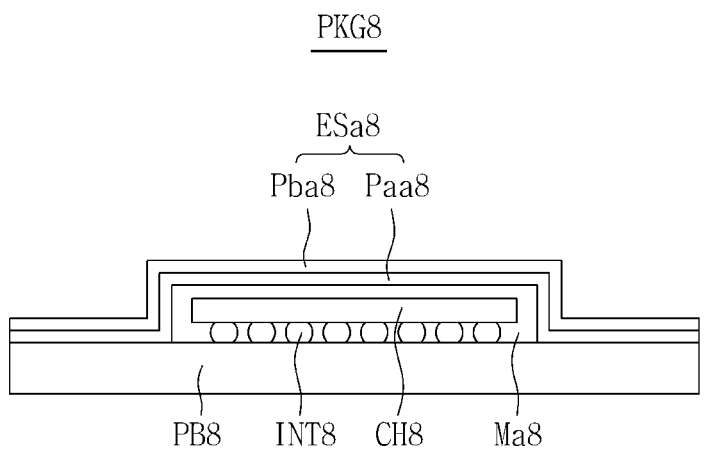

Referring to FIG. 27, a semiconductor package PKG8 including a package substrate PB8, a semiconductor chip CH8, a molding layer Ma8, and an electromagnetic shielding structure ESa8 may be provided. The semiconductor chip CH8 may be electrically connected to the package substrate PB8 by a flip-chip connector INT8. The molding layer Ma8 may be provided on the package substrate PB8 to cover top and lateral surfaces of the semiconductor chip CH8. The molding layer Ma8 may cover a portion of the package substrate PB8.

The electromagnetic shielding structure ESa8 may extend to cover a top surface of the molding layer Ma8, lateral surfaces of the molding layer Ma8, and a top surface of the package substrate PB8. In this case, the electromagnetic shielding structure ESa8 may extend to an end portion of the package substrate PB8. The electromagnetic shielding structure ESa8 may include first and second polarizers Paa8 and Pba8 stacked sequentially.

A semiconductor package structure according to other exemplary embodiments of the present general inventive concept will now be described with reference to FIG. 28.

Figure 28:
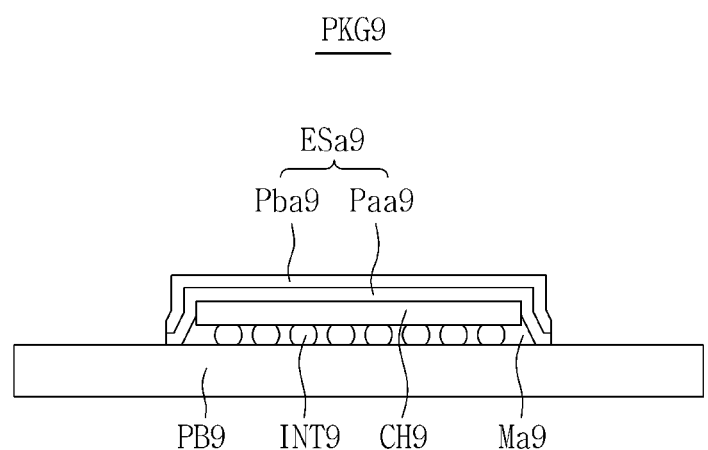

Referring to FIG. 28, a semiconductor package PKG9 including a package substrate PB9, a semiconductor chip CH9, an under-fill member Ma9, and an electromagnetic shielding structure ESa9 may be provided. The semiconductor chip CH9 may be electrically connected to the package substrate PB9 by a flip-chip connector INT9. The under-fill member Ma9 may be provided on the package substrate PB9 to expose a top surface of the semiconductor chip CH9, and cover lateral surfaces of the semiconductor chip CH9. The under-fill member Ma9 may be interposed between the semiconductor chip CH9 and the package substrate PB9, and partially or wholly cover the lateral surfaces of the semiconductor chip CH9. The under-fill member Ma9 may have inclined lateral surfaces.

The electromagnetic shielding structure ESa9 may extend to cover the top surface of the semiconductor chip CH9 and the lateral surfaces of the under-fill member Ma9. The electromagnetic shielding structure ESa9 may include first and second polarizers Paa9 and Pba9 stacked sequentially.

A semiconductor package structure according to other exemplary embodiments of the present general inventive concept will now be described with reference to FIG. 29.

Figure 29:
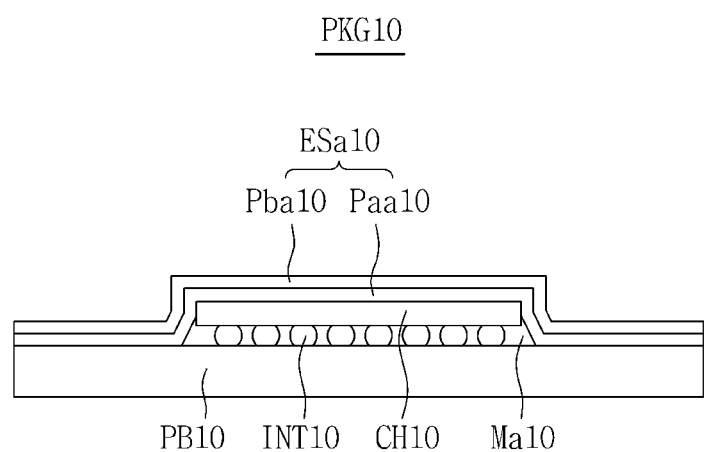

Referring to FIG. 29, a semiconductor package PKG10 including a package substrate PB10, a semiconductor chip CH10, an under-fill member Ma10, and an electromagnetic shielding structure ESa10 may be provided. The semiconductor chip CH10 may be electrically connected to the package substrate PB10 by a flip-chip connector INT10. The under-fill member Ma10 may be provided on the package substrate PB10 to expose a top surface of the semiconductor chip CH10, and cover lateral surfaces of the semiconductor chip CH10. The under-fill member Ma10 may have inclined lateral surfaces.

The electromagnetic shielding structure ESa10 may cover the top surface of the semiconductor chip CH10 and also, cover lateral surfaces of the under-fill member Ma10 and a top surface of the package substrate PB10. The electromagnetic shielding structure ESa10 may include first and second polarizers Paa10 and Pba10 stacked sequentially.

A semiconductor package structure according to other exemplary embodiments of the present general inventive concept will now be described with reference to FIGS. 30 and 31.

Figure 30:
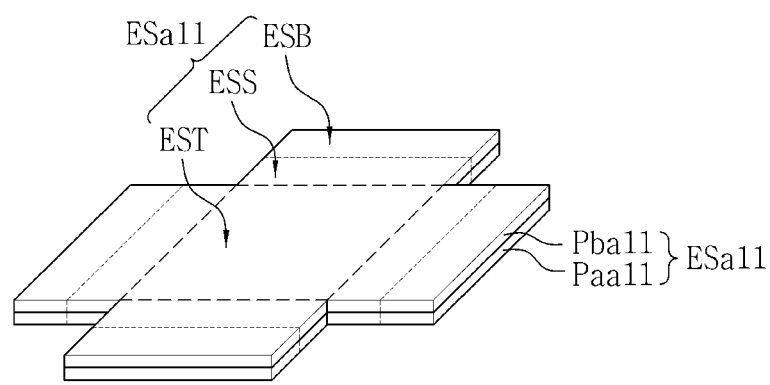

Referring to FIG. 30, an electromagnetic shielding structure ESa11 having first and second polarizers Paa11 and Pba11 stacked sequentially may be provided.

In some exemplary embodiments, the electromagnetic shielding structure ESa11 may include a first portion EST covering a top surface of a semiconductor chip, a second portion ESS covering lateral surfaces of the semiconductor chip or a molding layer, and a third portion ESB covering a top surface of a package substrate. From the plan view, the first portion EST may have a tetragonal shape, and the second and third portions ESS and ESB may have shapes extending from corners of the first portion EST. For example, the electromagnetic shielding structure ESa11 may have the shape of a cross.

Figure 31:
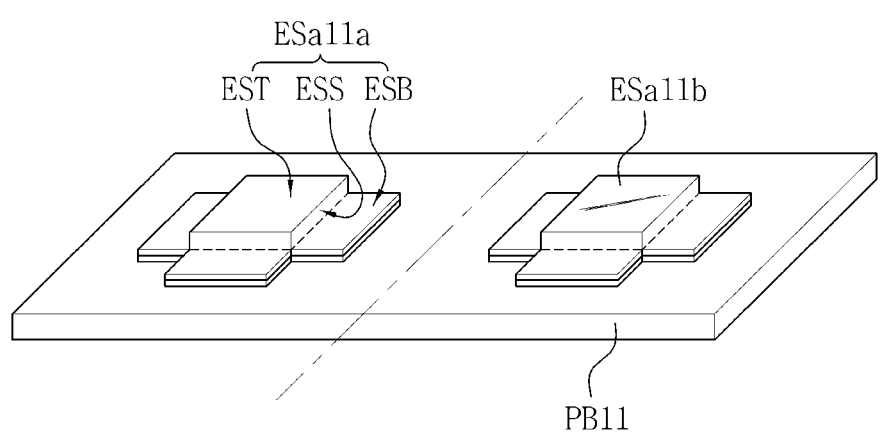

Referring to FIGS. 30 and 31, a semiconductor package PKG11 may include a plurality of semiconductor chips provided on a package substrate PB11, and electromagnetic shielding structures ESa11a and ESa11b configured to respectively cover the plurality of semiconductor chips. Each of the electromagnetic shielding structure ESa11a and ESa11b may include a portion EST covering a top surface of the corresponding semiconductor chip, a portion ESS covering lateral surfaces of the corresponding semiconductor chip, and a portion ESB covering a top surface of the package substrate PB11. The electromagnetic shielding structures ESa11a and ESa11b may be spaced apart from each other on a single package substrate PB11.

In other exemplary embodiments, each of the electromagnetic shielding structures ESa11a and ESa11b may include a portion EST covering a top surface of the corresponding semiconductor chip, and a portion ESS covering lateral surfaces of the corresponding semiconductor chip without a portion ESB covering a top surface of the package substrate PB11.

A semiconductor package structure according to other exemplary embodiments of the present general inventive concept will now be described with reference to FIG. 32.

Figure 32:
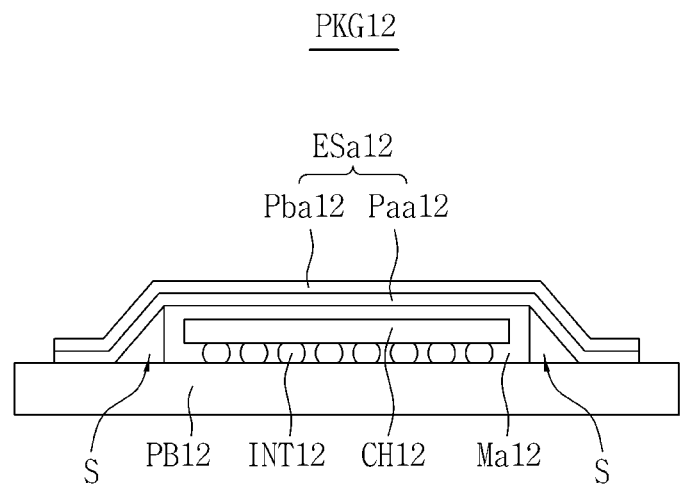

Referring to FIG. 32, a semiconductor package PKG12 including a package substrate PB12, a semiconductor chip CH12, a molding layer Ma12, and an electromagnetic shielding structure ESa12 may be provided. The semiconductor chip CH12 may be electrically connected to the package substrate PB12 by a flip-chip connector INT12. The molding layer Ma12 may be provided on the package substrate PB12 to cover top and lateral surfaces of the semiconductor chip CH12.

An electromagnetic shielding structure ESa12 may be provided to cover the top surface of the semiconductor chip CH12 and a portion of a top surface of the package substrate PB12. The electromagnetic shielding structure ESa12 may include first and second polarizers Paa12 and Pba12 stacked sequentially.

The electromagnetic shielding structure ESa12 may not directly cover lateral surfaces of the molding layer Ma12. A vacant space S may be provided between the electromagnetic shielding structure ESa12 and the lateral surfaces of the molding layer Ma12.

A semiconductor package structure according to other exemplary embodiments of the present general inventive concept will now be described with reference to FIG. 33.

Figure 33:
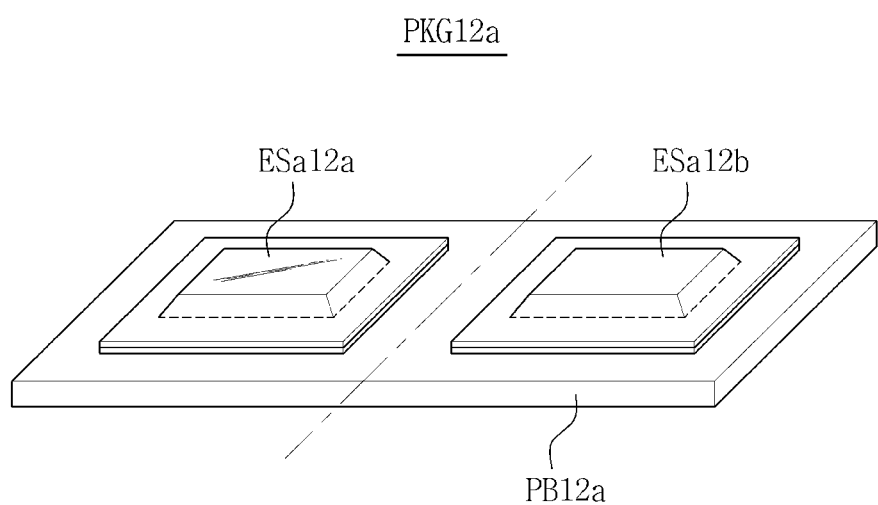

Referring to FIG. 33, a semiconductor package PKG12a may include a package substrate PB12a, a plurality of semiconductor chips, and a plurality of electromagnetic shielding structures ESa12a and ESa12b. The electromagnetic shielding structures ESa12a and ESa12b may be spaced apart from one another on the package substrate PB12a. Also, each of the electromagnetic shielding structures ESa12a and ESa12b may be substantially the same as the electromagnetic shielding structure ESa12 described with reference to FIG. 32.

A semiconductor package structure according to other exemplary embodiments of the present general inventive concept will now be described with reference to FIG. 34.

Figure 34:
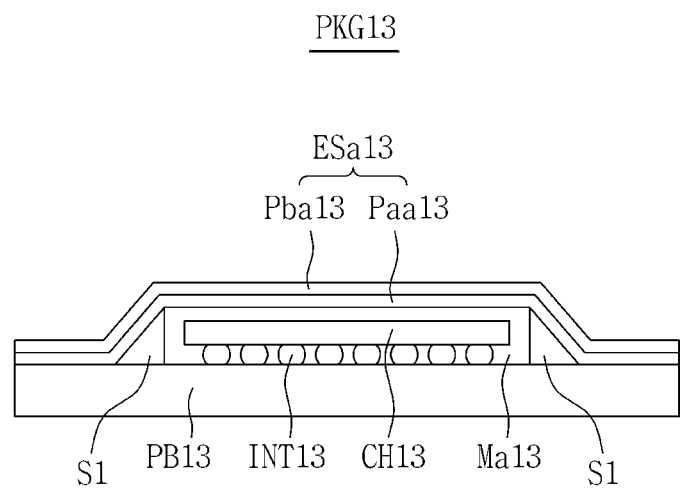

Referring to FIG. 34, a semiconductor package PKG13 including a package substrate PB13, a semiconductor chip CH13, a molding layer Ma13, and an electromagnetic shielding structure ESa13 may be provided. The semiconductor chip CH13 may be electrically connected to the package substrate PB13 by a flip-chip connector INT13. The molding layer Ma13 may be provided on the package substrate PB13 to cover top and lateral surfaces of the semiconductor chip CH13.

The electromagnetic shielding structure ESa13 may extend to cover the semiconductor chip CH13 and the entire top surface of the package substrate PB13. The electromagnetic shielding structure ESa13 may include first and second polarizers Paa13 and Pba13 stacked sequentially.

The electromagnetic shielding structure ESa13 may not directly cover lateral surfaces of the molding layer Ma13. A vacant space S1 may be provided between the electromagnetic shielding structure ESa13 and the lateral surfaces of the molding layer Ma13.

A semiconductor package structure according to other exemplary embodiments of the present general inventive concept will now be described with reference to FIG. 35.

Figure 35:
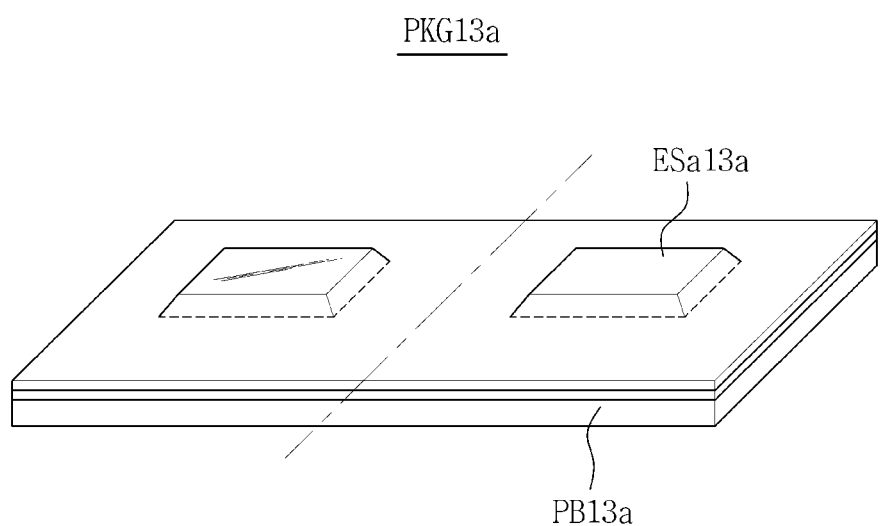

Referring to FIG. 35, a semiconductor package PKG13a may include a package substrate PB13a, a plurality of semiconductor chips disposed on the package substrate PB13a, and an electromagnetic shielding structure ESa13a configured to respectively cover the semiconductor chips. That is, the electromagnetic shielding structure ESa13a may be provided on the package substrate PB13a to cover the plurality of semiconductor chips.

A semiconductor package structure according to other exemplary embodiments of the present general inventive concept will now be described with reference to FIG. 36.

Figure 36:
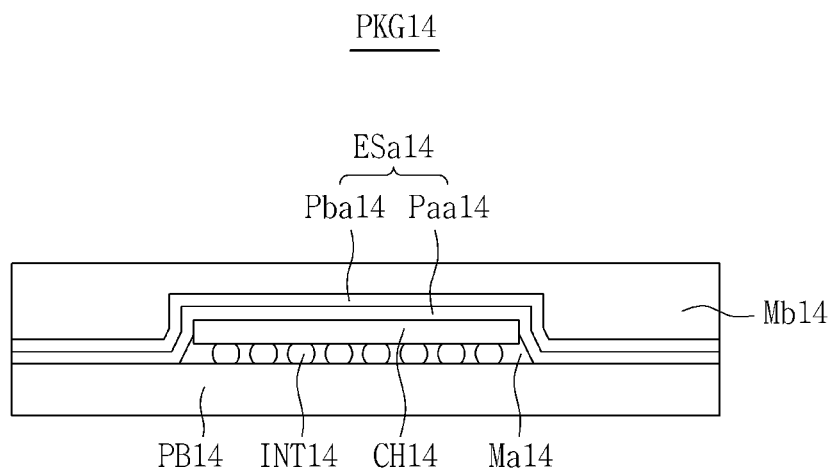

Referring to FIG. 36, a semiconductor package PKG14 including a package substrate PB14, a semiconductor chip CH14, an under-fill member Ma14, an electromagnetic shielding structure ESa14, and a molding layer Mb14 may be provided. The semiconductor chip CH14 may be electrically connected to the package substrate PB14 by a flip-chip connector INT14. The under-fill member Ma14 may be provided on the package substrate PB14 to expose a top surface of the semiconductor chip CH14, and cover lateral surfaces of the semiconductor chip CH14. The under-fill member Ma14 may have inclined lateral surfaces.

The electromagnetic shielding structure ESa14 may cover the top surface of the semiconductor chip CH14, lateral surfaces of the under-fill member Ma14, and a top surface of the package substrate PB14. The electromagnetic shielding structure ESa14 may include first and second polarizers Paa14 and Pba14 stacked sequentially. A molding layer Mb14 may be provided on the electromagnetic shielding structure ESa14. Accordingly, the electromagnetic shielding structure ESa14 may include a portion interposed between the semiconductor chip CH14 and the molding layer Mb14.

A semiconductor package structure according to other exemplary embodiments of the present general inventive concept will now be described with reference to FIG. 37.

Figure 37:
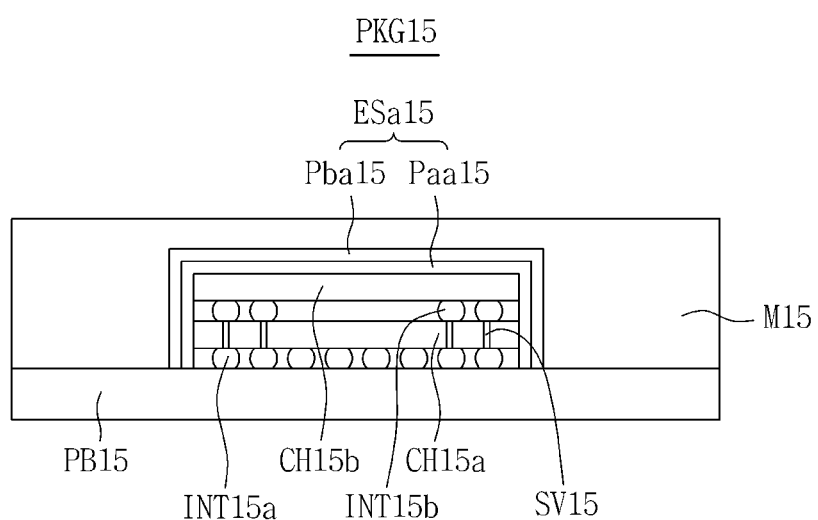

Referring to FIG. 37, a semiconductor package PKG15 including a package substrate PB15, first and second semiconductor chips CH15a and CH15b, an electromagnetic shielding structure ESa15, and a molding layer M15 may be provided. The first and second semiconductor chips CH15a and CH15b may be sequentially stacked on the package substrate PB15. A first connector INT15a including a conductive material may be provided between the first semiconductor chip CH15a and the package substrate PB15, and a second connector INT15b including a conductive material may be provided between the first and second semiconductor chips CH15a and CH15b. The first and second connectors INT15a and INT15b may be electrically connected by a via SV15 formed through the first semiconductor chip CH15a.

The electromagnetic shielding structure ESa15 may include an insulating electromagnetic shielding structure or a conductive electromagnetic shielding structure. The electromagnetic shielding structure ESa15 may further include first and second polarizers Paa15 and Pba15. The first and second polarizers Paa15 and Pba15 may be arranged in various manners. For example at least one exemplary embodiment illustrated in FIG. 37 includes first and second polarizers Paa15 and Pba15 stacked sequentially. The electromagnetic shielding structure ESa15 may cover a top surface of the second semiconductor chip CH15b and lateral surfaces of the first and second semiconductor chips CH15a and CH15b. Additionally, the first and second polarizers may have respective transmission axes. For example, the first polarizer may have a respective first axis and the second axis may have a respective second axis different from the first axis. Further, the first axis of the first polarizer may be positioned differently with respect to the position of the second axis of the second polarizer. For example, at least one exemplary embodiment of the present general present general inventive concept may include a first polarizer having a first transmission axis, and a second polarizer having a second transmission axis that is orthogonal with respect to the first transmission axis of the first polarizer.

The molding layer M15 may be provided on the electromagnetic shielding structure ESa15. The molding layer M15 may have a planar top surface.

A semiconductor package structure according to other exemplary embodiments of the present general inventive concept will now be described with reference to FIG. 38.

Figure 38:
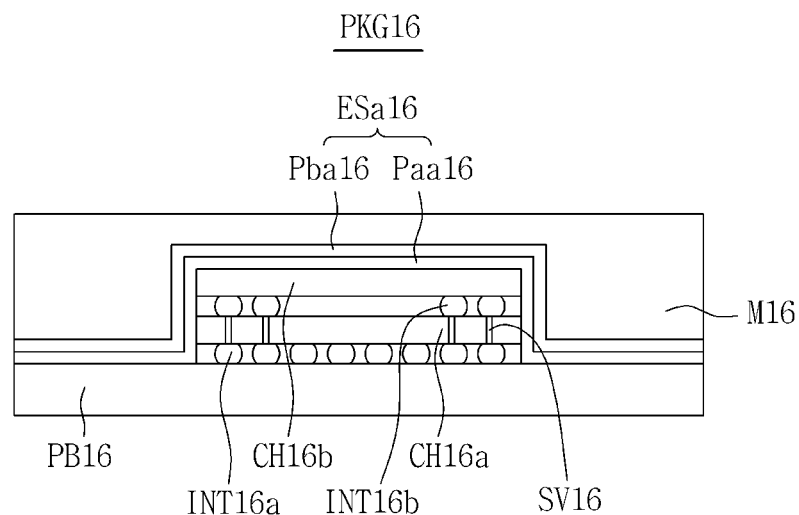

Referring to FIG. 38, a semiconductor package PKG16 including a package substrate PB16, first and second semiconductor chips CH16a and CH16b, an electromagnetic shielding structure ESa16, and a molding layer M16 may be provided. The first and second semiconductor chips CH16a and CH16b may be sequentially stacked on the package substrate PB16. A first connector INT16a including a conductive material may be provided between the first semiconductor chip CH16a and the package substrate PB16, and a second connector INT16b including a conductive material may be provided between the first and second semiconductor chips CH16a and CH16b. The first and second connectors INT16a and INT16b may be electrically connected by a via SV16 formed through the first semiconductor chip CH16a.

The electromagnetic shielding structure ESa16 may include first and second polarizers Paa16 and Pba16 stacked sequentially. The electromagnetic shielding structure ESa16 may cover a top surface of the second semiconductor chip CH16b, lateral surfaces of the first and second semiconductor chips CH16a and CH16b, and a top surface of the package substrate PB16. The molding layer Ma16 may be provided on the electromagnetic shielding structure ESa16.

A semiconductor package structure according to other exemplary embodiments of the present general inventive concept will now be described with reference to FIG. 39.

Figure 39:
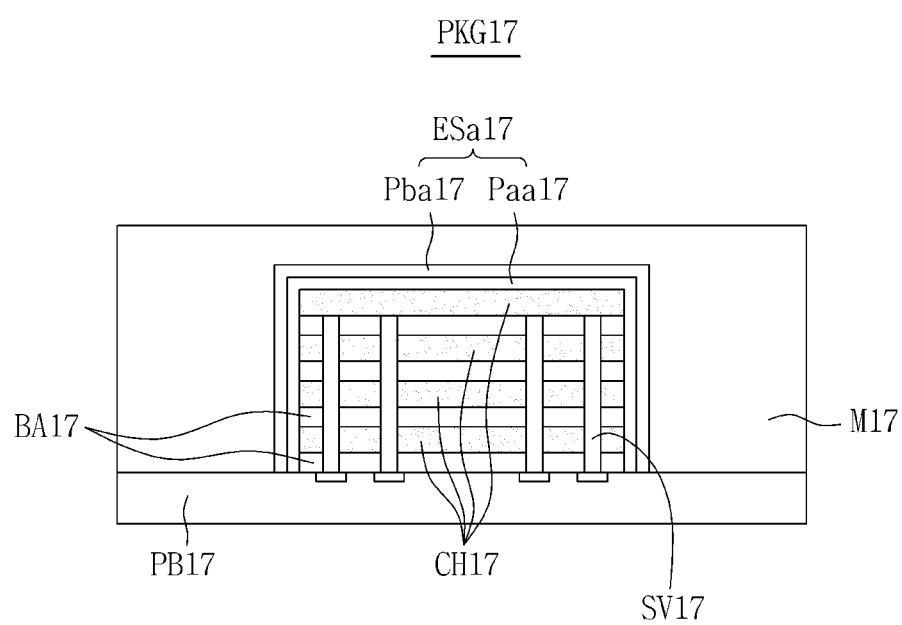

Referring to FIG. 39, a semiconductor package PKG17 including a package substrate PB17, a plurality of sequentially stacked semiconductor chips CH17, an electromagnetic shielding structure ESa17, and a molding layer M17 may be provided. The plurality of semiconductor chips CH17 may be electrically connected to the package substrate PB17 by a connecting member. The connecting member may include, but is not limited to, an electrically conductive via, a solder ball, a bonding wire, an interconnection structure having a plurality of interconnects, and a combination thereof. In at least one exemplary embodiment illustrated in FIG. 39, the connecting member is a via SV17 formed through the semiconductor chips CH17. An intermediate layer BA17 including an adhesion layer may be provided under each of the semiconductor chips CH17.

The electromagnetic shielding structure ESa17 may include first and second polarizers Paa17 Pba17 stacked sequentially. The electromagnetic shielding structure ESa17 may be provided on the plurality of semiconductor chips CH17 to cover lateral surfaces of the semiconductor chips CH17.

The molding layer Ma17 may be provided on the package substrate PB17 to cover the electromagnetic shielding structure ESa17.

A semiconductor package structure according to other exemplary embodiments of the present general inventive concept will now be described with reference to FIG. 40.

Figure 40:
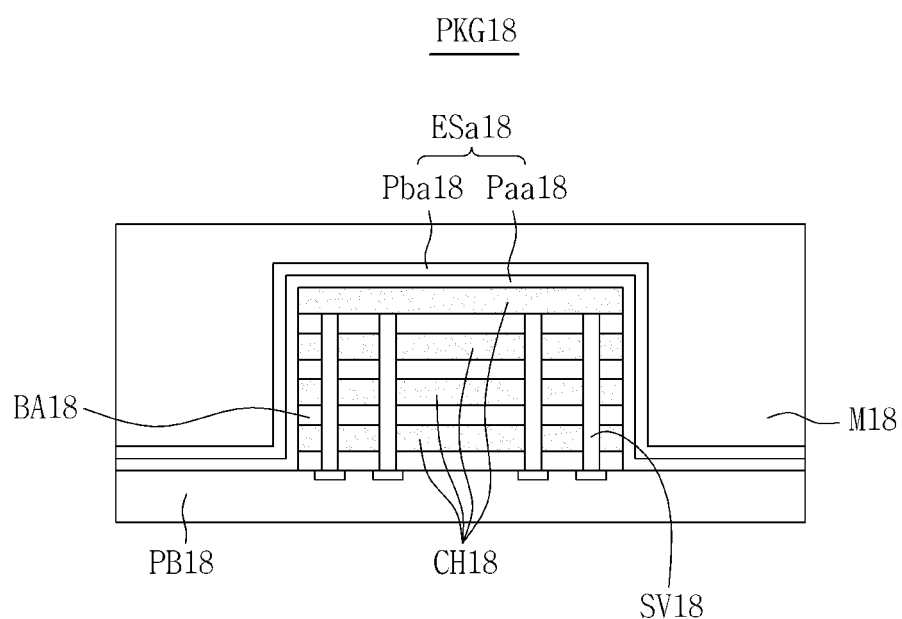

Referring to FIG. 40, a semiconductor package PKG18 including a package substrate PB18, a plurality of sequentially stacked semiconductor chips CH18, an electromagnetic shielding structure ESa18, and a molding layer M18 may be provided. The plurality of semiconductor chips CH18 may be electrically connected to the package substrate PB18 by a through via SV18.

The electromagnetic shielding structure ESa18 may include first and second polarizers Paa18 and Pba18 stacked sequentially. The electromagnetic shielding structure ESa18 may be provided on the plurality of semiconductor chips CH18, and extend to cover lateral surfaces of the semiconductor chips CH18, and a top surface of the package substrate PB18. The molding layer M18 may be provided on the package substrate PB18 to cover the electromagnetic shielding structure ESa18.

A semiconductor package structure according to other exemplary embodiments of the present general inventive concept will now be described with reference to FIG. 41.

Figure 41:
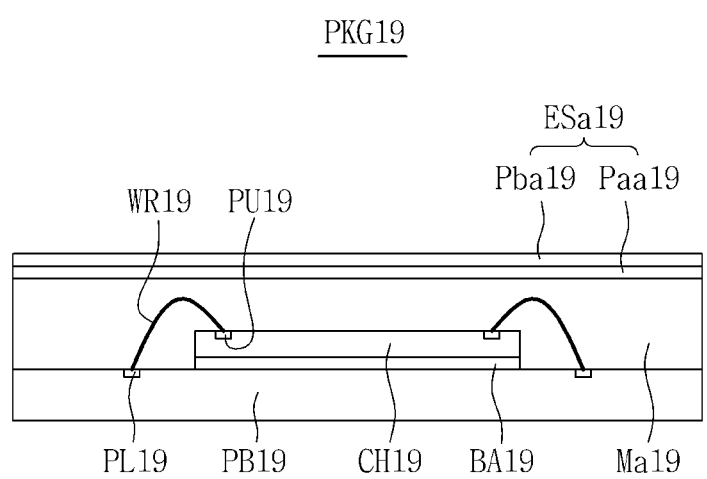

Referring to FIG. 41, a semiconductor package PKG19 including a package substrate PB19, a semiconductor chip CH19, a molding layer Ma19, and an electromagnetic shielding structure ESa19 may be provided. The semiconductor chip CH19 may be provided on the package substrate PB19. The semiconductor chip CH19 may be adhered to the package substrate PB19 by an adhesion member BA19.

The semiconductor chip CH19 may be electrically connected to the package substrate PB19 using a connecting member. The connecting member may include, but is not limited to, an electrically conductive via, a solder ball, an electrically conductive pad, a bonding wire, an interconnection structure having a plurality of interconnects, and a combination thereof. In at least one exemplary embodiment illustrated in FIG. 41, a bonding wire WR19 may be provided to connect a pad PU19 of the semiconductor chip CH19 and a pad PL19 of the package substrate PB19. Thus, the semiconductor chip CH19 may be electrically connected to the package substrate PB19 by the bonding wire WR19.

The molding layer Ma19 may be provided on the package substrate PB19 to cover the semiconductor chip CH19 and the bonding wire WR19. The electromagnetic shielding structure ESa19 may be provided to cover a top surface of the molding layer Ma19. The electromagnetic shielding structure ESa19 may include first and second polarizers Paa19 and Pba19.

A semiconductor package structure according to other exemplary embodiments of the present general inventive concept will now be described with reference to FIG. 42.

Figure 42:
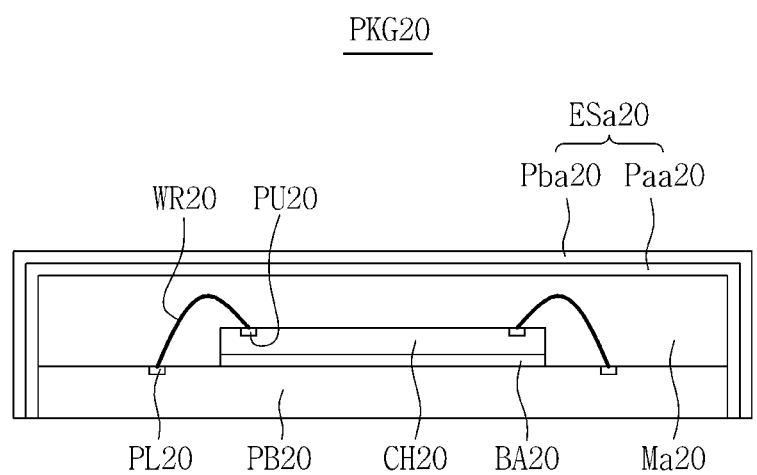

Referring to FIG. 42, a semiconductor package PKG20 including a package substrate PB20, a semiconductor chip CH20, a molding layer Ma20, and an electromagnetic shielding structure ESa20 may be provided. The semiconductor chip CH20 may be adhered to the package substrate PB20 by an adhesion member BA20. A bonding wire WR20 may be provided to connect a pad PU20 of the semiconductor chip CH20 and a pad PL20 of the package substrate PB20.

The molding layer Ma20 may be provided on the package substrate PB20 to cover the semiconductor chip CH20 and the bonding wire WR20. The molding layer Ma20 may cover the entire top surface of the package substrate PB20.

The electromagnetic shielding structure ESa20 may cover a top surface of the molding layer Ma20, and cover lateral surfaces of the molding layer Ma20 and the package substrate PB20. The electromagnetic shielding structure ESa20 may include first and second polarizers Paa20 and Pba20.

A semiconductor package structure according to other exemplary embodiments of the present general inventive concept will now be described with reference to FIG. 43.

Figure 43:
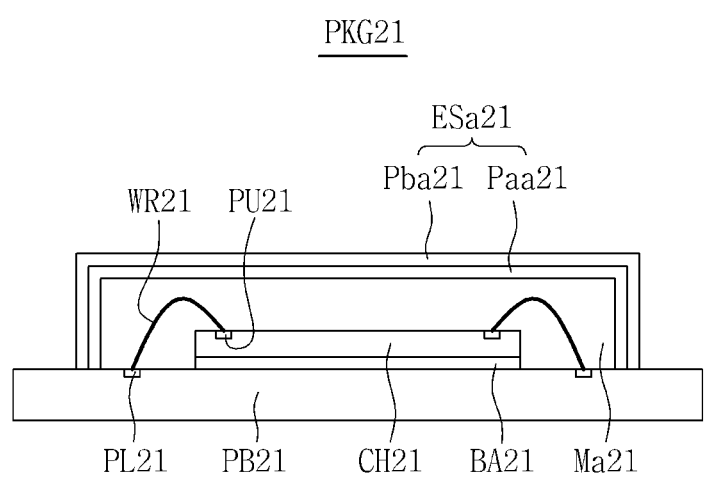

Referring to FIG. 43, a semiconductor package PKG21 including a package substrate PB21, a semiconductor chip CH21, a molding layer Ma21, and an electromagnetic shielding structure ESa21 may be provided. The semiconductor chip CH21 may be disposed on and adhered to the package substrate PB21 by an adhesion member BA21. A bonding wire WR21 may be provided to connect a pad PU21 of the semiconductor chip CH21 and a pad PL21 of the package substrate PB21.

The molding layer Ma21 may be provided on the package substrate PB21 to cover the semiconductor chip CH21 and the bonding wire WR21. The molding layer Ma21 may cover a portion of a top surface of the package substrate PB21.

The electromagnetic shielding structure ESa21 may cover top and lateral surfaces of the molding layer Ma21. The electromagnetic shielding structure ESa21 may include first and second polarizers Paa21 and Pba21.

A semiconductor package structure according to other exemplary embodiments of the present general inventive concept will now be described with reference to FIG. 44.

Figure 44:
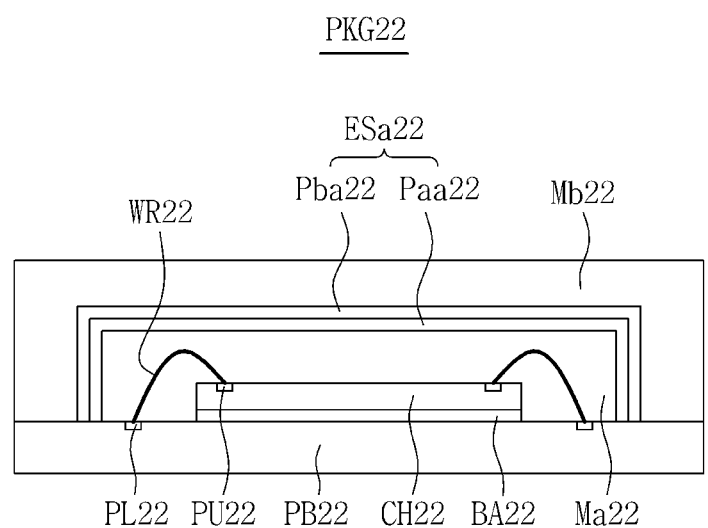

Referring to FIG. 44, a semiconductor package PKG22 including a package substrate PB22, a semiconductor chip CH22, a first molding layer Ma22, an electromagnetic shielding structure ESa22, and a second molding layer Mb22 may be provided. The semiconductor chip CH22 may be disposed on and adhered to the package substrate PB22 by an adhesion member BA22. A bonding wire WR22 may be provided to connect a pad PU22 of the semiconductor chip CH22 and a pad PL22 of the package substrate PB22.

The first molding layer Ma22 may be provided on the package substrate PB22 to cover the semiconductor chip CH22 and the bonding wire WR22. The first molding layer Ma22 may cover a portion of a top surface of the package substrate PB22.

The electromagnetic shielding structure ESa22 may cover top and lateral surfaces of the first molding layer Ma22. The electromagnetic shielding structure ESa22 may include first and second polarizers Paa22 and Pba22.

The second molding layer Mb22 may be provided on the package substrate PB22 to cover the electromagnetic shielding structure ESa22. The electromagnetic shielding structure ESa22 may be provided between the first and second molding layers Ma22 and Mb22.

A semiconductor package structure according to other exemplary embodiments of the present general inventive concept will now be described with reference to FIG. 45.

Figure 45:
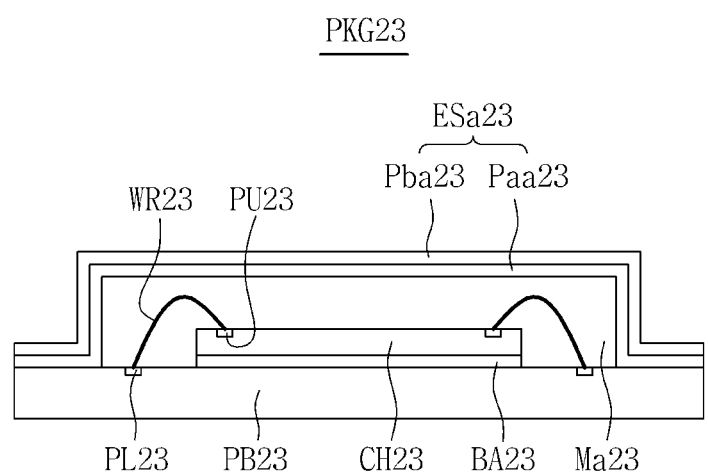

Referring to FIG. 45, a semiconductor package PKG23 including a package substrate PB23, a semiconductor chip CH23, a molding layer Ma23, and an electromagnetic shielding structure ESa23 may be provided. The semiconductor chip CH23 may be disposed on and adhered to the package substrate PB23 by an adhesion member BA23. A bonding wire WR23 may be provided to connect a pad PU23 of the semiconductor chip CH23 and a pad PL23 of the package substrate PB23.

The molding layer Ma23 may be provided on the package substrate PB23 to cover the semiconductor chip CH22 and the bonding wire WR23. The molding layer Ma23 may cover a portion of a top surface of the package substrate PB23.

The electromagnetic shielding structure ESa22 may cover a top surface of the molding layer Ma23, lateral surfaces of the molding layer Ma23, and the top surface of the package substrate PB23. The electromagnetic shielding structure ESa23 may include first and second polarizers Paa23 and Pba23.

A semiconductor package structure according to other exemplary embodiments of the present general inventive concept will now be described with reference to FIG. 46.

Figure 46:
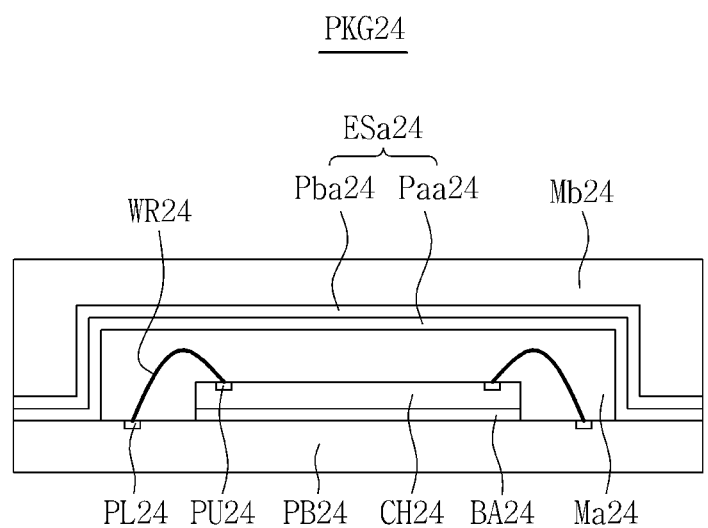

Referring to FIG. 46, a semiconductor package PKG24 including a package substrate PB24, a semiconductor chip CH24, a first molding layer Ma24, an electromagnetic shielding structure ESa24, and a second molding layer Mb24 may be provided. The semiconductor chip CH24 may be disposed on and adhered to the package substrate PB24 by an adhesion member BA24. A bonding wire WR24 may be provided between a pad PU24 of the semiconductor chip CH24 and a pad PL24 of the package substrate PB24.

The first molding layer Ma24 may be provided on the package substrate PB24 to cover the semiconductor chip CH24 and the bonding wire WR24. The molding layer Ma24 may cover a portion of a top surface of the package substrate PB24.

The electromagnetic shielding structure ESa24 may cover top and lateral surfaces of the first molding layer Ma24, and cover a top surface of the package substrate PB24. The electromagnetic shielding structure ESa24 may include first and second polarizers Paa24 and Pba24. A second molding layer Mb24 may be provided on the electromagnetic shielding structure ESa24.

A semiconductor package structure according to other exemplary embodiments of the present general inventive concept will now be described with reference to FIG. 47.

Figure 47:
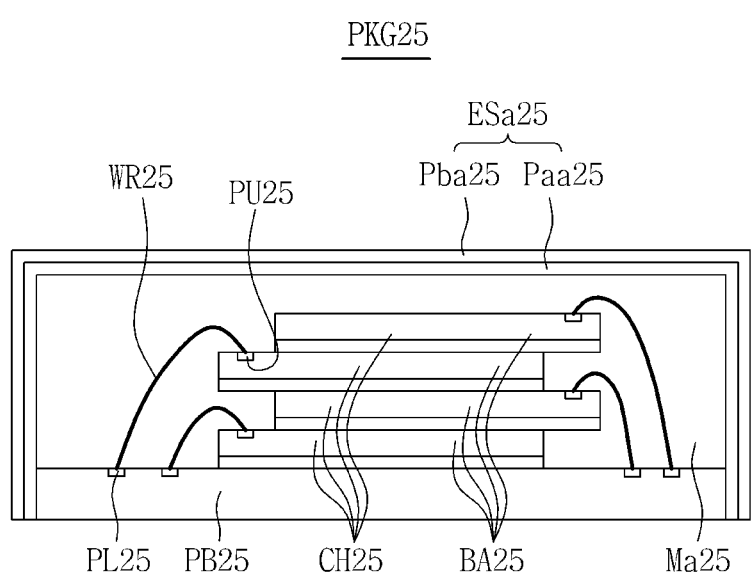

Referring to FIG. 47, a semiconductor package PKG25 including a package substrate PB25, a plurality of semiconductor chips CH25, a molding layer Ma25, and an electromagnetic shielding structure ESa25 may be provided.

The semiconductor chips CH25 may be sequentially stacked on the package substrate PB25. The semiconductor chips CH25 may be adhered to one another by an adhesion member BA25. The plurality of semiconductor chips CH25 may be electrically connected to the package substrate using one or more connecting members. The connecting members may include, but is not limited to, an electrically conductive via, a solder ball, an electrically conductive pad, a bonding wire, an interconnection structure having a plurality of interconnects, and a combination thereof. In at least one exemplary embodiment illustrated in FIG. 47, bonding wires WR25 may be provided to connect pads PU25 of the semiconductor chips CH25 and pads PL25 of the package substrate PB25.

The molding layer Ma25 may be provided on the package substrate PB25 to cover the semiconductor chips CH25 and the bonding wire WR25. The molding layer Ma25 may cover the entire top surface of the package substrate PB25.

The electromagnetic shielding structure ESa25 may cover top and lateral surfaces of the molding layer Ma25, and lateral surfaces of the package substrate PB25. Thus, the electromagnetic shielding structure ESa25 may cover top and lateral surfaces of the plurality of semiconductor chips CH25. The electromagnetic shielding structure ESa25 may include first and second polarizers Paa25 and Pba25.

A semiconductor package structure according to other exemplary embodiments of the present general inventive concept will now be described with reference to FIG. 48.

Figure 48:
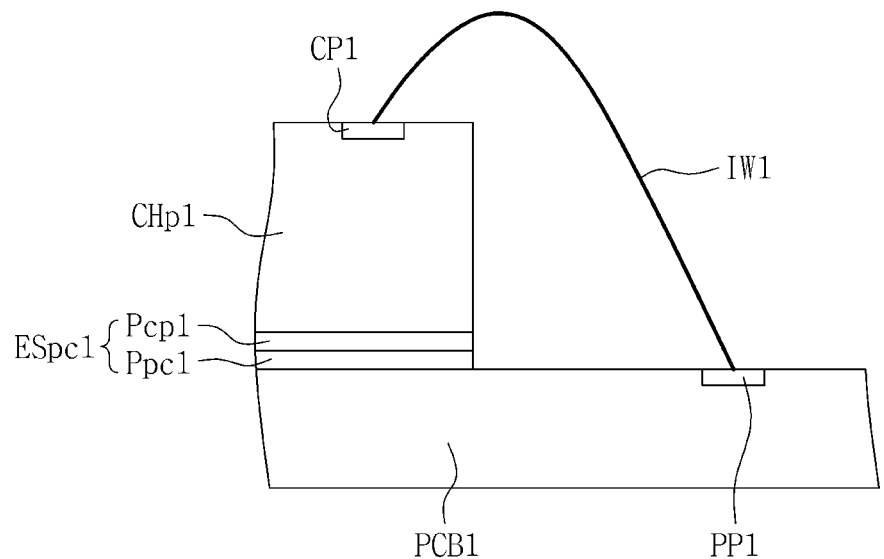

Referring to FIG. 48, a semiconductor package may include a package substrate PCB1, a semiconductor chip CHp1, and an electromagnetic shielding structure ESpc1. A bonding wire IW1 may be provided to connect a pad CP1 of the semiconductor chip CHp1 and a pad PP1 of the package substrate PCB1.

The electromagnetic shielding structure ESpc1 may be provided between the package substrate PCB1 and the semiconductor chip CHp1. The electromagnetic shielding structure ESpc1 may include first and second polarizers Ppc1 and Pcp1 stacked sequentially.

A semiconductor package structure according to other exemplary embodiments of the present general inventive concept will now be described with reference to FIG. 49.

Figure 49:
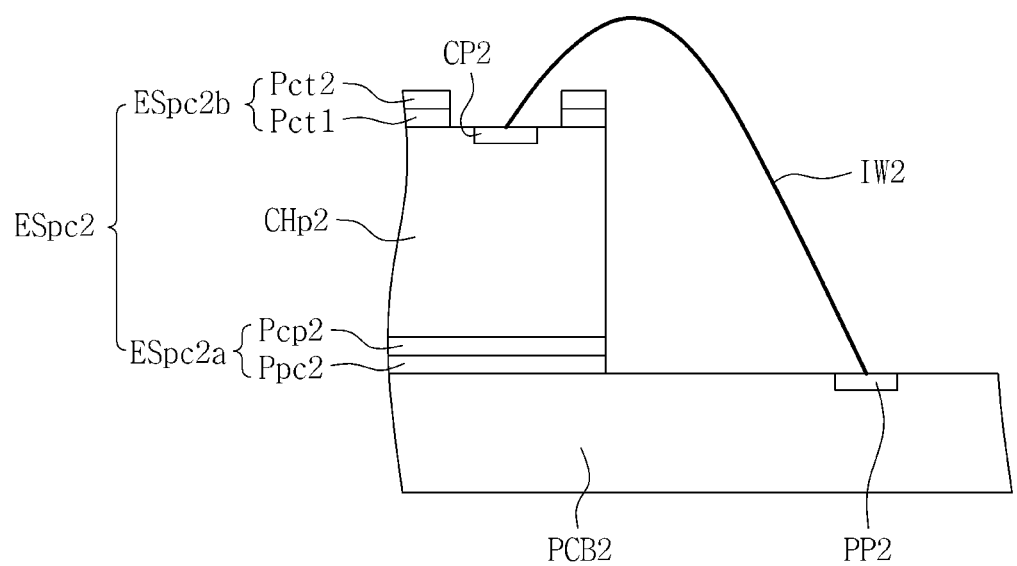

Referring to FIG. 49, a semiconductor package may include a package substrate PCB2, a semiconductor chip CHp2, and an electromagnetic shielding structure ESpc2. A bonding wire IW2 may be provided between a pad CP2 of the semiconductor chip CHp2 and a pad PP2 of the package substrate PCB2.

The electromagnetic shielding structure ESpc2 may include a first electromagnetic shielding structure ESpc2*a* provided between the package substrate PCB2 and the semiconductor chip CHp2, and a second electromagnetic shielding structure ESpc2*b* configured to cover a top surface of the semiconductor chip CHp2 except the pad CP2 of the semiconductor chip CHp2. Thus, top and bottom surfaces of the semiconductor chip CHp2 may be covered with the electromagnetic shielding structure ESpc2. The first electromagnetic shielding structure ESpc2*a* may include first and second polarizers Ppc2 and Pcp2 stacked sequentially, while the second electromagnetic shielding structure ESpc2*b* may include first and second polarizers Pct1 and Pct2 stacked sequentially.

A semiconductor package substrate according to other exemplary embodiments of the present general inventive concept will now be described with reference to FIG. 50.

Figure 50:
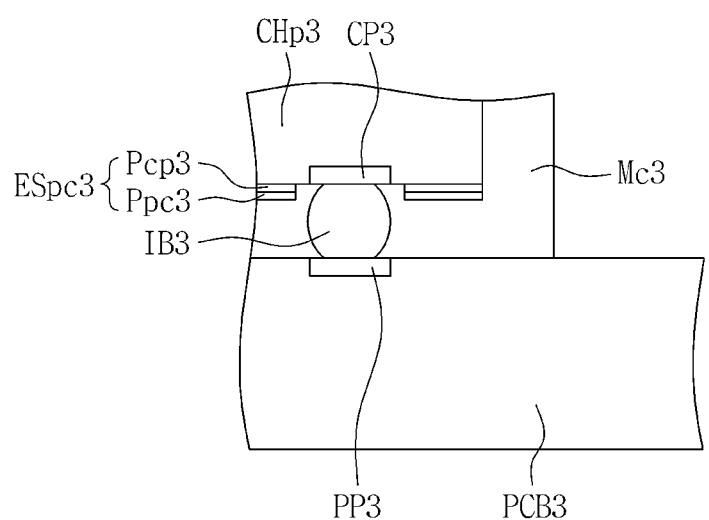

Referring to FIG. 50, a semiconductor package may include a package substrate PCB3, a semiconductor chip CHp3, a molding layer Mc3, and an electromagnetic shielding structure ESpc3. A flip-chip connector IB3 may be provided to electrically connect a pad CP3 of the semiconductor chip CHp3 and a pad PP3 of the package substrate PCB3. The molding layer Mc3 may fill a space between the package substrate PCB3 and the semiconductor chip CHp3, and cover sidewalls of the semiconductor chip CHp3.

The electromagnetic shielding structure ESpc3 may include first and second polarizers Ppc3 and Pcp3 stacked sequentially. The electromagnetic shielding structure ESpc3 may be provided on a surface of the semiconductor chip CHp3 adjacent to the package substrate PCB3. Also, the electromagnetic shielding structure ESpc3 may cover the surface of the semiconductor chip CH3 to expose the pad CP3 of the semiconductor chip CHp3.

A semiconductor package structure according to other exemplary embodiments of the present general inventive concept will now be described with reference to FIG. 51.

Figure 51:
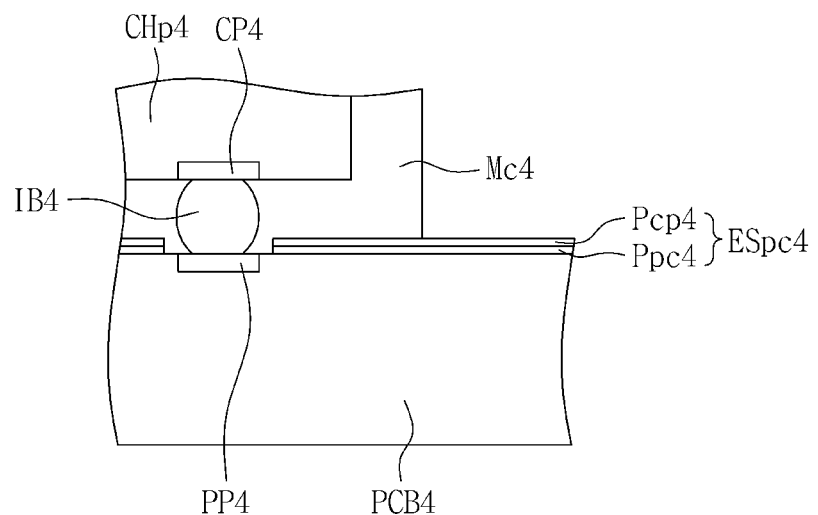

Referring to FIG. 51, a semiconductor package may include a package substrate PCB4, a semiconductor chip CHp4, a molding layer Mc4, and an electromagnetic shielding structure ESpc4. A flip-chip connector IB4 may be provided to electrically connect a pad CP4 of the semiconductor chip CHp4 and a pad PP4 of the package substrate PCB4. The molding layer Mc4 may fill a space between the package substrate PCB4 and the semiconductor chip CHp4 to cover a top surface of the semiconductor chip CHp4.

The electromagnetic shielding structure ESpc4 may include first and second polarizers Ppc4 and Pcp4 stacked sequentially.

The electromagnetic shielding structure ESpc4 may be provided on a surface of the package substrate PCB4 adjacent to the semiconductor chip CHp4. Also, the electromagnetic shielding structure ESpc4 may cover a surface of the package substrate PCB4 to expose the pad PP4 of the package substrate PCB4.

A semiconductor package structure according to other exemplary embodiments of the present general inventive concept will now be described with reference to FIG. 52.

Figure 52:
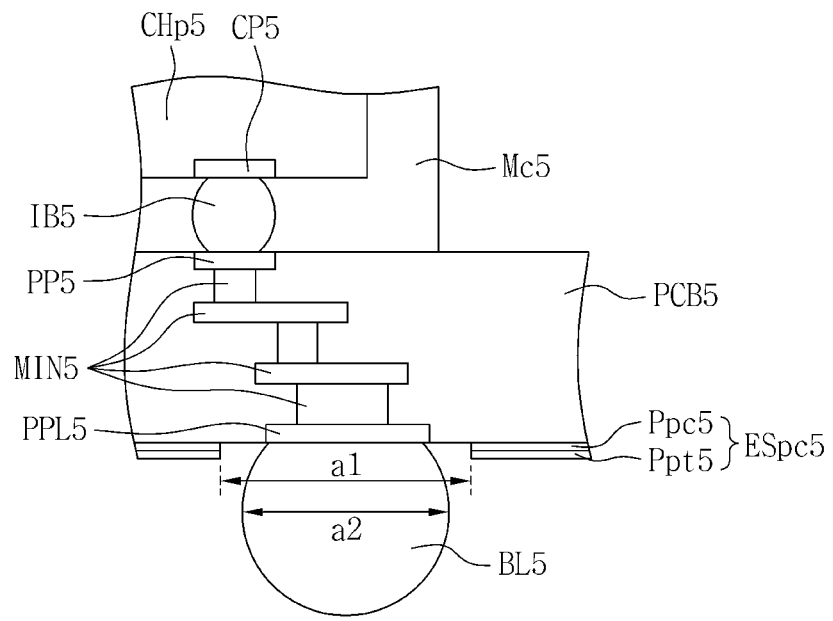

Referring to FIG. 52, a semiconductor package may include a package substrate PCB5, a semiconductor chip CHp5, a molding layer Mc5, and an electromagnetic shielding structure ESpc5. A flip-chip connector IB5 may be provided to electrically connect a pad CP5 of the semiconductor chip CHp5 and a first pad PP5 of the package substrate PCB5. The flip-chip connector IB5 may include, for example, an electrically conductive solder element. The molding layer Mc5 may fill a space between the package substrate PCB5 and the semiconductor chip CHp5, and cover sidewalls of the semiconductor chip CHp5.

The package substrate PCB5 may be a PCB. The package substrate PCB5 may have a first surface and a second surface disposed opposite each other. The first pad PP5 connected to the flip-chip connector IB5 may be provided on the first surface of the package substrate PCB5, while a second pad PPL5 may be provided on the second surface thereof. A ball structure BL5 may be provided on the second pad PPL5 of the package substrate PCB5. The first and second pads PP5 and PPL5 may be electrically connected by an interconnection structure MIN5 disposed within the package substrate PCB5. The interconnection structure MIN5 may include a plurality of interconnectors. The plurality of interconnectors may be arranged in various manners to connect the first pad PP5 to the second pad PPL5, thereby connected in the flip-chip connector IB5 to the ball structure BL5. For example, at least one exemplary embodiment illustrated in FIG. 52 includes an interconnect structure MIN5 including a plurality of interconnects arranged in a stair-like manner to connect the first pad PP5 to the second pad PPL5. Accordingly, an electrically conductive path may be provided between the flip-chip connector IB5 to the ball structure BL5.

The electromagnetic shielding structure ESpc5 may be provided on the second surface on which the second pad PPL5 is formed, out of the opposite first and second surfaces of the package substrate PCB5. The electromagnetic shielding structure ESpc5 may include first and second polarizers Ppt5 and Ppc5 stacked sequentially.

The electromagnetic shielding structure ESpc5 may have an opening. A width a1 of the opening of the electromagnetic shielding structure ESpc5 may be greater than a width a2 of the ball structure BL5. Thus, the electromagnetic shielding structure ESpc5 may be spaced apart from the ball structure BL5 and the second pad PPL5. Thus, the electromagnetic shielding structure ESpc5 may be an insulating or conductive electromagnetic shielding structure.

Figure 53:
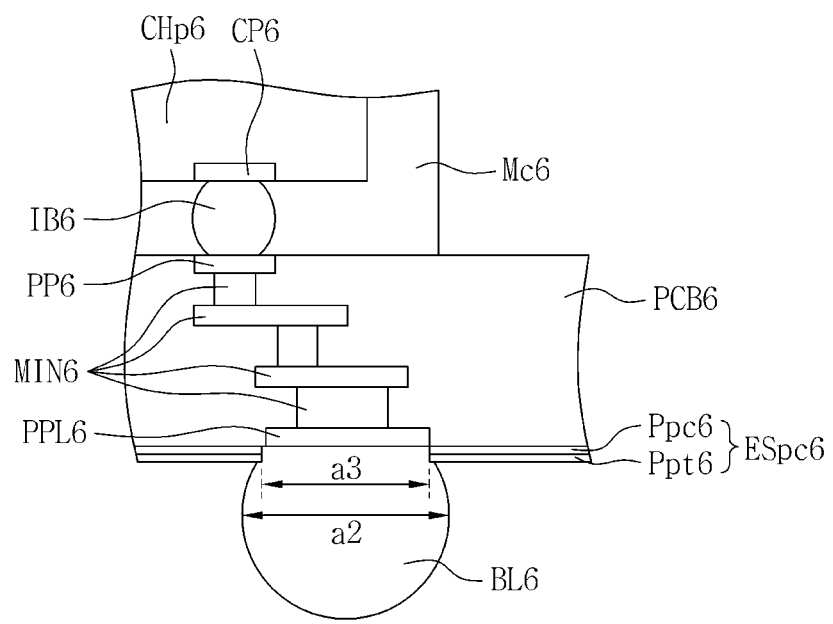

In another case, as illustrated in FIG. 53, an electromagnetic shielding structure ESpc6 may be provided to contact a ball structure BL6. In this case, the electromagnetic shielding structure ESpc6 may include first and second polarizers Ppc6 and Ppt6 stacked sequentially. In at least one exemplary embodiment illustrated in FIG. 3, the stacked first and second polarizers may be an insulating electromagnetic shielding structure. Since a package substrate PCB6, a semiconductor chip CHp6, a molding layer Mc6, the electromagnetic shielding structure ESpc6, a pad CP6, a connector IB6, and an interconnection structure MIN6 are substantially the same as described with reference to FIG. 52, a detailed description thereof will be omitted.

A semiconductor package structure according to other exemplary embodiments of the present general inventive concept will now be described with reference to FIG. 54.

Figure 54:
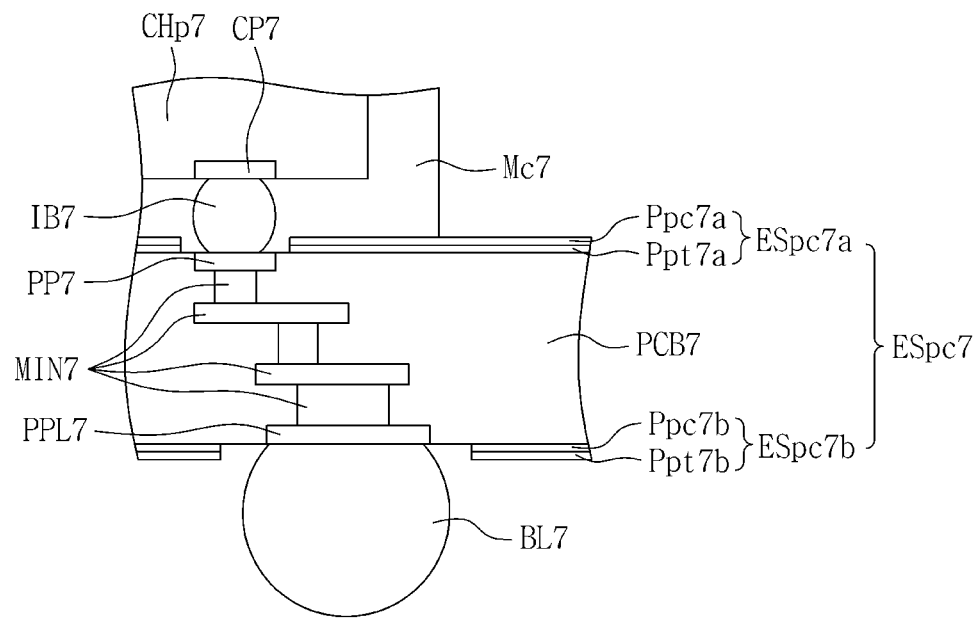

Referring to FIG. 54, as in FIG. 52, a semiconductor package may include a package substrate PCB7, a semiconductor chip CHp7, a molding layer Mc7, an electromagnetic shielding structure ESpc7, pads CP7, PP7, and PPL7, a connector IB7, an interconnection structure MIN7, and a ball structure BL7.

The semiconductor package may include an electromagnetic shielding structure ESPc7 configured to cover two opposite surfaces of the package substrate PCB7. The electromagnetic shielding structure ESpc7 may include first and second electromagnetic shielding structures ESpc7a and ESpc7b.

The first electromagnetic shielding structure ESpc7a may include first and second polarizers Ppt7a and Ppc7a stacked sequentially, while the second electromagnetic shielding structure ESpc7b may include third and fourth polarizers Ppt7b and Ppc7b stacked sequentially.

A semiconductor package structure according to other exemplary embodiments of the present general inventive concept will now be described with reference to FIG. 55.

Figure 55:
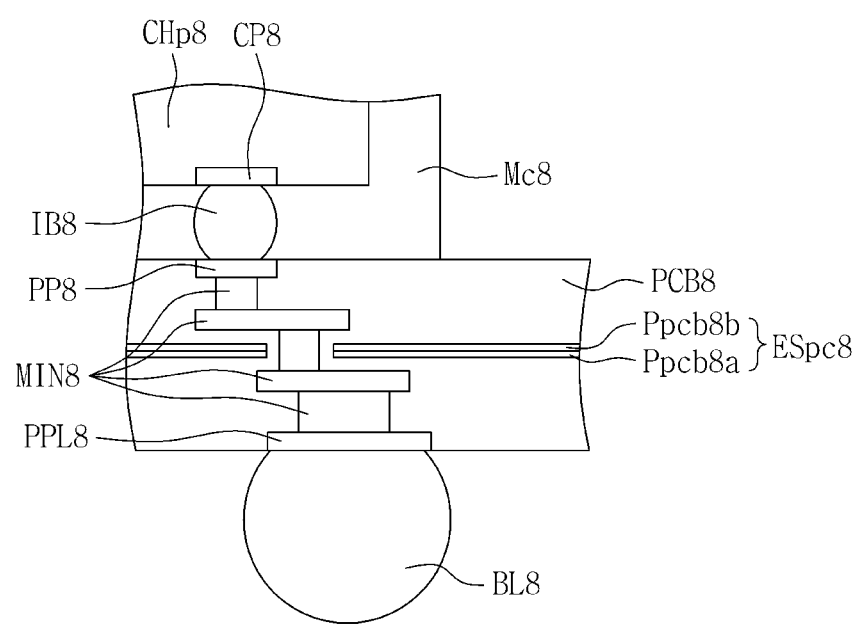

Referring to FIG. 55, as described with reference to FIG. 52, a semiconductor package may include a package substrate PCB8, a semiconductor chip CHp8, a molding layer Mc8, an electromagnetic shielding structure ESpc8, pads CP7, PP7, and PPL8, a connector IB8, an interconnection structure MIN8, and a ball structure BL8.

The semiconductor package may include an electromagnetic shielding structure ESPc8 provided within the package substrate PCB8. The electromagnetic shielding structure ESpc8 may include first and second polarizers Ppcb8a and Ppcb8b stacked sequentially.

A semiconductor package structure according to other exemplary embodiments of the present general inventive concept will now be described with reference to FIG. 56.

Figure 56:
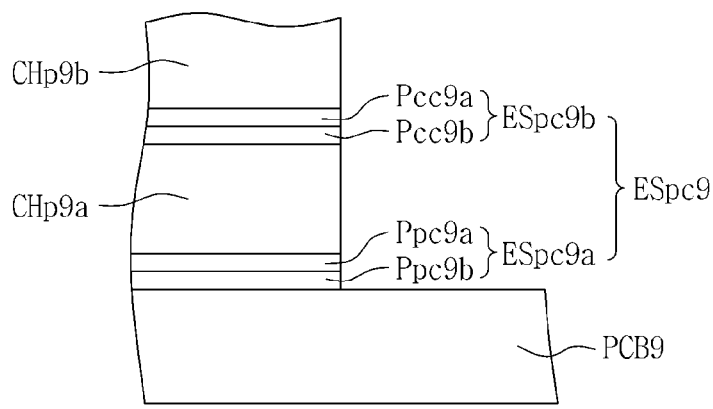

Referring to FIG. 56, a semiconductor package may include a package substrate PCB9, first and second semiconductor chips CHp9a and CHp9b, and an electromagnetic shielding structure ESpc9. The first and second semiconductor chips CHp9a and CHp9b may be sequentially stacked on the package substrate PCB9.

The electromagnetic shielding structure ESpc9 may include a first electromagnetic shielding structure ESpc9a and a second electromagnetic shielding structure ESpc9b.

The first electromagnetic shielding structure ESpc9a may include first and second polarizers Ppc9b and Ppc9a stacked sequentially, while the second electromagnetic shielding structure ESpc9b may include first and second polarizers Ppcc9b and Ppcc9a stacked sequentially. The second electromagnetic shielding structure ESpc9b may be interposed between the first and second semiconductor chips CHp9a and CHp9b. The first electromagnetic shielding structure ESpc9a may be interposed between the first semiconductor chip CHp9a and the package substrate PCB9.

Accordingly, top and bottom surfaces of the first semiconductor chip CHp9a may be covered with the first and second electromagnetic shielding structures ESpc9a and ESpc9b and protected from external electromagnetic waves.

A semiconductor package structure according to other exemplary embodiments of the present general inventive concept will now be described with reference to FIG. 57.

Figure 57:
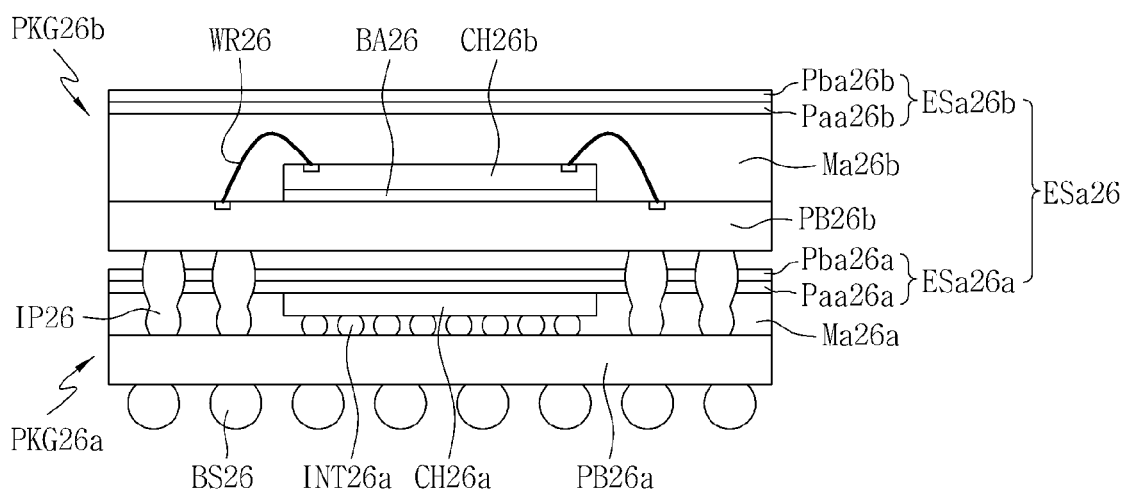

Referring to FIG. 57, a semiconductor package PKG26 may include a lower semiconductor package PKG26a and an upper semiconductor package PKG26b. In at least one exemplary embodiment illustrated in FIG. 57, a semiconductor chip of a lower semiconductor package PKG26a may be electrically connected to a respective package substrate using a first connecting member, and the upper semiconductor package PKG26b may be electrically connected to a respective package substrate using a second connecting member different from the first connecting member. Accordingly, each semiconductor package may include a respective electromagnetic shielding member, for example any of the above-mentioned exemplary electromagnetic shielding members (ES', ES_1, etc.), as described further below.

More specifically, the lower semiconductor package PKG26a may include a lower package substrate PB26a, a lower semiconductor chip CH26a, a lower molding layer Ma26a, a flip-chip connection structure INT26a, and a lower electromagnetic shielding structure ESa26a. Since the lower semiconductor package PKG26a is substantially the same as the package described with reference to FIG. 21, a detailed description thereof will be omitted. Meanwhile, a ball structure BS26 may be provided under the lower package substrate PB26a.

The upper semiconductor package PKG26b may include an upper package substrate PB26b, an upper semiconductor chip CH26b, an adhesion member BA26, a bonding wire WR26, an upper molding layer Ma26b, and an upper electromagnetic shielding structure ESa26b. Since the upper semiconductor package PKG26b is substantially the same as the package described with reference to FIG. 41, a detailed description thereof will be omitted.

One or more connection structure IP26 may be provided to electrically connect the upper and lower semiconductor packages PKG26b and PKG26a. The connection structure IP26 may penetrate the lower electromagnetic shielding structure ESa26a and the lower molding layer Ma26a, and electrically connect the lower and upper package substrates PB26a and PB26b.

Accordingly, the semiconductor package PKG26 may include the lower electromagnetic shielding structure ESa26a provided between the lower and upper semiconductor packages PKG26a and PKG26b, and the upper electromagnetic shielding structure ESa26b provided on the upper semiconductor package PKG26b. The lower electromagnetic shielding structure ESa26a may include first and second polarizers Paa26a and Pba26a stacked sequentially, while the upper electromagnetic shielding structure ESa26b may include first and second polarizers Paa26b and Pba26b stacked sequentially.

A semiconductor package structure according to other exemplary embodiments of the present general inventive concept will now be described with reference to FIG. 58.

Figure 58:
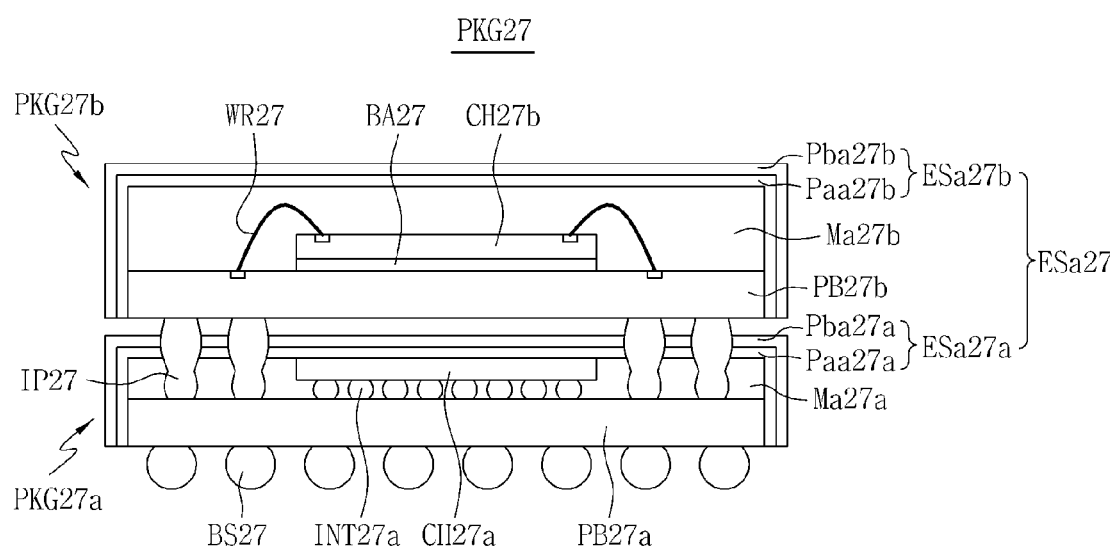

Referring to FIG. 58, a semiconductor package PKG27 may include a lower semiconductor package PKG27*a*, a lower electromagnetic shielding structure ESa27*a* configured to cover a top surface and sidewalls of the lower semiconductor package PKG27*a*, an upper semiconductor package PKG27*b*, and an upper electromagnetic shielding structure ESa27*b* configured to cover a top surface and sidewalls of the upper semiconductor package PKG27*b*.

The lower semiconductor package PKG27*a* may include a lower package substrate PB27*a* and a lower semiconductor chip CH27*a* disposed on the lower package substrate PB27*a*. The lower semiconductor chip CH27*a* may be electrically connected to the lower package substrate PB27*a* by a flip-chip connector INT27*a*. A lower molding layer Ma27*a* may be provided on the lower package substrate PB27*a* to cover lateral surfaces of the lower semiconductor chip CH27*a*. The lower electromagnetic shielding structure ESa27*a* may cover top surfaces of the lower molding layer Ma27*a* and the lower semiconductor chip CHp27*a*, and cover lateral surfaces of the lower molding layer Ma27*a* and the lower package substrate PB27*a*. The lower electromagnetic shielding structure ESa27*a* may include first and second polarizers Paa27*a* and Pba27*a* stacked sequentially. Meanwhile, a ball structure BS27 may be provided under the lower package substrate PB27*a*.

The upper semiconductor package PKG27*b* may include an upper package substrate PB27*b*, an upper semiconductor chip CH27*b* electrically connected to the upper package substrate PB27*b* by a bonding wire WR27, an adhesion member BA27 interposed between the upper package substrate PB27*b* and the upper semiconductor chip CH27*b*, and an upper molding layer Ma27*b* provided on the upper package substrate PB27*b* to cover the upper semiconductor chip CH27*b* and the bonding wire WR27. The upper electromagnetic shielding structure ESa27*b* may cover top and lateral surfaces of the upper molding layer Ma27*b*, and lateral surfaces of the upper package substrate PB27*b*. The upper electromagnetic shielding structure ESa27*b* may include first and second polarizers Paa27*b* and Pba27*b* stacked sequentially.

A connection structure IP27 may be provided to electrically connect the upper and lower semiconductor packages PKG27*b* and PKG27*a*. The connection structure IP27 may penetrate the lower electromagnetic shielding structure ESa27*a* and the lower molding layer Ma27*a* and electrically connect the lower and upper package substrates PB27*a* and PB27*b*.

A semiconductor package structure according to other exemplary embodiments of the present general inventive concept will now be described with reference to FIG. 59.

Figure 59:
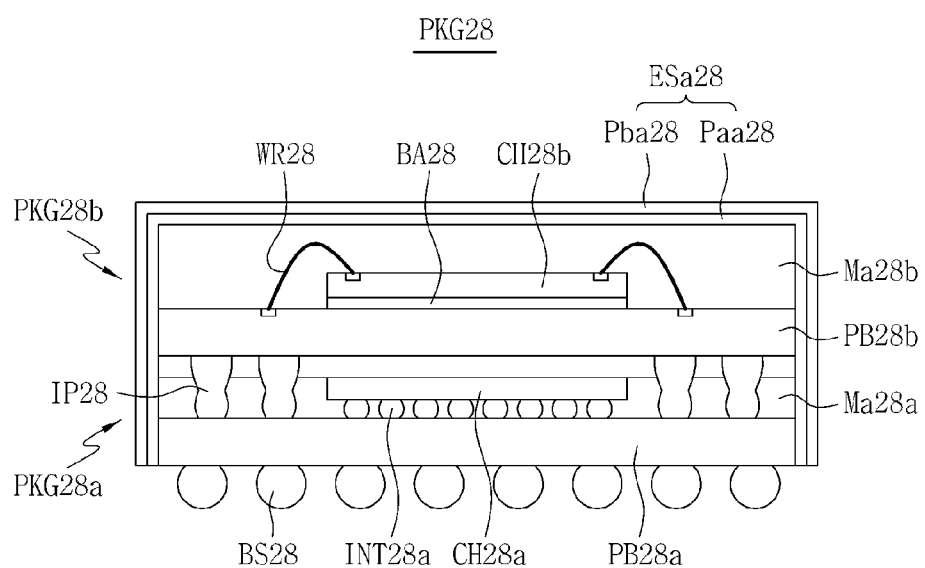

Referring to FIG. 59, a semiconductor package PKG28 may include a lower semiconductor package PKG28*a* and an upper semiconductor package PKG28*b* stacked sequentially. Also, the semiconductor package PKG28 may include an electromagnetic shielding structure ESa28 configured to cover top and lateral surfaces of the upper semiconductor package PKG28*b*, and lateral surfaces of the lower semiconductor package PKG28*a*. The electromagnetic shielding structure ESa28 may include first and second polarizers Paa28 and Pba28.

The lower semiconductor package PKG28*a* may include a lower package substrate PB28*a* and a lower semiconductor chip CH28*a* disposed on the lower package substrate PB28*a*. The lower semiconductor chip CH28*a* may be electrically connected to the lower package substrate PB28*a* by a flip-chip connector INT28. A lower molding layer Ma28*a* may be provided on the lower package substrate PB28*a* to cover lateral surfaces of the lower semiconductor chip CH28*a*. A ball structure BS28 may be provided under the lower package substrate PB28*a*.

The upper semiconductor package PKG28*b* may include an upper package substrate PB28*b*, an upper semiconductor chip CH28*b* electrically connected to the upper package substrate PB28*b* by a bonding wire WR28, an adhesion member BA28 interposed between the upper package substrate PB28*b* and the upper semiconductor chip CH28*b*, and an upper molding layer (Ma28*b*) provided on the upper package substrate PB28*b* to cover the upper semiconductor chip CH28*b* and the bonding wire WR28.

A connection structure IP28 may be provided to electrically connect the upper and lower semiconductor packages PKG28*b* and PKG28*a*. The connection structure IP28 may penetrate the lower molding layer Ma28*a* and electrically connect the lower and upper package substrates PB28*a* and PB28*b*.

A semiconductor package structure according to other exemplary embodiments of the present general inventive concept will now be described with reference to FIG. 60.

Figure 60:
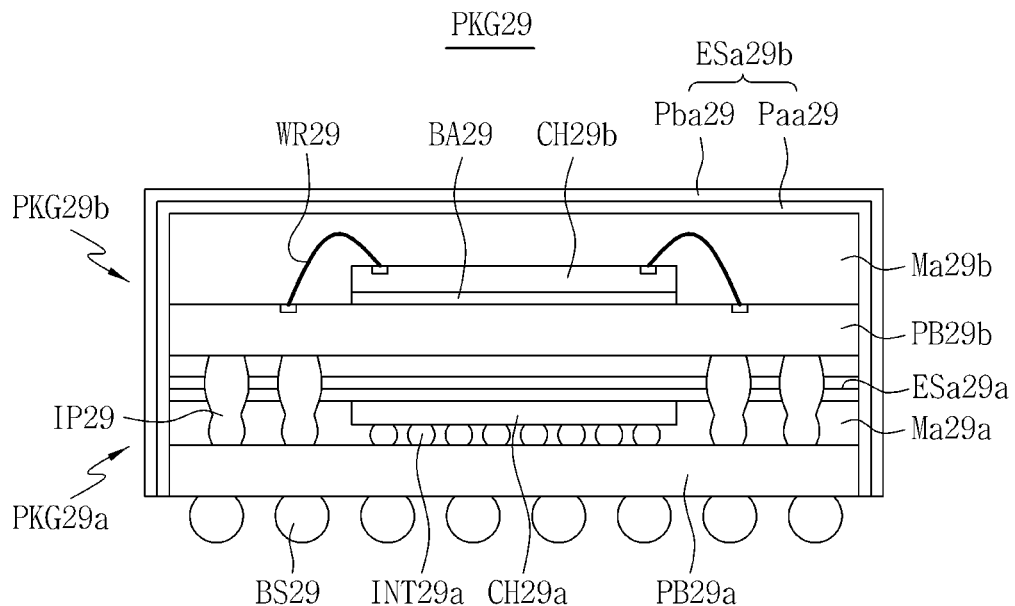

Referring to FIG. 60, a semiconductor package PKG29 may include a lower semiconductor package PKG29*a* and an upper semiconductor package PKG29*b* stacked sequentially. Also, the semiconductor package PKG29 may include an upper electromagnetic shielding structure ESa29*b* configured to cover a top surface of the upper semiconductor package PKG29*b*, and lateral surfaces of the upper and lower semiconductor packages PKG29*b* and PKG29*a*. The upper electromagnetic shielding structure ESa29*b* may include a first polarizer Paa29 and a second polarizer Pba29.

The lower semiconductor package PKG29*a* may include a lower package substrate PB29*a* and a lower semiconductor chip CH29*a* disposed on the lower package substrate PB29*a*. The lower semiconductor chip CH29*a* may be electrically connected to the lower package substrate PB29*a* by a flip-chip connector INT29*a*. A lower molding layer Ma29*a* may be provided on the lower package substrate PB29*a* to cover lateral surfaces of the lower semiconductor chip PB29*a*. A lower electromagnetic shielding structure ESa29*a* may be provided on a top surface of the lower semiconductor package PKG29*a*. A ball structure BS29 may be provided under the lower package substrate PB29*a*.

As illustrated in FIG. 59, the upper semiconductor package PKG29*b* may include an upper package substrate PB29*b*, a bonding wire WR29, an upper semiconductor chip CH29*b*, an adhesion member BA29, and an upper molding layer Ma29*b*.

A connection structure IP29 may be provided to electrically connect the upper and lower semiconductor packages PKG29*b* and PKG29*a*. The connection structure IP29 may penetrate the lower electromagnetic shielding structure ESa29*a* and the lower molding layer Ma29*a*, and electrically connect the lower and upper package substrates PB29*a* and PB29*b*.

A semiconductor package structure according to other exemplary embodiments of the present general inventive concept will now be described with reference to FIG. 61.

Figure 61:
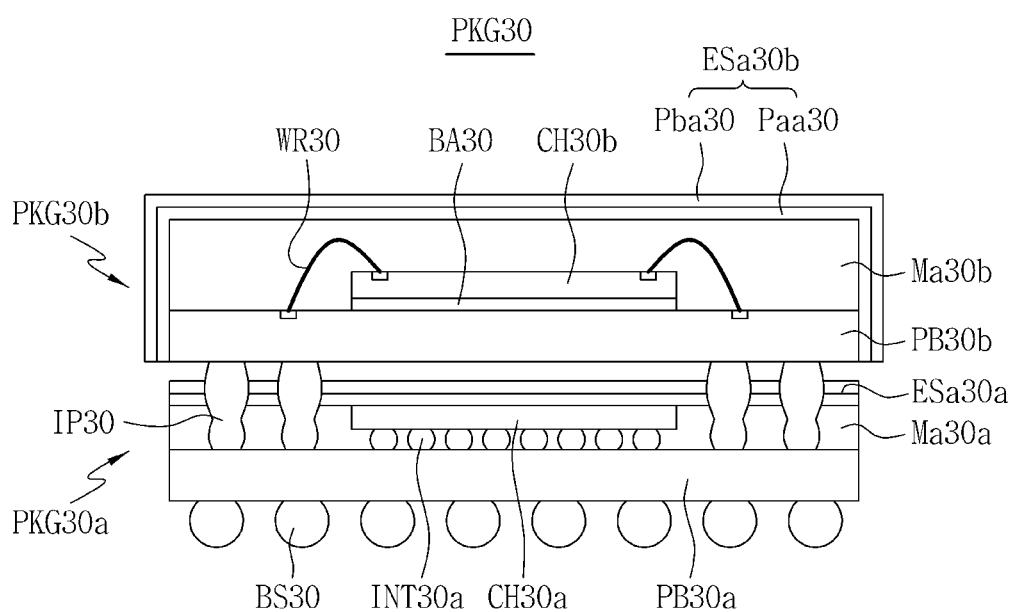

Referring to FIG. 61, a semiconductor package PKG30 may include a lower semiconductor package PKG30*a* and an upper semiconductor package PKG30*b* stacked sequentially. As in FIG. 60, the lower semiconductor package PKG30*a* may include a lower package substrate PB30*a*, a lower semiconductor chip CH30*a*, a connector INT30*a*, a lower molding layer Ma30a, and a lower electromagnetic shielding structure ESa30a. A ball structure BS30 may be provided under the lower package substrate PB30a.

As in FIG. 60, the upper semiconductor package PKG30b may include an upper package substrate PB30b, a bonding wire WR30, an upper semiconductor chip CH30b, an adhesion member BA30, and an upper molding layer Ma30b.

The upper semiconductor package PKG30b may include an upper electromagnetic shielding structure ESa30b configured to cover top and lateral surfaces of the upper molding layer Ma30b, and lateral surfaces of the upper package substrate PB30b. The upper electromagnetic shielding structure ESa30b may include a first polarizer Paa30 and a second polarizer Pba30 stacked sequentially.

A semiconductor package structure according to other exemplary embodiments of the present general inventive concept will now be described with reference to FIG. 62.

Figure 62:
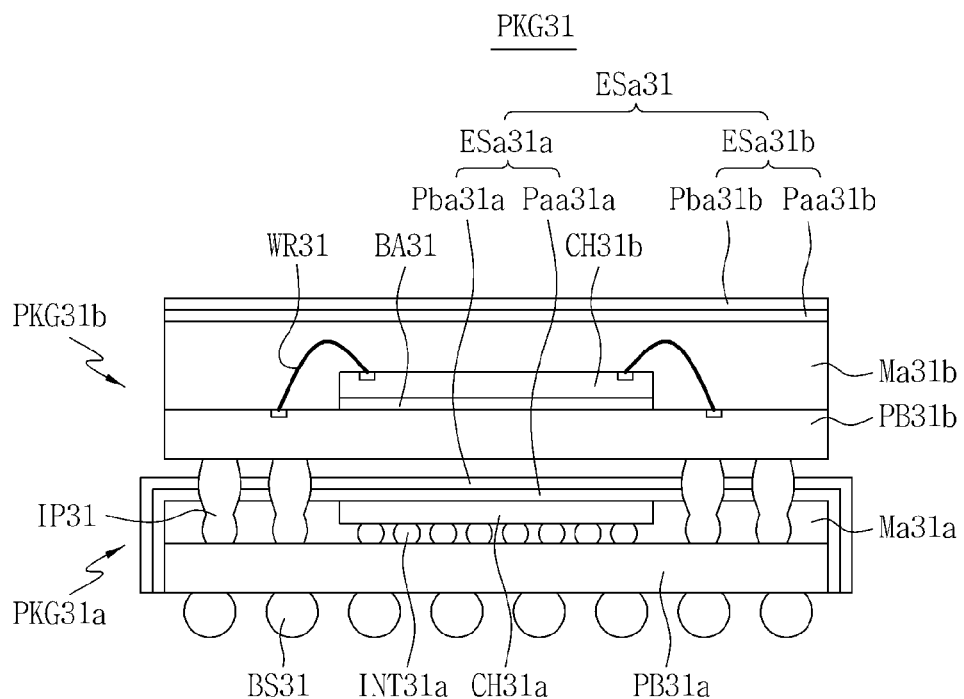

Referring to FIG. 62, a semiconductor package PKG31 may include a lower semiconductor package PKG31a, an upper semiconductor package PKG31b, and an electromagnetic shielding structure ESa31 stacked sequentially. The electromagnetic shielding structure ESa31 may include a lower electromagnetic shielding structure ESa31a configured to cover top and lateral surfaces of the lower semiconductor package PKG31a, and an upper electromagnetic shielding structure ESa31b configured to cover a top surface of the upper semiconductor package PKG31b. The lower electromagnetic shielding structure ESa31a may include first and second polarizers Paa31a and Pba31a stacked sequentially. The upper electromagnetic shielding structure ESa31b may include third and fourth polarizers Paa31b and Pba31b stacked sequentially.

As in FIG. 60, the lower semiconductor package PKG31a may include a lower package substrate PB31a, a lower semiconductor chip CH31a, a connector INT31a, and a lower molding layer Ma31a. A ball structure BS31 may be provided under the lower package substrate PB31a.

As in FIG. 60, the upper semiconductor package PKG31b may include an upper package substrate PB31b, a bonding wire WR31, an upper semiconductor chip CH31b, an adhesion member BA31, and an upper molding layer Ma31b.

A semiconductor package structure according to other exemplary embodiments of the present general inventive concept will now be described with reference to FIG. 63.

Figure 63:
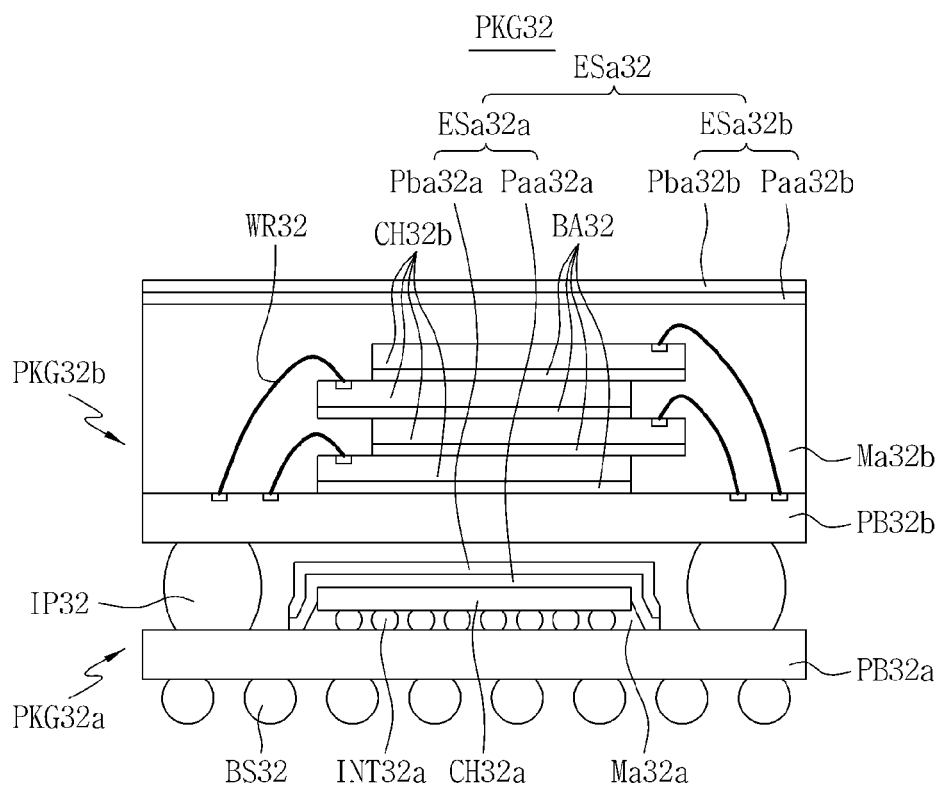

Referring to FIG. 63, a semiconductor package PKG32 may include a lower semiconductor package PKG32a and an upper semiconductor package PKG32b stacked sequentially. Also, the semiconductor package PKG32 may include a first electromagnetic shielding structure ESa32a configured to cover a portion of the lower semiconductor package PKG32a, and a second electromagnetic shielding structure ESa32b configured to cover a top surface of the upper semiconductor package PKG32b. The first and second electromagnetic shielding structures ESa32a and ESa32b may constitute an electromagnetic shielding structure ESa32.

The lower semiconductor package PKG31a may include a lower package substrate PB32 and a lower semiconductor chip CH32a. An under-fill member Ma32b may be provided between the lower package substrate PB32a and the lower semiconductor chip CH32a. The under-fill member Ma32b may partially or wholly cover lateral surfaces of the lower semiconductor chip CH32a. The lower semiconductor chip CH32a may be electrically connected to the lower package substrate PB32a by a flip-chip connector INT32a. A ball structure BS32 may be provided under the lower package substrate PB32a.

The first electromagnetic shielding structure ESa32a may be provided on top and lateral surfaces of the lower semiconductor chip CH32a. The first electromagnetic shielding structure ESa32a may include first and second polarizers Paa32a and Pba32a stacked sequentially.

The upper semiconductor package PKG32 may include an upper package substrate PB32b, a plurality of semiconductor chips CH32b, and a molding layer Ma32b. The upper semiconductor chips CH32b may be sequentially stacked on the upper package substrate PB32b. The upper semiconductor chips CH32b may be sequentially stacked on the upper package substrate PB32b. The upper semiconductor chips CH32b may be adhered to one another by an adhesion member BA32. Bonding wires WR32 may be provided to electrically connect the upper semiconductor chips CH32b and the upper package substrate PB32b. The upper molding layer Ma32b may be provided on the upper package substrate PB32b to cover the upper semiconductor chips CH32b and the bonding wire WR32. The second electromagnetic shielding structure ESa32b may cover a top surface of the upper molding layer Ma32b. A connection structure IP32 may be provided to electrically connect the upper and lower semiconductor packages PKG32b and PKG32a.

A semiconductor package structure according to other exemplary embodiments of the present general inventive concept will now be described with reference to FIG. 64.

Figure 64:
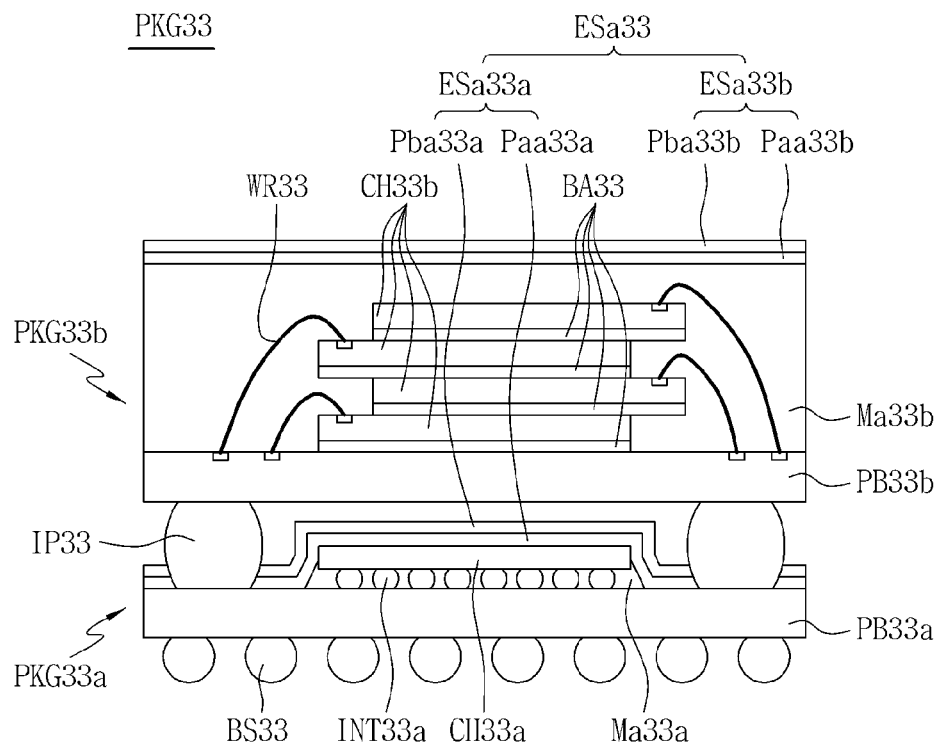

Referring to FIG. 64, a semiconductor package PKG33 may include a lower semiconductor package PKG33a and an upper semiconductor package PKG33b. Also, the semiconductor package PKG33 may include a first electromagnetic shielding structure ESa33a configured to cover a top surface of the lower semiconductor package PKG33a, and a second electromagnetic shielding structure ESa33b configured to cover a top surface of the upper semiconductor package PKG33b. The first electromagnetic shielding structure ESa33a may include first and second polarizers Paa33a and Pba33a stacked sequentially, while the second electromagnetic shielding structure ESa33b may include third and fourth polarizers Paa33b and Pba33b stacked sequentially.

As in FIG. 63, the lower semiconductor package PKG33a may include a lower package substrate PB33a, a lower semiconductor chip CH33a, an under-fill member Ma33a, and a flip-chip connector INT33a.

The upper semiconductor package PKG33b may include an upper package substrate PB33b, a plurality of semiconductor chips CH33b, a molding layer Ma33b an adhesion member BA33, and a bonding wire WR33. A connection structure IP33 may be provided to electrically connect the upper and lower semiconductor packages PKG33b and PKG33a. A ball structure BS33 may be provided under the lower package substrate PB33a.

A semiconductor package structure according to other exemplary embodiments of the present general inventive concept will now be described with reference to FIG. 65.

Figure 65:
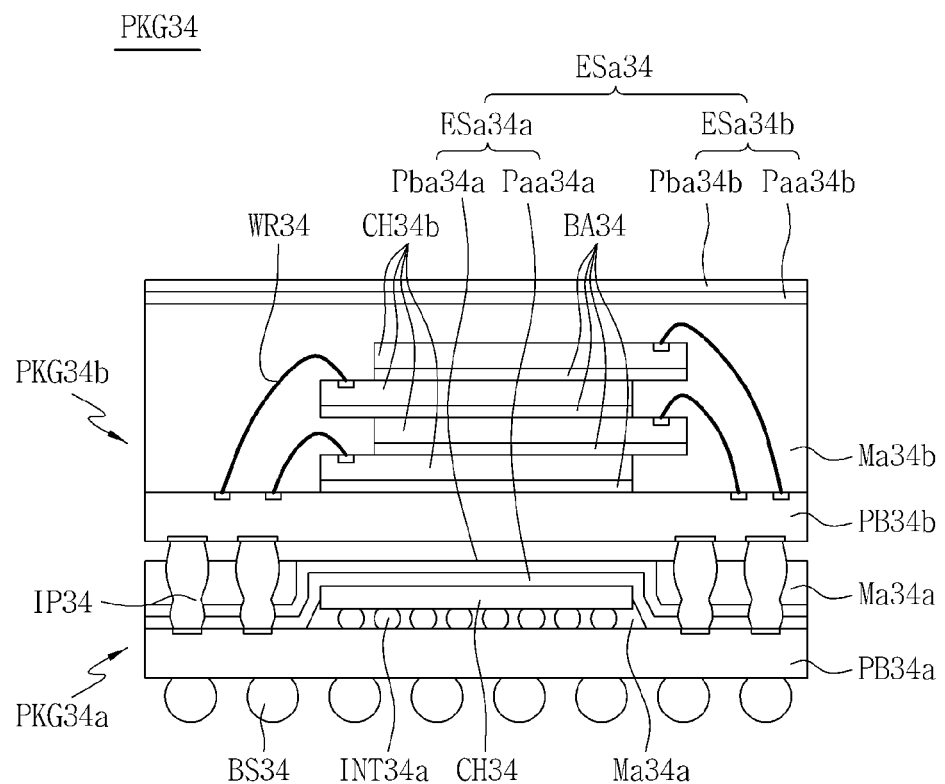

Referring to FIG. 65, a semiconductor package PKG34 may include a lower semiconductor package PKG34a and an upper semiconductor package PKG34b stacked sequentially. Also, the semiconductor package PKG34 may include a first electromagnetic shielding structure ESa34a provided within the lower semiconductor package PKG34a, and a second electromagnetic shielding structure ESa34b configured to cover a top surface of the upper semiconductor package PKG34b. The first electromagnetic shielding structure ESa34a may include first and second polarizers Paa34a and Pba34a stacked sequentially, while the second electromagnetic shielding structure ESa34b may include first and second polarizers Paa34b and Pba34b stacked sequentially.

The lower semiconductor package PKG34a may include a lower package substrate PB34a and a lower semiconductor chip CH34a. An under-fill member Ma34a may be provided between the lower package substrate PB34a and the lower semiconductor chip CH34a. The lower semiconductor chip CH34a may be electrically connected to the lower package substrate PB34a by a flip-chip connector INT34a. The first electromagnetic shielding structure ESa34a may cover the lower semiconductor chip CH34a. Furthermore, the lower semiconductor package PKG34a may include a lower molding layer Ma34a provided on the first electromagnetic shielding structure ESa34a.

As in FIG. 63, the upper semiconductor package PKG34b may include an upper package substrate PB34b, a plurality of semiconductor chips CH34b, bonding wires WR34, and an upper molding layer Ma34b.

A connection structure IP34 may be provided to electrically connect the upper and lower semiconductor packages PKG34b and PKG34a. A ball structure BS34 may be provided under the lower package substrate PB34a.

Hereinafter, electronic devices according to other exemplary embodiments of the present general inventive concept will be described.

An electronic device according to exemplary embodiments of the present general inventive concept will now be described with reference to FIG. 66.

Figure 66:
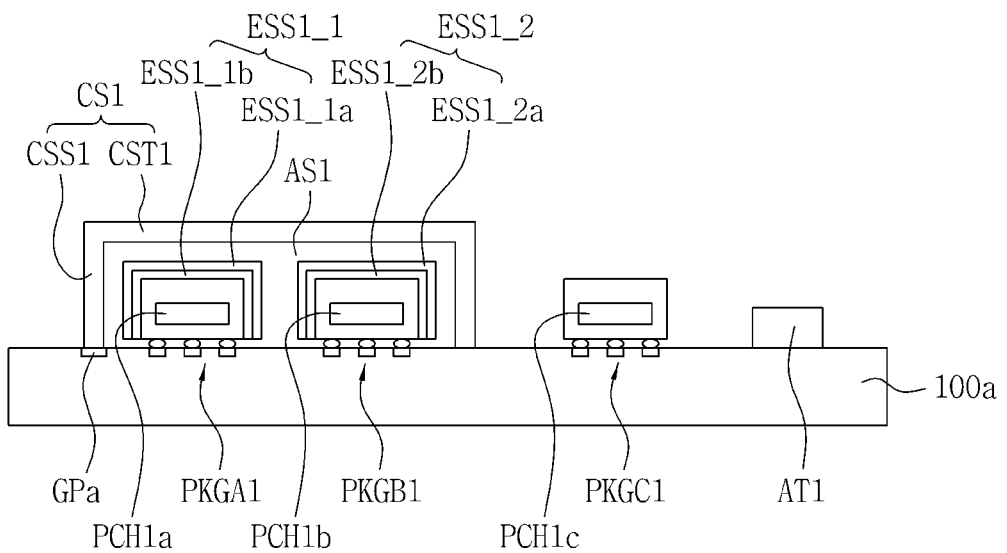
FIGS. 66 through 72 are cross-sectional views illustrating electronic devices according to exemplary embodiments of the present general inventive concept.

Referring to FIG. 66, a first semiconductor package PKGA1, a second semiconductor package PKGB1, a third semiconductor package PKGC1, and an antenna unit AT1 may be provided on a circuit substrate 100a and spaced apart from one another. The circuit substrate 100a may be disposed on a board and/or a printed circuit board (PCB). The first semiconductor package PKGA1 may include a first semiconductor chip PCH1a, the second semiconductor package PKGB1 may include a second semiconductor chip PCH1b, and the third semiconductor package PKGC1 may include a third semiconductor chip PCH1c.

In some exemplary embodiments, a first electromagnetic shielding structure ESS1_1 may cover top and lateral surfaces of the first semiconductor package PKGA1, while a second electromagnetic shielding structure ESS1_2 may cover top and lateral surfaces of the second semiconductor package PKGB1. The first electromagnetic shielding structure ESS1_1 may include first and second polarizers ESS1_1a and ESS1_1b, and the second electromagnetic shielding structure ESS1_2 may include first and second polarizers ESS1_2a and ESS1_2b. In at least one exemplary embodiment, the first and second electromagnetic shielding structures ESS1_1 and ESS1_2 may include an insulation characteristic. However, the present general inventive concept is not limited thereto, and the first and second electromagnetic shielding structures ESS1_1 and ESS1_2 may exhibit conductivity or include a conductive material.

A positional relationship between the first and second semiconductor packages PKGA1 and PKGB1 and the first and second electromagnetic shielding structures ESS1_1 and ESS1_2 is exemplary, and the present general inventive concept is not limited thereto. For example, any one of the first and second semiconductor packages PKGA1 and PKGB1 may be any one of the semiconductor devices or semiconductor packages protected by the electromagnetic shielding structures.

A conductive electromagnetic shielding structure CS1 may be provided to cover the first and second semiconductor packages PKGA1 and PKGB1 and the first and second electromagnetic shielding structures ESS1_1 and ESS1_2. The conductive electromagnetic shielding structure CS1 may include an upper plate CST1 and a sidewall structure CSS1 configured to extend from an edge of the upper plate CST1 to the circuit substrate 100a. The conductive electromagnetic shielding structure CS1 may be a shield-can. The conductive shielding structure CS1 may be formed of a metal material including stainless or titanium (Ti).

A vacant space AS1 may be formed between the conductive electromagnetic shielding structure CS1 and the first and second electromagnetic shielding structures ESS1_1 and ESS1_2.

The first and second electromagnetic shielding structures ESS1_1 and ESS1_2 may be provided between the first and second semiconductor packages PKGA1 and PKGB1 to cover sidewalls of the first and second semiconductor packages PKGA1 and PKGB1. Thus, electromagnetic waves generated by any one of the first and second semiconductor packages PKGA1 and PKGB1 may be cut off by the first and second electromagnetic shielding structures ESS1_1 and ESS1_2 and not affect other adjacent semiconductor packages.

In addition, due to the first and second electromagnetic shielding structures ESS1_1 and ESS1_2 and the conductive electromagnetic shielding structure CS1, the first and second semiconductor packages PKGA1 and PKGB1 may be protected from externally generated electromagnetic waves, and external electronic devices and the human body may be protected from electromagnetic waves generated by the first and second semiconductor packages PKGA1 and PKGB1. That is, the first and second electromagnetic shielding structures ESS1_1 and ESS1_2 may protect the first and second semiconductor chips PCH1a and PCH1b from external electromagnetic waves. Also, the first and second electromagnetic shielding structures ESS1_1 and ESS1_2 and the conductive electromagnetic shielding structure CS1 may prevent electromagnetic waves generated by the first and second semiconductor chips PCH1a and PCH from affecting external electronic devices and the human body.

Meanwhile, the conductive electromagnetic shielding structure CS1 may be grounded through a ground pad GPa of the circuit substrate 100a. However, the first and second electromagnetic shielding structures ESS1_1 and ESS1_2 may not be grounded. Thus, electromagnetic waves may be cut off using the first and second electromagnetic shielding structures ESS1_1 and ESS1_2 without additionally grounding the first and second electromagnetic shielding structures ESS1_1 and ESS1_2.

An electronic device according to other exemplary embodiments of the present general inventive concept will now be described with reference to FIG. 67.

Figure 67:
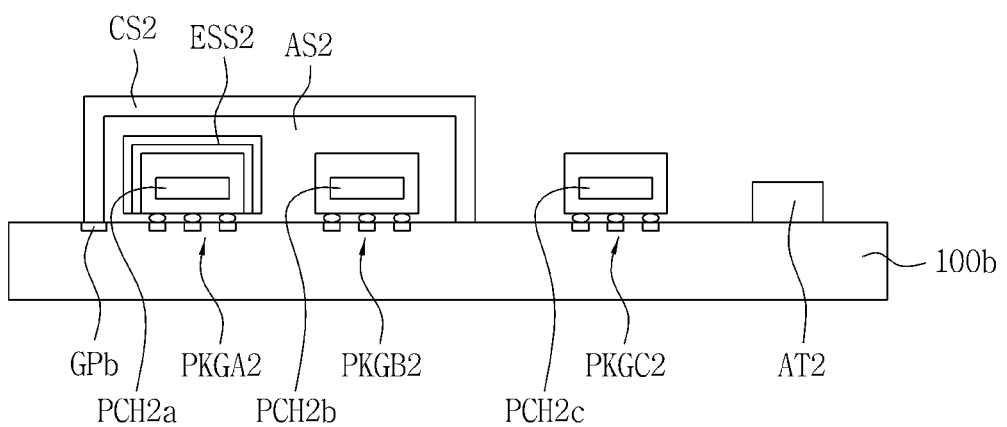

Referring to FIG. 67, as in FIG. 66, a first semiconductor package PKGA2, a second semiconductor package PKGB2, a third semiconductor package PKGC2, and an antenna unit AT2 may be provided on a circuit substrate 100b and spaced apart from one another. The first semiconductor package PKGA2 may include a first semiconductor chip PCH2a, the second semiconductor package PKGB2 may include a second semiconductor chip PCH2b, and the third semiconductor package PKGC2 may include a third semiconductor chip PCH2c.

A first electromagnetic shielding structure ESS2 may cover top and lateral surfaces of the first semiconductor package PKGA2. As in the previous exemplary embodiments, the first electromagnetic shielding structure ESS2 may include first and second polarizers. The first electromagnetic shielding structure ESS2 may have an insulation or conductive characteristic.

A conductive electromagnetic shielding structure CS2 may be provided on the circuit substrate 100b to cover the first and second semiconductor packages PKGA2 and PKGB2 and the first electromagnetic shielding structure ESS2. The conductive electromagnetic shielding structure CS2 may be grounded by the circuit board 100b through a ground pad GPb of the circuit substrate 100b.

Accordingly, the first electromagnetic shielding structure ESS2 may cover top and lateral surfaces of the first semiconductor chip PCH2a disposed within the first semiconductor package PKGA2. Also, a portion of the first electromagnetic shielding structure ESS2 may be interposed between the first and second semiconductor packages PKGA2 and PKGB2. Thus, the first electromagnetic shielding structure ESS2 may protect the second semiconductor package PKGB2 from electromagnetic waves generated by the first semiconductor package PKGA2, and protect the first semiconductor package PKGA2 from electromagnetic waves generated by the second semiconductor package PKGB2.

An electronic device according to other exemplary embodiments of the present general inventive concept will now be described with reference to FIG. 68.

Figure 68:
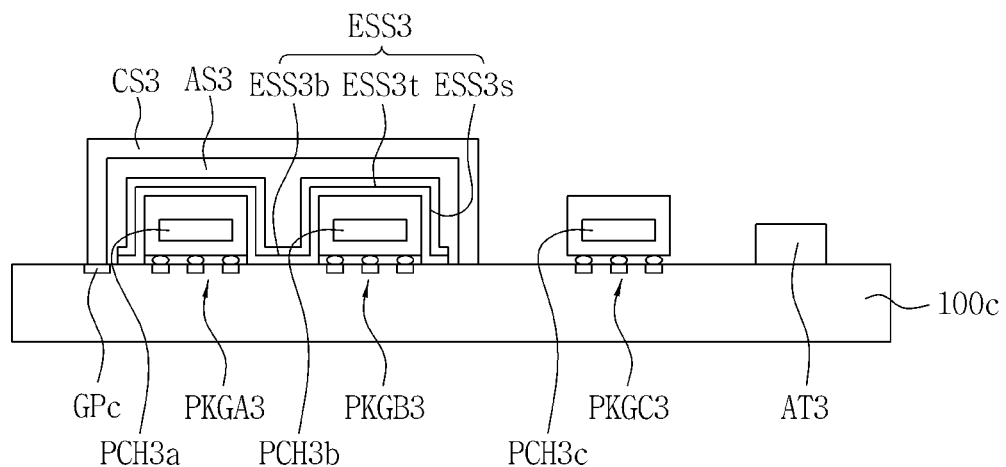

Referring to FIG. 68, a first semiconductor package PKGA3, a second semiconductor package PKGB3, a third semiconductor package PKGC3, and an antenna unit AT3 may be provided on a circuit substrate 100c and spaced apart from one another. The first semiconductor package PKGA3 may include a first semiconductor chip PCH3a, the second semiconductor package PKGB3 may include a second semiconductor chip PCH3b, and the third semiconductor package PKGC3 may include a third semiconductor chip PCH3c.

A first electromagnetic shielding structure ESS3 may cover top and lateral surfaces of the first semiconductor package PKGA3 and the second semiconductor package PKGB2. As in the previous exemplary embodiments, the first electromagnetic shielding structure ESS3 may include first and second polarizers. Also, the first electromagnetic shielding structure ESS3 may have an insulation or conductive characteristic. The first electromagnetic shielding structure ESS3 may include a portion ESS3t covering top surfaces of the first and second semiconductor packages PKGA3 and PKGB3, a portion ESS3s covering lateral surfaces of the first and second semiconductor packages PKGA3 and PKGB3, and a portion ESS3b covering the circuit substrate 100c.

A conductive electromagnetic shielding structure CS3 may be provided to cover the first and second semiconductor packages PKGA3 and PKGB3 and the first electromagnetic shielding structure ESS3. The conductive electromagnetic shielding structure CS3 may be grounded by the circuit substrate 100c through a ground pad GPc of the circuit substrate 100c.

An electronic device according to other exemplary embodiments of the present general inventive concept will now be described with reference to FIG. 69.

Figure 69:
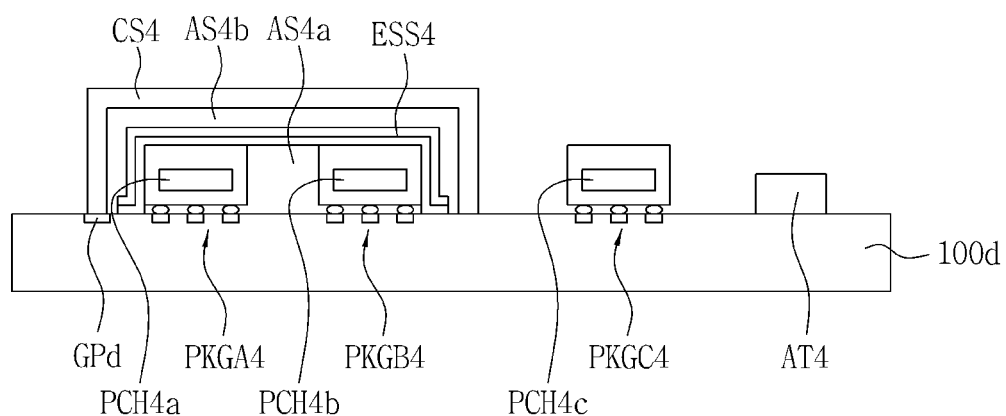

Referring to FIG. 69, a first semiconductor package PKGA4, a second semiconductor package PKGB4, a third semiconductor package PKGC4, and an antenna unit AT4 may be provided on a circuit substrate 100d and spaced apart from one another. The first semiconductor package PKGA4 may include a first semiconductor chip PCH4a, the second semiconductor package PKGB4 may include a second semiconductor chip PCH4b, and the third semiconductor package PKGC4 may include a third semiconductor chip PCH4c.

A first electromagnetic shielding structure ESS may be provided to simultaneously cover top surfaces of the first and second semiconductor packages PKGA4 and PKGB4 and lateral surfaces of the first and second semiconductor packages PKGA4 and PKGB4, which may not be opposite each other. That is, the first electromagnetic shielding structure ESS4 may leave a vacant space AS4a between the first and second semiconductor packages PKGA4 and PKGB4, and cover the first and second semiconductor packages PKGA4 and PKGB4. The first electromagnetic shielding structure ESS4 may include first and second polarizers. The first electromagnetic shielding structure ESS4 may have an insulation characteristic. In another case, the first electromagnetic shielding structure ESS4 may include a conductive material.

An electromagnetic shielding structure CS4 may be provided to cover the first and second semiconductor packages PKGA4 and PKGB4 and the first electromagnetic shielding structure ESS4. The conductive electromagnetic shielding structure CS4 may be grounded by the circuit substrate 100d through a ground pad GPd of the circuit substrate 100d.

An electronic device according to other exemplary embodiments of the present general inventive concept will now be described with reference to FIG. 70.

Figure 70:
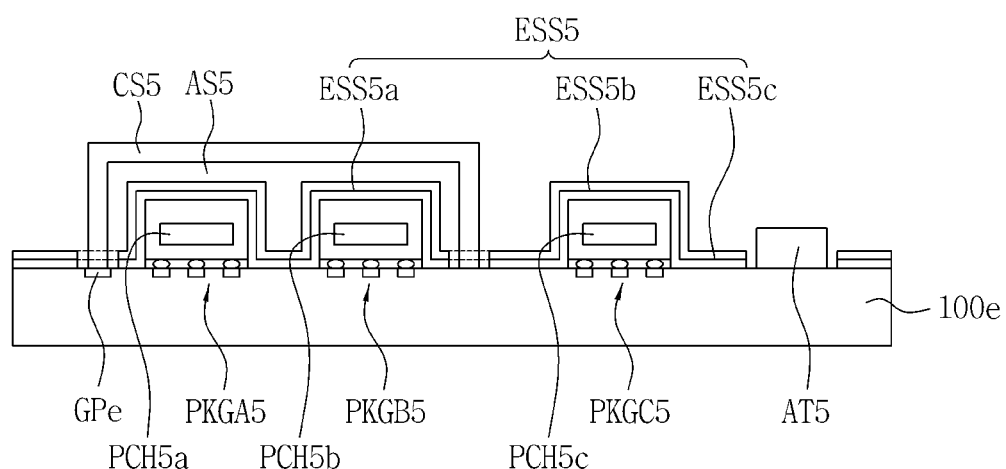

Referring to FIG. 70, a first semiconductor package PKGA5, a second semiconductor package PKGB5, a third semiconductor package PKGC5, and an antenna unit AT5 may be provided on a circuit substrate 100e and spaced apart from one another. The first semiconductor package PKGA5 may include a first semiconductor chip PCH5a, the second semiconductor package PKGB5 may include a second semiconductor chip PCH5b, and the third semiconductor package PKGC5 may include a third semiconductor chip PCH5c.

An insulating electromagnetic shielding structure ESS5 may be provided on a surface of the circuit substrate 100e having the first through third semiconductor packages PKGA5, PKGB5, and PKGC5 to cover the first through third semiconductor packages PKGA5, PKGB5, and PKGC5. In this case, the insulating electromagnetic shielding structure ESS5 may not cover the antenna unit AT5.

A conductive electromagnetic shielding structure CS5 may be provided to cover a portion of the insulating electromagnetic shielding structure ESS5, and cover the first and second semiconductor packages PKGA5 and PKGB5. In this case, the conductive electromagnetic shielding structure CS5 may penetrate the insulating electromagnetic shielding structure ESS5 and be grounded by the circuit substrate 100e through a ground pad GPe of the circuit substrate 100e.

The insulating electromagnetic shielding structure ESS5 may include a portion ESS5a covering the first and second semiconductor packages PKGA5 and PKGB5 disposed within the conductive electromagnetic shielding structure CS5, a portion ESS5b covering the third semiconductor package PKGC5 disposed outside the conductive electromagnetic shielding structure CS5, and a portion ESS5c covering the circuit substrate 100e.

Accordingly, the first and second semiconductor packages PKGA5 and PKGB5 may be shielded from electromagnetic waves by a double structure including the conductive electromagnetic shielding structure CS5 and the insulating electromagnetic shielding structure ESS5, while the third semiconductor package PKGC5 may be shielded from electromagnetic waves by the insulating electromagnetic shielding structure ESS5.

An electronic device according to other exemplary embodiments of the present general inventive concept will now be described with reference to FIG. 71.

Figure 71:
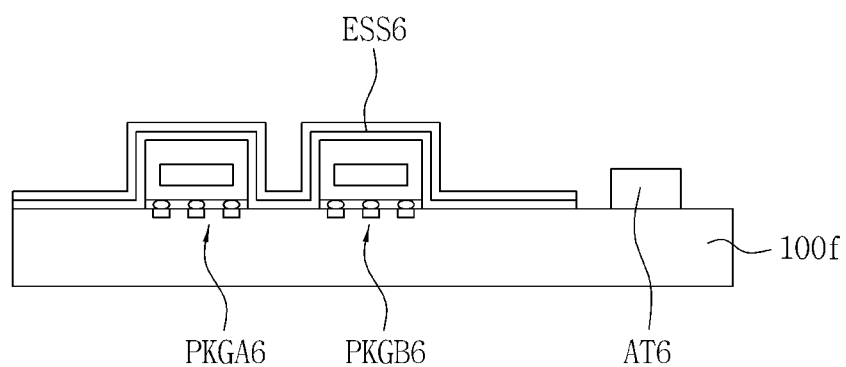

Referring to FIG. 71, a first semiconductor package PKGA6, a second semiconductor package PKGB6, and an antenna unit AT6 may be provided on a circuit substrate 100f and spaced apart from one another.

An insulating electromagnetic shielding structure ESS6 may be provided on the circuit substrate 100f to cover the first and second semiconductor packages PKGA6 and PKGB6, and expose the antenna unit AT6. The insulating electromagnetic shielding structure ESS6 may include a portion covering top surfaces of the first and second semiconductor packages PKGA6 and PKGB6, lateral surfaces of the first and second semiconductor packages PKGA6 and PKGB6, and a portion covering a top surface of the circuit substrate 100f. Accordingly, the top and lateral surfaces of the first and second semiconductor packages PKGA6 and PKGB6 may be shielded from electromagnetic waves by the insulating electromagnetic shielding structure ESS6. As described in the previous exemplary embodiments, the insulating electromagnetic shielding structure ESS6 may include first and second polarizers stacked sequentially.

An electronic device according to other exemplary embodiments of the present general inventive concept will now be described with reference to FIG. 72.

Figure 72:
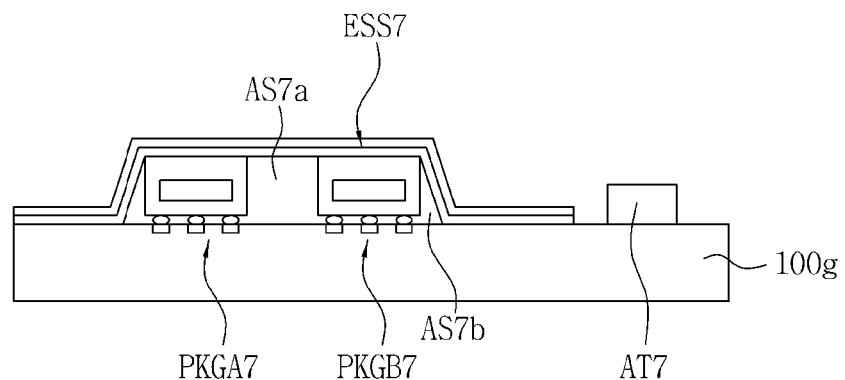

Referring to FIG. 72, a first semiconductor package PKGA7, a second semiconductor package PKGB7, and an antenna unit AT7 may be provided on a circuit substrate 100g and spaced apart from one another.

An insulating electromagnetic shielding structure ESS7, generally indicated, may be provided on the circuit substrate 100g to cover the first and second semiconductor packages PKGA7 and PKGB7, and expose the antenna unit AT7. The insulating electromagnetic shielding structure ESS7 may include first and second polarizers, as described in detail above.

The insulating electromagnetic shielding structure ESS7 may extend to cover a top surface of the first semiconductor package PKGA7 and a top surface of the second semiconductor package PKGB7. Thus, a first vacant space AS7a may be formed between the first and second semiconductor packages PKGA7 and PKGB7. Also, the insulating electromagnetic shielding structure ESS7 may extend from the top surfaces of the first and second semiconductor packages PKGA7 and PKGB7 to cover a top surface of the circuit substrate 100g. The insulating electromagnetic shielding structure ESS7 may surround lateral surfaces of the first and second semiconductor packages PKGA7 and PKGB7, and cover the top surfaces of the first and second semiconductor packages PKGA7 and PKGB7. A second vacant space AS7b may be formed between a portion of the insulating electromagnetic shielding structure ESS7, which may surround the lateral surfaces of the first and second semiconductor packages PKGA7 and PKGB7, and the lateral surfaces of the first and second semiconductor packages PKGA7 and PKGB7. That is, the insulating electromagnetic shielding structure ESS7 may not directly cover the lateral surfaces of the first and second semiconductor packages PKGA7 and PKGB7 but be spaced apart from the lateral surfaces of the first and second semiconductor packages PKGA7 and PKGB7. Meanwhile, positional relationships between the semiconductor package and the electromagnetic shielding structure described with reference to FIGS. 66 through 72 are only examples. That is, the present general inventive concept may include exemplary embodiments to which at least one of the exemplary embodiments of FIGS. 1 through 11 and FIGS. 20 through 66 is applied, and in which a semiconductor package protected or cut off from electromagnetic waves is disposed on the circuit substrates described with reference to FIGS. 66 through 72.

An electronic system according to exemplary embodiments of the present general inventive concept will now be described.

Figure 73:
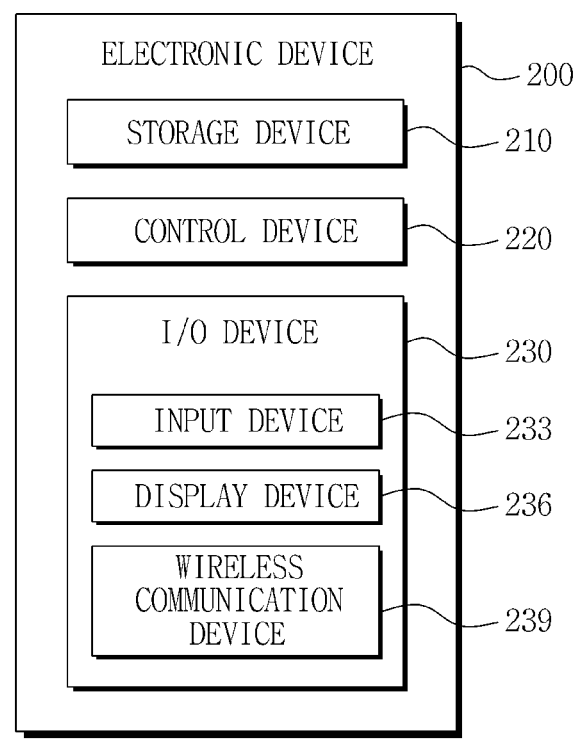
FIG. 73 is a diagram illustrating an electronic system according to exemplary embodiments of the present general inventive concept.

Referring to FIG. 73, an electronic device 200 may include a storage device 210, a control device 220, and an input/output (I/O) device 230. The I/O device 230 may include an input device 233, a display device 236, and a wireless communication device 239.

The electronic device 200 is not limited to a single storage device 210, and may include one or more storage devices. The one or more storage devices may be the same type of storage device, or may be different types of storage devices with respect to each other. The types of storage devices may include, but are not limited to, a hard disc drive (HDD) storage device, a nonvolatile memory, such as a flash memory or an electrically erasable and programmable read-only-memory (EEPROM), or a volatile memory, such as a battery-based dynamic random access memory (DRAM) or synchronous DRAM (SDRAM). The storage device 210 may include any one of devices according to the exemplary embodiments of the present general inventive concept. For example, the storage device 210 may include at least one of semiconductor packages according to the present general inventive concept.

The control device 220 may be used to control an operation of the electronic device 200. For example, the control device 220 may include a microprocessor (MP), a microcontroller, etc. The control device 220 may include any one of devices according to the exemplary embodiments of the present general inventive concept. For instance, the control device 220 may include at least one of semiconductor packages according to the present general present general inventive concept described above.

The I/O device 230 may be used to transmit data to/from the electronic device 200 to external devices. For example, the I/O device 230 may include, but is not limited to, a display screen, a button, a port, a touch screen, a joystick, a click wheel, a scrolling wheel, a touch pad, a keypad, a keyboard, a microphone, and a camera.

The wireless communication device 239 may include at least one IC, a power amplifier circuit, a passive radio-frequency (RF) component, at least one antenna, and a communication circuit, such as an RF transceiver circuit including another circuit configured to process an RF wireless signal. Wireless signals may be transmitted using light (e.g., infrared (IR) communication).

An electronic device according to exemplary embodiments of the present general inventive concept will now be described.

Figure 74:
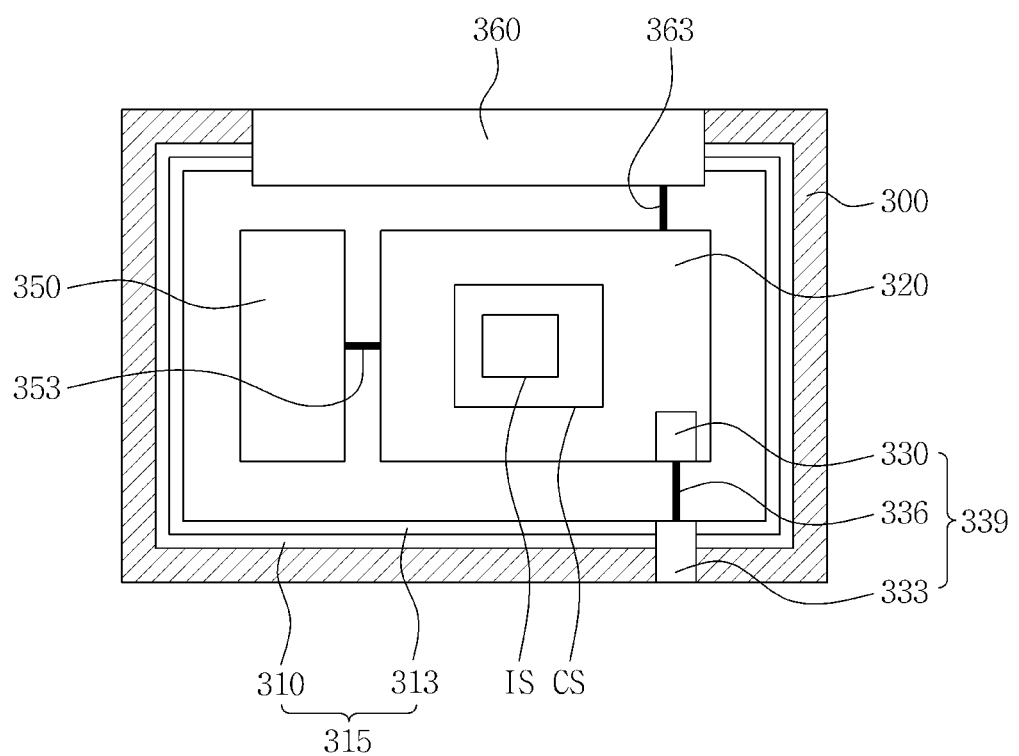
FIG. 74 is a diagram illustrating an electronic device according to exemplary embodiments of the present general inventive concept.

Referring to FIG. 74, a housing 300 having an inner space may be provided. The housing 300 may be formed of materials including, but not limited to, plastic, glass, ceramic, and metal, or a mixture thereof. A first insulating electromagnetic shielding structure 315 may be provided on an inner surface of the housing 300. The first insulating electromagnetic shielding structure 315 may include first and second polarizers 310 and 313 stacked sequentially.

In some exemplary embodiments, an electronic device may adopt the first insulating electromagnetic shielding structure 315. Thus, the specific gravity of plastic substantially incapable of cutting off electromagnetic waves, out of materials constituting the housing 300, may be increased. That is, since the electronic device may adopt the first insulating electromagnetic shielding structure 315, the specific gravity of a metal capable of cutting off electromagnetic waves and having a greater weight than plastic, may be reduced within the housing 300, thereby reducing the entire weight of the electronic device.

A processing device 320 may be provided in an inner space of the housing 300. The processing device 320 may include a control device and a storage device. Also, the processing device 320 may include a semiconductor device, a semiconductor package, or an electronic device according to the above-described exemplary embodiments of the present general inventive concept. For example, the processing device 320 may include a conductive electromagnetic shielding structure CS, which may be the same as the conductive shielding structure CS1 described with reference to FIG. 66, and an insulating electromagnetic shielding structure IS, which may be the same as the insulating electromagnetic shielding structure ESS_1 described with reference to FIG. 66. Also, the insulating electromagnetic shielding structure IS may be provided within the conductive electromagnetic shielding structure CS. Accordingly, an electronic component constituting the processing device 320 may be shielded from electromagnetic waves by a double structure including the insulating electromagnetic shielding structure IS and the conductive electromagnetic shielding structure CS.

A power source 350 connected to the processing device 320 by a power connector 353 may be provided in an inner space of the housing 300. For example, when the electronic device is a portable electronic device, the power source 350 may be a battery.

An I/O device 360 may be provided on or combined with one terminal of the housing 300, and electrically connected to the processing device 320 by a connector 363. The I/O device 360 may include a display unit and/or a touch screen. Here, a display surface of the display unit may be exposed outside the housing 300. A wireless communication unit 339 may be provided within the housing 300 or provided as a portion of the housing 300. The wireless communication unit 339 may include a transceiver circuit portion 330, an antenna 333, and a connector 336 configured to connect the antenna 333 and the transceiver circuit portion 330.

According to exemplary embodiments of the present general inventive concept, an electromagnetic shielding structure including first and second polarizers may be provided. The first and second polarizer may have different transmission axes, such as transmission axes that are orthogonal to each other. The electromagnetic shielding structure may inhibit the amount of external electromagnetic waves realized by a semiconductor device, a semiconductor package, an electronic device, and an electronic system. Also, the electromagnetic shielding structure may inhibit electromagnetic waves generated by the semiconductor device, the semiconductor package, the electronic device, and the electronic system from affecting external electronic devices and the human body. Furthermore, due to the electromagnetic shielding structure provided between first and second semiconductor chips disposed adjacent to each other, the second semiconductor chip may realize a lower amount of electromagnetic waves generated by the first semiconductor chip.

Although a few exemplary embodiments of the present general inventive concept have been illustrated and described, it will be appreciated by those skilled in the art that changes may be made in these exemplary embodiments without departing from the principles and spirit of the general inventive concept, the scope of which is defined in the appended claims and their equivalents.

What is claimed is:

1. A semiconductor package comprising:
a first package substrate having a top surface and a bottom surface opposite the top surface;
a first semiconductor chip disposed on the top surface of the first package substrate; and
a first electromagnetic shielding structure disposed on the first semiconductor chip,
wherein a first electromagnetic shielding structure includes a first polarizer having a first transmission axis, and a second polarizer having a second transmission axis different from the first transmission axis,
wherein a first electromagnetic shielding structure does not cover the bottom surface of the first package substrate.

2. The package of claim 1, wherein the first electromagnetic shielding structure is provided on a top surface of the first semiconductor chip.

3. The package of claim 1, wherein the first electromagnetic shielding structure is provided on top and lateral surfaces of the first semiconductor chip.

4. The package of claim 1, further comprising an under-fill member interposed between the first package substrate and the first semiconductor chip,
wherein the under-fill member covers sidewalls of the first semiconductor chip, and the first electromagnetic shielding structure includes a portion covering a top surface of the first semiconductor chip, and a portion covering lateral surfaces of the under-fill member.

5. The package of claim 4, wherein the first electromagnetic shielding structure further includes a portion covering a top surface of the first package substrate.

6. The package of claim 1, further comprising a molding layer disposed on the first electromagnetic shielding structure.

7. The package of claim 1, further comprising a molding layer disposed on the top surface of the first package substrate and the first semiconductor chip,
wherein the first electromagnetic shielding structure includes a portion covering a top surface of the molding, a portion covering lateral surfaces of the molding layer, and a portion covering lateral surfaces of the first package substrate.

8. The package of claim 1, wherein the first electromagnetic shielding structure includes a portion covering lateral surfaces of the first package substrate.

9. The package of claim 1, further comprising a second semiconductor chip disposed on the first package substrate.

10. The package of claim 9, wherein the second semiconductor chip is provided between the first package substrate and the first semiconductor chip.

11. The package of claim 9, wherein the second semiconductor chip is horizontally spaced apart from the first semiconductor chip.

12. The package of claim 11, wherein the first electromagnetic shielding structure extends to cover the first and second semiconductor chips.

13. The package of claim 1, further comprising a second electromagnetic shielding structure provided on any one surface of the first package substrate.

14. The package of claim 1, further comprising:
a second package substrate;
a lower semiconductor chip between the first package substrate and the second package substrate; and
a connection structure electrically connect the first package substrate and the second package substrate.

15. The package of claim 14, wherein a first electromagnetic shielding structure includes a portion covering lateral surfaces of the first package substrate and lateral surfaces of the second package substrate.

16. A semiconductor package comprising:
a package substrate;
a first semiconductor chip disposed on the package substrate;
a first electromagnetic shielding structure disposed on the first semiconductor chip; and
a vacant space interposed between lateral surfaces of the first semiconductor chip and the first electromagnetic shielding structure,
wherein the first electromagnetic shielding structure includes a first polarizer having a first transmission axis, and a second polarizer having a second transmission axis different from the first transmission axis.

17. The package of claim 16, wherein the first electromagnetic shielding structure extends from the portion covering the top surface of the first semiconductor chip to cover the package substrate disposed adjacent to the first semiconductor chip.

18. A semiconductor package of comprising:
a package substrate;
a first semiconductor chip disposed on the package substrate;
a second semiconductor chip disposed on the package substrate, wherein the second semiconductor chip is horizontally spaced apart from the first semiconductor chip;
a first electromagnetic shielding structure disposed on the first semiconductor chip,
a second electromagnetic shielding structure disposed on the second semiconductor chip,
wherein the first electromagnetic shielding structure includes a first polarizer having a first transmission axis, and a second polarizer having a second transmission axis different from the first transmission axis,
wherein the second electromagnetic shielding structure comprises:
a third polarizer having a third transmission axis; and
a fourth polarizer having a fourth transmission axis orthogonal to the third transmission axis of the third polarizer,
wherein the third and fourth transmission axes are orthogonal to each other on a plane surface.

19. A semiconductor package comprising:
at least one package substrate;
at least one semiconductor chip supported by the package substrate;
at least one connecting member to electrically connect the at least one semiconductor chip to the at least one package substrate; and
at least one electromagnetic shielding structure disposed on the at least one semiconductor chip, the at least one electromagnetic shielding structure including a first polarizer having a first transmission axis, and a second polarizer having a second transmission axis extending orthogonally with respect to the first transmission axis
wherein the at least one package substrate comprises a first package substrate including at least one first semiconductor chip, and a second package substrate including at least one second semiconductor chip, the first and second package substrates connected to one another by at least one substrate connection structure,
wherein the first package substrate has a top surface and a bottom surface opposite the top surface, and
wherein the at least one electromagnetic shielding structure includes a first electromagnetic shielding structure disposed on the top surface of the first package substrate.

20. The semiconductor package of claim 19, wherein the at least one connecting member includes at least one of a via, a solder ball, a bonding wire, and an interconnection structure having a plurality of interconnects.

21. The semiconductor package of claim 20, wherein the plurality of interconnects are coupled together in a stair-like manner, and include an upper interconnect connected to a first semiconductor chip and a lower interconnect connected to the package substrate.

22. The semiconductor package of claim 19,
wherein the at least one electromagnetic shielding structure further includes a second electromagnetic shielding structure disposed on the second package substrate.

23. The semiconductor package of claim 22, wherein the at least one first semiconductor chip includes a plurality of semiconductor chips.

24. The semiconductor package of claim 23, wherein the plurality of semiconductor chips are electrically connected to the first package substrate using at least one first connecting member, and the second semiconductor chip is electrically connected to the second package substrate using a second connecting member that is different from the first connecting member.

25. The package of claim 19, wherein the first electromagnetic shielding structure does not cover the bottom surface of the first package substrate.

26. The package of claim 19, wherein the first electromagnetic shielding structure includes a portion covering lateral surfaces of the first package substrate.

27. The package of claim 26, wherein the first electromagnetic shielding structure extends from the portion covering the lateral surfaces of the first package substrate to cover lateral surfaces of the second package substrate.

28. An electronic device including a dual electromagnetic shielding unit, comprising;
a housing including a base, wherein the base has a top surface and a bottom surface opposite the top surface;
a power source supported by the base;
a processing device supported by the base and coupled to the power source, the processing device including at least one semiconductor device;
a first insulative electromagnetic shielding device disposed on the processing device and surrounding the at least one semiconductor device, wherein the first insulative electromagnetic shielding device is disposed on the top surface of the base and does not cover the bottom surface of the base;
a conductive electromagnetic shielding device disposed on the processing device and surrounding the first insulative electromagnetic shielding device;
a second insulative electromagnetic shielding unit disposed on the housing to surround the conductive electromagnetic shielding unit, the second electromagnetic shielding unit including first and second polarizers stacked sequentially.

29. The electronic device of claim 28, wherein the first polarizer has a first transmission axis, and the second polarizer has a second transmission axis different from the first transmission axis.

30. The electronic device of claim 29, wherein the second transmission axis is orthogonal to the first transmission axis.

* * * * *